United States Patent [19]

Mitsunori et al.

[11] Patent Number: 5,487,794
[45] Date of Patent: Jan. 30, 1996

[54] METHOD OF PRODUCING CRYSTAL BODIES HAVING CONTROLLED CRYSTALLINE ORIENTATION

[75] Inventors: Hiromi Mitsunori; Toshio Sadayori, both of Chiba, Japan

[73] Assignee: Kawasaki Steel Corporation, Japan

[21] Appl. No.: 245,231

[22] Filed: May 17, 1994

Related U.S. Application Data

[60] Continuation of Ser. No. 904,520, Jun. 25, 1992, abandoned, which is a division of Ser. No. 499,442, Jun. 21, 1990, Pat. No. 5,205,872.

[30] Foreign Application Priority Data

Dec. 10, 1988 [JP] Japan .................. 63-311024
Dec. 10, 1988 [JP] Japan .................. 63-311025

[51] Int. Cl.⁶ .................. C21D 8/12; C30B 28/02
[52] U.S. Cl. .................. 148/111; 148/112; 117/3
[58] Field of Search .................. 148/111, 112; 117/3, 10

[56] References Cited

U.S. PATENT DOCUMENTS

| | | | |
|---|---|---|---|
| 2,700,006 | 1/1955 | Dunn | 148/111 |
| 4,475,980 | 10/1984 | Rhemer et al. | 156/603 |
| 4,519,870 | 5/1985 | Matsuzawa et al. | 156/603 |
| 4,900,818 | 2/1990 | Mankins | 156/603 |
| 4,961,818 | 10/1990 | Benn | 156/603 |
| 5,205,872 | 4/1993 | Mitsunori et al. | 156/603 |

FOREIGN PATENT DOCUMENTS

| | | | |
|---|---|---|---|
| 58-2289 | 1/1983 | Japan . | |
| 63-35490 | 2/1988 | Japan . | |
| 63-65024 | 3/1988 | Japan . | |
| 63-149318 | 6/1988 | Japan . | |
| 2079175 | 1/1982 | United Kingdom | 156/603 |

*Primary Examiner*—George Wyszomierski
*Attorney, Agent, or Firm*—Austin R. Miller

[57] ABSTRACT

This invention lies in that a seed material controlled into a predetermined orientation is joined to a treating material under an activated state of joint face or through an interposition of an insert member and heated to a temperature causing grain boundary movement to render a whole of a joined body into a crystal body having a predetermined crystalline orientation. Furthermore, not only plate material and bar material but also coil can be used as the treating material, so that crystal bodies having excellent desired properties can be mass-produced with a good yield and in industrial scale.

4 Claims, 4 Drawing Sheets

METHOD OF PRODUCING CRYSTAL BODIES HAVING CONTROLLED CRYSTALLINE ORIENTATION

This application is a continuation of application Ser. No. 07/904,520, filed on Jun. 25, 1992, abandoned, which is a divisional of application Ser. No. 07/499,442, filed Jun. 21, 1990, now U.S. Pat. No. 5,205,872.

TECHNICAL FIELD

This invention relates to a method of producing a crystal body having a controlled crystalline orientation, and more particularly to a method of producing crystal bodies having a predetermined orientation such as single metal crystal, grain oriented silicon steel sheet, bidirectional oriented silicon steel sheet and the like wherein the crystal body having the predetermined orientation is rapidly and simply produced by artificially planting a seed crystal of an adequate orientation irrespective of the size of the crystal body and hence the mass production can be made in industrial scale.

BACKGROUND ART

There are basically four known methods for obtaining crystal bodies having a desirable orientation.

(1) First, the simplest method is a method wherein a block-like single crystal is prepared and then a crystal body is cut out therefrom in a desired orientation in accordance with the measured result of single crystalline orientation.

In this method, however, the cutting takes a long time, the cost is high, and also the size of the single crystal to be prepared is critical. .Therefore, the mass production can not be expected.

(2) Second, there is a so-called strain-slant annealing method.

This method is a method of growing a single crystal of desirable orientation from an end of a sample, wherein a seed crystal is first prepared on the end of the sample and rotated in a desired direction to grow the whole of the seed crystal into a single crystal having the desirable orientation, and has been proposed by Fujiwara et al [T. Fujiwara and T. Hudita; J. Sci. Hiroshima Univ. A8 (1938), P293~296].

They have succeeded in the preparation of single crystals by the above method from aluminum and further from pure iron.

Thereafter, Dunn et al have applied the above method to silicon steel sheets having a large size [C. G. Dunn and G. C. Nonken: Metal Progress, 64 (1953) 6, P71~75].

According to their method for growing a plate crystal having a specified crystalline orientation, an end of a sample previously subjected to a strain is placed in a high temperature region of a temperature tilting furnace to prepare some seed crystals as shown in FIG. 1a, among which a crystal grain having an adequate orientation is selected and cut out as shown in FIG. 1b. Then, a necked portion of the cut out crystal grain is bent as shown in FIGS. 1c and 1d to align the seed crystal into a predetermined orientation with respect to the sample plate. Next, the seed crystal is annealed through heating in the temperature tilting furnace so as to grow over the whole of the plate, whereby the object is achieved.

In this method, however, it is necessary to strictly control the operation for selecting and cutting out a seed crystal having an adequate orientation from many crystal groups and the operation for bending the seed crystal into a predetermined orientation, which takes much labor and long time, so that the mass production can not be expected.

(3) Third, there is a method utilizing secondary recrystallization phenomenon.

The secondary recrystallization is a phenomenon that a seed of nucleating secondary grains largely grows through grain boundary energy of primary recrystallized grains as a driving force, which is widely utilized as a method of producing grain oriented silicon steel sheets as is well-known.

The grain oriented silicon steel sheet is required to have excellent magnetic properties in the rolling direction. That is, it is required that as the magnetizing force (magnetized properties), the magnetic flux density represented by $B_{10}$ value (magnetic flux density in the rolling direction produced when the magnetizing force is 1000 A/m) is high and the iron loss represented by $W_{17/50}$, value (iron loss when being magnetized at a magnetic flux density of 1.7 T and a frequency of 50 Hz) is low so that it is fundamentally necessary to highly align <001> axis of secondary recrystallized grains in steel into the rolling direction. For this end, fine precipitates such as MnS, MnSe and the like are generally added as an inhibitor, and further, if necessary, a small amount of Sb as disclosed in Japanese Patent Application Publication No. 51-13469, a small amount of Mo as disclosed in Japanese Patent Application Publication No. 57-14737 or a combination of Al, N, Sn, Cu and the like as disclosed in Japanese Patent Application Publication No. 60-48886 is added, which are properly combined with treating conditions in each of hot rolling and cold rolling, whereby high magnetic flux density and low iron loss grain oriented silicon steel sheets having a $B_{10}$ value of magnetic flux density of more than 1.90 T and a $W_{17/50}$ value of iron loss of not more than 1.05 W/kg (thickness 0.30 mm) have been produced recently.

Furthermore, a technique of producing bidirectional oriented silicon steel sheets by crossly conducting the cold rolling is proposed in Japanese Patent Application Publication No. 35-2657 and the like.

However, in order to highly align <001> axis of secondary recrystallized grains in the product into the rolling direction or a direction perpendicular to the rolling direction, it is necessary to adjust the components and strictly control complicated and many steps of steel-making, hot rolling, cold rolling and heat treatment. In the actually industrial production, however, the treating conditions are apt to be shifted from the totally proper conditions as mentioned above. If the treating conditions are slightly shifted, there is caused a problem that the orientation of <001> axis into the rolling direction or the direction perpendicular to the rolling direction becomes poor.

Lately, it has been attempted to thin the thickness of product plate to reduce the iron loss. However, as the final thickness becomes thin, the alignment of <001> axis of secondary recrystallized grains into the rolling direction or the direction perpendicular to the rolling direction becomes unstable, so that the improvement thereof is strongly demanded.

In Japanese Patent Application Publication No. 58-50295 is disclosed a method utilizing the same method as described in the item (2), wherein secondary grains locally subjected to secondary recrystallization are used as a seed and a temperature gradient is applied to a steel sheet at a boundary between primary and secondary recrystallization regions to grow the seed. However, the production as a commercial material is not yet attained at the present.

As a basic problem, the resulting crystalline orientation range is restricted in the aforementioned secondary recrystallization method, and consequently there is a problem that the orientation largely shifted from (110)[001] orientation or (100)[001] orientation is not obtained.

(4) Fourth, there is a method utilizing third order recrystallization.

The third order recrystallization proceeds through surface energy as a driving force, which is utilized for mainly growing (100)[hkl] grains in bidirectional oriented silicon steel sheet or the like, but there are problems on atmosphere control at high temperature, accuracy of orientation control and the like.

As mentioned above, the mass production can not be achieved in the method capable of strictly controlling to a specified orientation, while the orientation selectivity and control accuracy come into problem in the method capable of industrially conducting the mass production, so that methods capable of conducting the mass production and strictly controlling to the specified orientation are not yet known up to the present.

Moreover, the production of single crystals through solidification method wherein a seed crystal is planted on an end of molten liquid metal and gradually cooled below the melting point to grow the seed crystal into a large crystal is known as a Bridgeman method or a Tanmann-Bridgeman method from the old time. However, the invention is a technique that a treating material growing the seed material is not liquid but is a solid having a crystal structure, and is entirely different from the aforementioned solidification method.

As mentioned above, if it is intended to strictly control the crystal into the specified orientation, much labor and long time are taken for obtaining a proper seed, so that the mass production can not be conducted industrially. On the other hand, if it is intended to conduct the mass production, the seed is necessary to be prepared by rolling and recrystallization, so that there is caused a problem on the accuracy of controlling to the specified orientation due to the scattering of production conditions. Furthermore, the growing orientation is restricted from a viewpoint of the essential crystal structure of the starting material, so that there is remaining a problem that the orientation can not be selected.

In this connection, the inventors have already found a method of directly planting a previously and strictly controlled seed crystal on a steel sheet through welding as a method of preparing nucleus of secondary recrystallized grains without rolling and recrystallization in the production of grain oriented silicon steel sheets and disclosed in Japanese Patent laid open No. 63-149318.

In this method, however, the quality of joint portion is changed by the heat affection in the welding, so that there is remaining a problem that it is very difficult to preferentially grow the planted secondary grain nucleus stably over the weld portion.

DISCLOSURE OF INVENTION

The invention is to advantageously solve the aforementioned problems and to provide a method of producing crystal bodies having a strictly controlled crystalline orientation which can realize both the industrially mass production and the strict orientation control to a specified crystalline orientation.

Further, the invention is to more improve the iron loss properties by positively shifting <001> axis of Goss grains from the rolling face in case of producing the grain oriented silicon steel sheet.

That is, in order to improve the iron loss properties, it is favorable that <001> axis of the Goss grain is not completely coincident with the rolling face and is somewhat shifted therefrom, which is described, for example, in Japanese Patent Application Publication No. 57-61102 and [IEEE. Transactions on Magnetics Vol. Mag 21. No. 1 (1985)]. Particularly, as to $|\beta|$, about 2.5° is optimum for the reduction of iron loss, so that the orientation alignment near to $\beta=2.5°$ is strongly demanded. In the conventional method through rolling and recrystallization, if it is intended to raise the degree of aligning into {110}<001> orientation, $|\beta|$ among $|\alpha|$, $|\beta|$ and $|\gamma|$ is particularly easy to be aligned near to 0. Therefore, in order to control the orientation near to $\beta=2.5°$, as disclosed in Japanese Patent Application Publication No. 58-5969, there is adopted a nonproductive method wherein waves are formed on a cold rolled steel sheet in a direction crossing with the cold rolling direction, and the waved steel sheet is subjected to a decarburization annealing and further to a secondary recrystallization annealing in a continuous strip system, and then the sheet after the coating with a slurry of an annealing separator is subjected to a purification annealing in a box and further to a correcting treatment for flattening the waves on the waved sheet.

Now, the inventors have previously noticed the method of planting a seed and made various proposals on the method of planting seed crystal through welding. In these proposals, however, there is a problem that the seed can not stably ride over the weld portion due to the heat affection in the welding as previously mentioned.

Therefore, the inventors have made further studies on the joining method lessening the heat affection as far as possible and found out an effective means for achieving essential matters required in low temperature joining, that is:

1) impurities are small in the joint face;
2) the joint face is approached as far as possible.

Furthermore, it has been found that when utilizing such a low temperature joining method, the steel sheet itself as a treating material is not necessary to be subjected to the strict orientation control as in the conventional method and hence the orientation of the seed material is strictly controlled to grow the orientation of the seed material over the whole region of the steel sheet, whereby the properties equal to or more than those of the conventional case through the complicated steps are obtained.

The invention is based on the above knowledge.

That is, the invention is as follows:

1. A method of producing crystal bodies, characterized in that a seed material having a crystal structure same as or similar to that of a treating material and a predetermined crystalline orientation at a state of energy lower than that of the treating material is joined to the treating material under such a contact state that a joint face is activated, and then heated to a temperature causing grain boundary movement to render a whole of a joined body into a crystal body having the predetermined crystalline orientation (first embodiment of the invention).

2. A method of producing grain oriented electromagnetic steel sheets having improved magnetic properties by hot rolling a slab of silicon-containing steel, rendering the hot rolled sheet into a final thickness without annealing and cold rolling or through annealing and/or cold rolling at least one time, and then subjecting it to a finish annealing, characterized in that a recrystallization seed material is joined on an edge portion of the steel sheet as a treating material at a step after the hot rolling and before the finish annealing under a condition satisfying the following orientation relationships, in which a joint face is activated at a contact state, and then heated to a temperature causing grain boundary movement to grow the orientation of said seed material over a whole of said steel sheet (second embodiment of the invention).

Account $|\alpha| \leq 5°$ $1 \leq |\beta| \leq 5°$ where

α: angle defined by a projection line of <001> axis of seed material with respect to rolling face of steel sheet and the rolling direction of steel sheet;

β: inclination angle of <001> axis of seed material with respect to rolling face of steel sheet.

3. A method of producing grain oriented electromagnetic steel sheets having improved magnetic properties by hot rolling a slab of silicon-containing steel, rendering the hot rolled sheet into a final thickness without annealing and cold rolling or through annealing and/or cold rolling at least one time, and then subjecting it to a primary recrystallization annealing and further to a finish annealing, characterized in that a recrystallization seed material is joined on an edge portion of the steel sheet as a treating material at a step after the hot rolling and before the finish annealing under a condition satisfying the following orientation relationships, in which a joint face is activated at a contact state, and then heated to a temperature causing grain boundary movement to grow the orientation of said seed material over a whole of said steel sheet (third embodiment of the invention).

Account $|\alpha| \leq 5°$ $1 \leq |\beta| \leq 5°$ where

α: angle defined by a projection line of <001> axis of seed material with respect to rolling face of steel sheet and the rolling direction of steel sheet;

β: inclination angle of <001> axis of seed material with respect to rolling face of steel sheet.

4. A method of producing bidirectional oriented electromagnetic steel sheets having improved magnetic properties by hot rolling a slab of silicon-containing steel, rendering the hot rolled sheet into a final thickness without annealing and cold rolling or through annealing and/or cold rolling at least one time, and then subjecting it to a finish annealing, characterized in that a recrystallization seed material is joined on an edge portion of the steel sheet as a treating material at a step after the hot rolling and before the finish annealing under a condition satisfying the following orientation relationships, in which a joint face is activated at a contact state, and then heated to a temperature causing grain boundary movement to grow the orientation of said seed material over a whole of said steel sheet (fourth embodiment of the invention).

Account $|\alpha| \leq 10°$ $|\beta| \leq 10°$ where

α: angle defined by a projection line of <001> axis of seed material with respect to rolling face of steel sheet and the rolling direction of steel sheet;

β: inclination angle of {100} face of seed material with respect to rolling face of steel sheet.

5. A method of producing bidirectional oriented electromagnetic steel sheets having improved magnetic properties by hot rolling a slab of silicon-containing steel, rendering the hot rolled sheet into a final thickness without annealing and cold rolling or through annealing and/or cold rolling at least one time, and then subjecting it to a primary recrystallization annealing and further to a finish annealing, characterized in that a recrystallization seed material is joined on an edge portion of the steel sheet as a treating material at a step after the hot rolling and before the finish annealing under a condition satisfying the following orientation relationships, in which a joint face is activated at a contact state, and then heated to a temperature causing grain boundary movement to grow the orientation of said seed material over a whole of said steel sheet (fifth embodiment of the invention).

Account $|\alpha| \leq 10°$ $|\beta| \leq 10°$ where

α: angle defined by a projection line of <001> axis of seed material with respect to rolling face of steel sheet and the rolling direction of steel sheet;

β: inclination angle of {100} face of seed material with respect to rolling face of steel sheet.

6. A method of producing orientation controlled steel sheets in the first, second, third, fourth or fifth invention, characterized in that a coil-like steel sheet is used as a treating material, and a seed material having a crystal structure same as or similar to that of said treating material and a predetermined crystalline orientation at a state of energy lower than that of said treating material is contacted and joined with a coiled end face of said coil-like steel sheet, and then heated to a temperature causing grain boundary movement to render said coil-like steel sheet into a crystal body having the predetermined crystalline orientation (sixth embodiment of the invention).

7. A method of producing crystal bodies, characterized in that a seed material having a crystal structure same as or similar to that of a treating material and a predetermined crystalline orientation at a state of energy lower than that of the treating material is joined to the treating material through an insert member having a melting point lower than those of the seed material and the treating material, and then heated to a temperature causing grain boundary movement to render a whole of a joined body into a crystal body having the predetermined crystalline orientation (seventh embodiment of the invention).

8. A method of producing grain oriented electromagnetic steel sheets having improved magnetic properties by hot rolling a slab of silicon-containing steel, rendering the hot rolled sheet into a final thickness without annealing and cold rolling or through annealing and/or cold rolling at least one time, and then subjecting it to a finish annealing, characterized in that a recrystallization seed material is joined on an edge portion of the steel sheet as a treating material at a step after the hot rolling and before the finish annealing under a condition satisfying the following orientation relationships, in which said seed material is contacted with said steel sheet through an insert member having a melting point lower than those of said seed material and steel sheet, and then heated to a temperature causing grain boundary movement to grow the orientation of said seed material over a whole of said steel sheet (eighth embodiment of the invention).

Account $|\alpha| \leq 5°$ $1 \leq |\beta| \leq 5°$ where

α: angle defined by a projection line of <001> axis of seed material with respect to rolling face of steel sheet and the rolling direction of steel sheet;

β: inclination angle of <001> axis of seed material with respect to rolling face of steel sheet.

9. A method of producing grain oriented electromagnetic steel sheets having improved magnetic properties by hot rolling a slab of silicon-containing steel, rendering the hot rolled sheet into a final thickness without annealing and cold rolling or through annealing and/or cold rolling at least one time, and then subjecting it to a primary recrystallization annealing and further to a finish annealing, characterized in that a recrystallization seed material is joined on an edge portion of the steel sheet as a treating material at a step after the hot rolling and before the finish annealing under a condition satisfying the following orientation relationships, in which said seed material is contacted with said steel sheet through an insert member having a melting point lower than those of said seed material and steel sheet, and then heated to a temperature causing grain boundary movement to grow the orientation of said seed material over a whole of said steel sheet (ninth embodiment of the invention).

Account $|\alpha| \leq 5°$ $1 \leq |\beta| \leq 5°$ where

α: angle defined by a projection line of <001> axis of seed material with respect to rolling face of steel sheet and the rolling direction of steel sheet;

β: inclination angle of <001> axis of seed material with respect to rolling face of steel sheet.

10. A method of producing bidirectional oriented electromagnetic steel sheets having improved magnetic properties by hot rolling a slab of silicon-containing steel, rendering the hot rolled sheet into a final thickness without annealing and cold rolling or through annealing and/or cold rolling at least one time, and then subjecting it to a finish annealing, characterized in that a recrystallization seed material is joined on an edge portion of the steel sheet as a treating material at a step after the hot rolling and before the finish annealing under a condition satisfying the following orientation relationships, in which said seed material is contacted with said steel sheet through an insert member having a melting point lower than those of said seed material and steel sheet, and then heated to a temperature causing grain boundary movement to grow the orientation of said seed material over a whole of said steel sheet (tenth embodiment of the invention).

Account $|\alpha| \leq 10°$ $|\beta| \leq 10°$ where

α: angle defined by a projection line of <001> axis of seed material with respect to rolling face of steel sheet and the rolling direction of steel sheet;

β: inclination angle of {100} face of seed material with respect to rolling face of steel sheet.

11. A method of producing bidirectional oriented electromagnetic steel sheets having improved magnetic properties by hot rolling a slab of silicon-containing steel, rendering the hot rolled sheet into a final thickness without annealing and cold rolling or through annealing and/or cold rolling at least one time, and then subjecting it to a primary recrystallization annealing and further to a finish annealing, characterized in that a recrystallization seed material is joined on an edge portion of the steel sheet as a treating material at a step after the hot rolling and before the finish annealing under a condition satisfying the following orientation relationships, in which said seed material is contacted with said steel sheet through an insert member having a melting point lower than those of said seed material and steel sheet, and then heated to a temperature causing grain boundary movement to grow the orientation of said seed material over a whole of said steel sheet (eleventh embodiment of the invention).

Account $|\alpha| \leq 10°$ $|\beta| \leq 10°$ where

α: angle defined by a projection line of <001> axis of seed material with respect to rolling face of steel sheet and the rolling direction of steel sheet;

β: inclination angle of {100} face of seed material with respect to rolling face of steel sheet.

12. A method of producing orientation controlled steel sheets in the seventh, eighth, ninth, tenth or eleventh invention, characterized in that a coil-like steel sheet is used as a treating material, and a seed material having a crystal structure same as or similar to that of said treating material and a predetermined crystalline orientation at a state of energy lower than that of said treating material is contacted and joined with a coiled end face of said coil-like steel sheet through an insert member having a melting point lower than those of said seed material and said treating material, and then heated to a temperature causing grain boundary movement to render said coil-like steel sheet into a crystal body having the predetermined crystalline orientation (twelfth embodiment of the invention).

In each of the above embodiments of the invention, the joining between the treating material and the seed material is preferable to be carried out under an application of stress.

Furthermore, in each of the above embodiments of the invention the heating atmosphere is favorable to be a non-oxidizing atmosphere.

In the production methods of grain oriented electromagnetic steel sheets in the second, third, eighth and ninth embodiments of the invention and bidirectional oriented electromagnetic steel sheets in the fourth, fifth, tenth and eleventh embodiments of the invention, it is desirable to reduce C amount in steel before cold rolling to not more than 0.010 wt % (hereinafter shown simply by %).

The term "same crystal structure" used herein means a structure that crystal system and lattice constant are same, and the term "similar crystal structure" means a structure in which an interstitial or a substitution type element is included as an alloying element and the crystal lattice is disordered due to solid solution, regular lattice formation, precipitation and the like. In this case, it is preferable that the difference of crystal lattices is within 30%.

Moreover, the term "energy state" used in the invention is concerned with inner strain and surface conditions and is mainly dependent upon the quantity and mass of crystal grain boundaries, dislocations, point defects and the surface energy of the crystal. As these quantities increase, the energy state becomes higher.

Then, each of the inventions will be described concretely based on basic experiments leading in the success of each invention.

As to the first and seventh embodiments of the invention

Experiment 1

As a seed material A at a low energy state, there was provided a single crystal plate comprising Si: 3% and the balance being substantially Fe and having (110) face in its plate surface and a thickness of 0.3 mm and a square of 10 mm, while as a treating material B at high energy state, there was provided a steel sheet of 10 mm square obtained by hot rolling an ingot of silicon steel comprising Si: 3%, S: 0.020%, Al: 0.025% and N: 0.0080% and the balance being substantially Fe and cold rolling it to a thickness of 0.3 mm and cutting out therefrom.

Two plate surfaces of each of A and B were finished into a mirror state having a center-line average roughness Ra of not more than 0.01 μm through Emery polishing, buff polishing or float polishing.

These polished surfaces of A, B were subjected to an ion sputtering of Ar under a high vacuum of $10^{-6}$ Torr, and thereafter mirror surfaces of A, B were contacted with each other to form two joined bodies C and D.

The annealing at 1000° C. for 5 hours was applied to the body C under a superhigh vacuum of $10^{-10}$ Torr and to the body D in $N_2$, respectively.

As a result, the grain boundary locally remained in the joint face of the body D. Further, when the crystalline orientation of A, B including the joint face was measured, portions restraining the grain boundary in the joint face had different orientations, and the portions having no grain boundary had the same orientation.

On the other hand, no grain boundary was recognized in the joint face of the body C, so that when the crystalline orientation of A, B including the joint face, the same orientation was observed, and consequently B was a single crystal body having the same orientation as in A.

That is, the material A having a crystal structure at low energy state was joined with the material B having a crystal structure at high energy state through the heating by controlling the atmosphere in the heating so as not to form an impurity film at the joint face between both the materials A and B, whereby the amount of the material A having the crystal structure at low energy state could be increased to two times.

In order to advantageously proceed the industrial production with the decrease of the cost, the atmosphere in the above heating is convenient to be non-oxidizing gas ($N_2$ or Ar) atmosphere rather than vacuum. This point was solved by joining the joint surface through a low melting point metal as mentioned below.

That is, each of the above seed material A and the treating material B was subjected to a plate surface treatment of each of i) pickling with hydrochloric acid;
ii) grinding;
iii) Emery polishing;
iv) chemical polishing;
v) chemical polishing+ion etching and then the treated surface was subjected to Sn plating at a thickness of 0.5 μm. Then, Sn plated surfaces were contacted with each other as a set of A and B and annealed in $N_2$ atmosphere at 1000° C. for 10 hours by varying stress vertically applied to the contacted surface every the plate surface treating condition, and thereafter the presence (x) and absence (O) of crystal grain boundary at the joint interface was observed.

The results are shown in FIG. 2.

As seen from the results of this figure, in the pickling treatment with hydrochloric acid making the roughness large and retaining many impurities on the surface, the strong applied load was required for disappearing the crystal grain boundary, while in case of chemical polishing+ion etching making the surface smooth and reducing impurities, the crystal grain boundary could be disappeared without the application of load.

Thus, the feature that Sn film having a melting point as low as 232° C. is interposed to disappear the crystal grain boundary is considered to be due to the fact that the liquid Sn is closely filled in the joint interface in the heating to shut off from air at a relatively low temperature, whereby the influence of the atmosphere is removed to prevent the formation of impurity film. Such an effect of disappearing the crystal grain boundary becomes large as the surface roughness of the joint face is small or the applied load is large. This is considered to be due to the fact that as the surface roughness becomes small or the applied load becomes large, the contact area increases and also extra Sn amount remaining in gaps at the interface becomes small to make easy the movement of crystal grain boundary at the joint face, while the interface becomes active through the increase of dislocation, slide deformation and the like by the increase of stress and consequently the diffusion and dilution of Sn, which naturally obstructs the grain boundary movement, into the seed material and the treating material is easy and the contact area of the active surface increases.

From the above experimental results, it has been found out that the substance having the predetermined crystalline orientation can easily be produced by heating with the holding of the activated state or through the low melting point metal.

Then, these invention methods will concretely be described in the order of production steps.

At first, it is desirable that the treating material and the seed material have the same crystal system such as fcc, bcc or the like as to the crystal structure, and further it is preferable that the lattice constant has no great difference.

Furthermore, in the treating material and the seed material, (i) kind and quantity of impurity contained in the material, (ii) kind and quantity of element added, (iii) recrystallization texture, and (iv) quantity and mass of crystal grain boundary included, dislocation, point defect and surface energy and the like are not particularly defined because they are different in accordance with each substance or production step. However, it is important that energy state of the treating material is higher than that of the seed material. Because, when the energy state of the seed material is equal to or higher than that of the treating material, the seed material can not grow to achieve the given object.

If the energy state of the treating material is too high, a nucleus of unsuitable orientation different from that of the seed material is created in the treating material and finally the given object can not be achieved, so that the energy state is necessary to be adjusted to a proper height in accordance with each case.

Moreover, the shape of these materials may be block, plate, line, grain and the like and are not particularly restricted. For example, in case of producing the grain oriented silicon steel sheet, bidirectional oriented silicon steel sheet and the like, cold rolled coil obtained according to the usual manner as well as rapidly quenched ribbon obtained by roll quenching method and the like are advantageously adapted as the treating material.

Then, the seed material and the treating material having a properly adjusted energy state are contacted with each other at their activated surfaces and heated to a temperature capable of causing the grain boundary movement.

This temperature is a temperature required for rearranging the crystal structure at high energy state to the crystal structure at low energy state, and is generally not lower than recrystallization temperature.

The term "surface of activated state" used herein means an exposed surface of raw material in the seed material and the treating material, i.e. a surface having no adhesion of impurity or no formation of impurity film, or being very small in the presence thereof. Such a surface is obtained by polishing as well as treatment of removing impurities through so-called cleaning effect with the conventionally well-known flux such as rosin flux for soldering, inorganic flux of chloride, fluoride or the like, liquefied cleaning effect with low melting point metal, or further various cleaning methods. Particularly, more completed surfaces are obtained by a treatment such as ion etching under vacuum or the like. Therefore, the atmosphere for maintaining such a surface is best to be vacuum state, but the non-oxidizing atmosphere is sufficiently adapted.

Furthermore, in order to completely conduct the joining, the contacting area is preferable to be made wider as far as possible, and hence the surface roughness of the contacting surface is favorable to be made small as far as possible. Moreover, the reducing of the surface roughness is advantageous in view of preventing the remaining of impurities in concave portions.

In such a joining, it is preferable to apply stress to the contacting surface. Because, when the stress is applied, the surface film is destroyed to develop, for example, a cavitation effect through application of supersonic wave. And also, the dislocation density locally increases at the contact interface to provide a more preferable activated state at high energy state, and even when the flattening degree is insufficient, the flattening is promoted through plastic deformation of concave and convex portions to increase the contact area. As to the component of applied stress, there may be pressure and shearing force with respect to the contacting surface, but the combination of both forces is more effective. Further, as to the intensity of such a stress, the deformation stress is different in accordance with the starting material and the heating temperature, so that the intensity is not particularly restricted, but it is generally favorable to apply stress causing no deformation of not less than 30%.

Furthermore, the intensity of the applied stress may be changed with the lapse of time as in the application of a supersonic wave or remain constant. Particularly, the application of supersonic wave is advantageous in a point that bubbles in the low melting point substance inserted into the joint portion are removed to realize the joining of high quality.

There will be described the action of the low melting point substance interposed between the seed material and the treating material (hereinafter referred to simply as insert member) below.

The reason why the insert member is interposed between the joint faces is due to the fact that the joining between the seed material and the treating material is easily realized in a utilizable inert gas atmosphere and the flexibility and easiness of heat diffusion are utilized. The insert member is softened at a relatively low temperature with the rising of temperature to increase the closeness of the joint face as a filling member, and further the contacting portion is liquefied above a relatively low melting point or above a eutectic temperature exhibiting the eutectic phenomenon with the matrix to shut off the joint interface from a harmful atmosphere to thereby prevent the penetration of impurities into the joint interface. By liquefying the contacting portion, the breakage of the film and the more closeness can be expected, and even when the surface treatment is insufficient, the joining greatly proceeds. Furthermore, the interposition of the insert member and the rubbing between the joint faces through the application of stress are particularly effective for the close joining.

According to the invention, insert members forming a eutectic crystal and/or solid solution with the seed material and the treating material is advantageously adapted. Because these materials progress the dissolution and diffusion into the matrix through continuous heating to reduce liquid phase and make the joint interface narrower. At this step, as the liquid phase is reduced as far as possible, the joining is completed at a joining temperature in a short time.

Thus, the joint face before the heating is favorable to be sufficient in the closeness and small in the presence of the insert member. Therefore, the roughness of the joint face and the stress applied to the joint face become important.

On the other hand, the impurity film on the joint face such as oxide or the like is mixed and aggregated with the molten insert member to form an inclusion at the joint interface, and the aggregation is further proceeded with the advance of the joining to promote the dissolution, diffusion and scattering into the seed material and the treating material. As a result, the existence of impurity atom is removed at a part of the joint interface to exhibit the property substantially equal to that of the crystal boundary.

In this way, the distance between atoms in the joint interface is approached to an extent being substantially equal to the lattice constant, and consequently the movement of atom becomes possible. Then, the heating is continued at a temperature capable of causing the grain boundary movement, whereby the joint interface disappears and also the rearrangement from high energy state to low energy state or the movement of grain boundary occurs to render the whole into a crystal body having the predetermined orientation.

The thickness of the insert member is preferred to be thin as far as possible. Further, as the application method, foil, plating, vapor deposition, spraying, PVD, CVD, ion implantation and the like are preferable. And also, the insert member is necessary to have a melting point lower than that of the joining material such as seed material, treating material or the like, but the use of eutectic member or substance solid soluting in both the materials is more advantageous. Moreover, the proper insert member is different in accordance with the joining material, and is not particularly restricted. For example, when the treating material is iron or iron alloy, the following element or a compound thereof is preferable as the insert member.

Ga, S, In, Se, Sn, Zn, Te, P, Sb, Al, Sr, Ce, As, Ge, Au, Cu, Mn, Be, Si, Bi, Cd, Pb, Ag.

As to the heating, the temperature capable of causing the grain boundary movement is necessary, and in case of pure metal, it is generally required to have at least recrystallization temperature of this metal. Furthermore, the heating disappears the defect from the joint interface to approach to a completely closed ideal joint interface as an atomic size, so that it is preferable that the temperature is above a temperature lively causing heat diffusion and is higher to an extent that another orientation grains are not coarsened in the treating material at high energy state.

As the heating conditions, the uniform temperature heating can usually be adapted, but it is more advantageous to give such a temperature gradient that the temperature drops from low energy substance toward high energy substance as utilized in the preparation of single crystal from the old time.

As the treating atmosphere, it is important that the harmful oxide film is not formed on the joint face, and it is particularly preferable that the closeness of the joint interface as an atomic size is made sufficient. Therefore, when the insert member is not used, it is favorable to make vacuum high as far as possible. When the insert member is used, even if the surface film is somewhat existent as mentioned above, the film is broken by the liquefication of the insert member to make the surface active, the acceptable range of harmful substance contained in the atmosphere is loosed to a certain extent as compared with the vacuum, but the ratio of the range is different in accordance with the joining material, insert member, stress, surface state and the like and is not particularly defined. Furthermore, the atmosphere not reacting with the insert member is favorable until the insert member is diffused and scattered into the matrix to disappear from the joint interface, while the harmfulness is determined in accordance with the joining material after the completion of closeness as the atomic size, so that the atmosphere is not particularly defined. Moreover, when the joint interface comes into contact with an oxidizing atmosphere, the oxide film is formed to shut off the connecting movement of atoms between the seed material and the treating material, so that P02 is particularly favorable to be lower when the contacting area in the first embodiment of the invention is small or until the insert member in the seventh embodiment of the invention is liquefied.

Second, third, eighth and ninth embodiments of the invention

Experiment 2-1

A slab of steel comprising C: 0.010%, Si: 3.35%, Mn: 0.15%, S: 0.008%, sol Al: 0.025%, N: 0.0085% and the balance being substantially Fe was heated at 1250° C. for 1 hour and hot rolled to obtain a hot rolled sheet of 0.30 mm in final thickness. Then, four square specimens having a length: 300 mm and a width: 35 mm were cut out from the thus obtained hot rolled sheet as raw materials A1, A2, A3 and A4.

Furthermore, the resulting hot rolled sheet was subjected to an annealing at 900° C. for 3 minutes, from which specimens of given shape were cut out as raw materials AX1, AX2, AX3 and AX4.

Moreover, a hot rolled sheet of 2.3 mm in thickness was formed by hot rolling and immediately cold rolled to obtain a cold rolled sheet of 0.30 mm in final thickness, from which specimens of given shape were cut out as raw materials AY1, AY2, AY3 and AY4.

And also, a hot rolled sheet of 2.3 mm in thickness was formed by hot rolling, which was subjected to a normalized annealing at 900° C. for 3 minutes and further to two-times cold rolling through an intermediate annealing at 950° C. for 3 minutes to obtain a cold rolled sheet of 0.30 mm in final thickness, and thereafter specimens of given shape were cut out therefrom as raw materials AXY1, AXY2, AXY3 and AXY4.

On the other hand, two single crystal plates each comprising Si: 3.0% and the balance being Fe and inevitable impurities and having a thickness of 0.30 mm, a length: 280 mm, a width: 5 mm, $\alpha=0°$ and $\beta=2°$ were provided as raw materials B1 and B2.

Furthermore, two single crystal plates each having the same size as mentioned above, $\alpha=0°$ and $\beta=0°$ were provided as raw materials C1 and C2.

Then, a section parallel with the rolling direction and perpendicular to the rolling face in each of A1~A4, AX1~AX4, AY1~AY4 and AXY1~AXY4 as well as (110) face perpendicular to plate face in each of B1, B2, C1 and C2 were subjected to Emery polishing, buff polishing and float polishing to render into a mirror state having a center-line average roughness Ra of not more than 10 nm, and thereafter a pair of two sets between A, AX, AY or AXY and B and between, A, AX, AY or AXY and C was prepared to obtain (A1, AX1, AY1, AXY1)-B1, (A2, AX2, AY2, AXY2)-B2, (A3, AX3, AY3, AXY3)-C1, (A4, AX4, AY4, AXY4)-C2. After each polished surface of A, AX, AY, AXY, B, C was subjected to an ion sputtering of Ar under high vacuum ($10^{-6}$ Torr), the mirrored faces of each of (A1, AX1, AY1, AXY1)-B1 and (A3, AX3, AY3, AXY3)-C1 were contacted with each other so that the projection axis of [001] axis of B and C was coincident with the rolling direction of A, AX, AY, AXY, which was annealed at a surface activated state under a superhigh vacuum ($10^{-10}$ Torr), while the mirrored surfaces of each of (A2, AX2, AY2, AXY2)-B2 and (A4, AX4, AY4, AXY4)-C2 after the ion sputtering were contacted with each other at a surface inactive state in a practicable $N_2$ and then annealed in the practicable $N_2$, and in this case, the annealing was carried out at 850° C. for 50 hours. Thereafter, they were subjected to a purification annealing at 1180° C. in $H_2$ for 5 hours.

As a result, crystal grain boundary was formed at the joint face in (A2, AX2, AY2, AXY2)-B2 and (A4, AX4, AY4, AXY4)-C2 to obtain crystal bodies in which the orientation of A, AX, AY, AXY was different from that of each of B, C. On the contrary, no grain boundary was observed at the joint face in (A1, AX1, AY1, AXY1)-B1 and (A3, AX3, AY3, AXY3)-C1, so that the resulting joined body was a single crystal body in which the orientation of A1, AX1, AY1, AXY1 was same as in B1 and the orientation of A3, AX3, AY3, AXY3 was same as in C1 when measuring the crystalline orientation around the joint face. That is, the single crystal (nucleus of Goss grain) grew into a matrix without changing the orientation by contacting and heating while controlling the atmosphere so as not to form the impurity film at the joint face.

Moreover, Table 1-1 shows results measured on magnetic properties of each joined body after the application of tension coating.

TABLE 1-1

|       | $B_{10}$ (T) | $W_{17/50}$ (W/kg) |
|-------|--------------|--------------------|
| A1 - B1 | 2.015 | 0.92 |
| A2 - B2 | 1.72 | — |
| A3 - C1 | 2.021 | 1.35 |
| A4 - C2 | 1.68 | — |
| AX1 - B1 | 2.018 | 0.91 |
| AX2 - B2 | 1.80 | — |
| AX3 - C1 | 2.019 | 1.42 |
| AX4 - C2 | 1.75 | — |
| AY1 - B1 | 2.013 | 0.89 |
| AY2 - B2 | 1.77 | — |
| AY3 - C1 | 2.022 | 1.45 |
| AY4 - C2 | 1.73 | — |
| AXY1 - B1 | 2.015 | 0.93 |
| AXY2 - B2 | 1.76 | — |
| AXY3 - C1 | 2.023 | 1.37 |
| AXY4 - C2 | 1.79 | — |

Experiment 2-2

A slab of steel comprising C: 0.042%, Si: 3.40%, Mn: 0.035%, Se: 0.012%, Sb: 0.020% and the balance being substantially Fe was heated at 1300° C. for 1 hour and hot rolled to obtain a hot rolled sheet of 0.30 mm in final thickness. Then, four square specimens having a length: 300 mm and a width: 35 mm were cut out from the resulting hot rolled sheet and subjected to decarburization and primary recrystallization annealing at 820° C. in a wet hydrogen for 10 minutes to obtain raw materials A1', A2', A3' and A4'.

The hot rolled sheet was annealed at 900° C. for 3 minutes, from which the specimens of given shape were cut out and subjected to the same decarburization and primary recrystallization annealing as mentioned above to obtain raw materials AX1', AX2', AX3' and AX4'.

Moreover, a hot rolled sheet of 2.3 mm in thickness as formed by hot rolling and immediately cold rolled to obtain a cold rolled sheet of 0.30 mm in final thickness, from which specimens of given shape were cut out and subjected to the same decarburization and primary recrystallization annealing to obtain raw materials AY1', AY2', AY3' and AY4'.

And also, a hot rolled sheet of 2.3 mm in thickness was formed by hot rolling, which was subjected to a normalized annealing at 900° C. for 3 minutes and further to two-times cold rolling through an intermediate annealing at 950° C. for 3 minutes to obtain a cold rolled sheet of 0.30 mm in final thickness, and thereafter specimens of given shape were cut out therefrom and subjected to the same decarburization and primary recrystallization annealing to obtain raw materials AXY1', AXY2', AXY3' and AXY4'.

On the other hand, two single crystal plates each comprising Si: 3.0% and the balance being Fe and inevitable impurities and having a thickness of 0.30 mm, a length: 280 mm, a width: 5 mm, $\alpha=0°$ and $\beta=2°$ were provided as raw materials B1 and B2.

Furthermore, two single crystal plates each having the same size as mentioned above, $\alpha=0°$ and $\beta=0°$ were provided as raw materials C1 and C2.

Then, a section parallel with the rolling direction and perpendicular to the rolling face in each of A1'~A4', AX1'~AX4', AY1'~AY4, and AXY1'~AXY4' as well as (110) face perpendicular to plate face in each of B1, B2, C1 and C2 were subjected to Emery polishing, buff polishing and float polishing to render into a mirror state having a center-line average roughness Ra of not more than 10 nm, and thereafter a pair of two sets between A', AX', AY' or AXY' and B and between A', AX', AY' or AXY' and C was prepared to obtain (A1', AX1', AY1', AXY1')-B1, (A2', AX2', AY2', AXY2')-B2, (A3', AX3', AY3', AXY3')-C1, (A4', AX4', AY4', AXY4')-C2. After each polished surface of A', AX', AY', AXY', B, C was subjected to an ion sputtering of Ar under high vacuum ($10^{-6}$ Torr), the mirrored faces of each of (A1', AX1', AY1', AXY1')-B1 and (A3', AX3', AY3', AXY3')-C1 were contacted with each other so that the projection axis of [001] axis of B and C was coincident with the rolling direction of A', AX', AY', AXY', which was annealed at a surface activated state under a superhigh vacuum ($10^{-10}$ Torr), while the mirrored surfaces of each of (A2', AX2', AY2', AXY2')-B2 and (A4', AX4', AY4', AXY4')-C2 after the ion sputtering were contacted with each other at a surface inactive state in a practicable $N_2$ and then annealed in the practicable $N_2$, and in this case, the annealing was carried out at 850° C. for 50 hours. Thereafter, they were subjected to a purification annealing at 1180° C. in $H_2$ for 5 hours.

As a result, crystal grain boundary was formed at the joint face in (A2', AX2', AY2', AXY2')-B2 and (A4', AX4', AY4', AXY4')-C2 to obtain crystal bodies in which the orientation of A', AX', AY', AXY' was different from that of each of B, C. On the contrary, no grain boundary was observed at the joint face in (A1', AX1', AY1', AXY1')-B1 and (A3', AX3', AY3', AXY3')-C1, so that the resulting joined body was a single crystal body in which the orientation of A1', AX1', AY1', AXY1' was same as in B1 and the orientation of A3', AX3', AY3', AXY3' was same as in C1 when measuring the crystalline orientation around the joint face. That is, the single crystal (nucleus of Goss grain) grew into a matrix without changing the orientation by contacting and heating while controlling the atmosphere so as not to form the impurity film at the joint face.

Moreover, Table 1-2 shows results measured on magnetic properties of each joined body after the application of tension coating.

TABLE 1-2

|         | $B_{10}$ (T) | $W_{17/50}$ (W/kg) |
|---------|--------------|--------------------|
| A1' - B1 | 2.011 | 0.91 |
| A2' - B2 | 1.75 | — |
| A3' - C1 | 2.018 | 1.46 |
| A4' - C2 | 1.69 | — |
| AX1' - B1 | 2.012 | 0.89 |
| AX2' - B2 | 1.78 | — |
| AX3' - C1 | 2.021 | 1.44 |
| AX4' - C2 | 1.71 | — |
| AY1' - B1 | 2.011 | 0.92 |
| AY2' - B2 | 1.73 | — |
| AY3' - C1 | 2.019 | 1.47 |
| AY4' - C2 | 1.80 | — |
| AXY1' - B1 | 2.010 | 0.90 |
| AXY2' - B2 | 1.82 | — |
| AXY3' - C1 | 2.015 | 1.45 |
| AXY4' - C2 | 1.75 | — |

As seen from Tables 1-1 and 1-2, the magnetic properties even in case of conducting no annealing and cold rolling (A), or in case of conducting only annealing (AX) or cold rolling (AY) are approximately equal to those in case of conducting both the annealing and cold rolling (AXY) irrespectively of the presence or absence of the primary recrystallization annealing after the hot rolling.

Even when the single crystal bodies are obtained equally, the iron loss properties are considerably improved in case of intentionally shifting {110} face of the seed material from the rolling face as compared with the case of coinciding them.

In order to reduce the cost for advantageously proceeding the industrial production, the practicable inert gas ($N_2$ or Ar) atmosphere is advantageous rather than vacuum as the atmosphere in the heating. This point is solved by interposing a low melting point metal between contacting faces in the joining as mentioned below.

Experiment 2-3

That is, each of the above raw materials AXY', B and C was subjected to a plate surface treatment of each of
i) pickling with hydrochloric acid;
ii) grinding;
iii) Emery polishing;
iv) chemical polishing;
v) chemical polishing+ion etching and then the treated surface was subjected to Sn plating at a thickness of 0.5 μm. Then, Sn plated surfaces were contacted with each other as a set of AXY' and B or AXY' and C and annealed in $N_2$ atmosphere at 850° C. for 50 hours by varying strain vertically applied to the contacted surface every the plate surface treating condition and further annealed at 1180° C. in $H_2$ for 5 hours, and thereafter the presence (x) and absence (O) of crystal grain boundary at the joint interface was observed.

As a result, likewise the case shown in FIG. 2, in the pickling treatment with hydrochloric acid making the roughness large and retaining many impurities on the surface, the strong applied load was required for disappearing the crystal grain boundary, while in case of chemical polishing+ion etching making the surface smooth and reducing impurities, the crystal grain boundary could be disappeared without the application of load.

Furthermore, results measured on the magnetic properties at an applied load of 10 g/mm² are shown in Table 1-3.

TABLE 1-3

| Treatment for joint face | | Applied load 10 g/mm² | |
| --- | --- | --- | --- |
| | | $B_{10}$ (T) | $W_{17/50}$ (W/kg) |
| AXY'-B | pickling with hydrochloric acid | 1.790 | — |
| | grinding | 1.810 | — |
| | Emery polishing | 2.005 | 0.83 |
| | chemical polishing | 2.010 | 0.80 |
| | chemical polishing + ion etching | 2.007 | 0.82 |
| AXY'-C | pickling with hydrochloric acid | 1.780 | — |
| | grinding | 1.790 | — |
| | Emery polishing | 2.010 | 1.42 |
| | chemical polishing | 2.015 | 1.35 |
| | chemical polishing + ion etching | 2.012 | 1.37 |

As seen from Table 1-3, even when the insert member is interposed, the improved iron loss properties were obtained by intentionally shifting {110} face of the seed material from the rolling face.

Although the case of using AXY' as a treating material has mainly described in Experiment 2-3, it has been confirmed that the similar results are obtained even when the raw materials A, AX, AY, AXY, A', AX', AY' are used as a treating material.

The reason why the crystal grain boundary is disappeared by interposing Sn film having a melting point as low as 232° C. is considered to be due to the same reason described in the above Experiment 1.

From the above experiments, it has been elucidated that grain oriented silicon steel sheets having the predetermined orientation can easily be produced by contacting and heating at an activated surface state or in the presence of the low melting point metal.

Moreover, it has been found that the growth of nucleus planted when the C amount in the starting material is less is particularly good among the experiments on the low temperature joining technique as mentioned above.

In this connection, the inventors have made further studies and found out that when conducting the cold rolling, if the C amount in steel before the cold rolling is reduced to not more than 0.010%, the occurrence of nuclei other than the nucleus planted in the low temperature joining is effectively suppressed to grow the desired orientation over the whole of the steel sheet.

Experiment 2-4

A slab of steel comprising C: 0.080%, Si: 3.30%, Mn: 0.070%, S: 0.020%, sol Al: 0.025%, N: 0.0080% and the balance being Fe and inevitable impurities was heated at 1350° C. and hot rolled to a thickness of 1.15 mm. Then, the hot rolled sheet was subjected to an annealing of (A) at 1120° C. in $N_2$ for 2 minutes, (B) at 1120° C. in $N_2$ for 2 minutes+at 725° C. in wet hydrogen for 3 hours.

In this case, the C amount in the annealed steel sheet was (A) 0.070% and (B) 0.005%. Thereafter, the sheet was cold rolled to a thickness of 0.20 mm and subjected to decarburization and primary recrystallization annealing at 820° C. in a wet hydrogen for 5 minutes, from which a plate having a length: 300 mm and a width: 500 mm was cut out as a raw material D, E.

Furthermore, a plate having a length: 300 mm and a width: 500 mm was cut out from the cold rolled sheet of the raw material (B) as a raw material F.

On the other hand, a single crystal plate comprising Si: 3.0% and the balance being substantially Fe and having a thickness: 0.20 mm, a length: 300 mm, a width: 5 mm, α=0° and β=2.5° was provided as a raw material G.

A section of each of D, E and F parallel with the rolling direction and perpendicular to the rolling face and a face of G perpendicular to the plate face were subjected to Emery polishing to render into a mirror face of Ra<0.1 μm. After Sn film of 0.5 μm in thickness was formed on each polished face through plating, the plated face of each of D, E, F was closely joined with the plated face of G while applying a compressive load of 10 g/mm² to the joint face, which was fed into a temperature tilting furnace having a temperature gradient of 5° C./cm between 1150°–850° C. at a feed rate of 10 mm/h while holding G at high temperature side.

Then, MgO as a separator was applied to D, E, F, which was subjected to a purification annealing at 1200° C. in $H_2$ for 20 hours and thereafter magnetic properties measured at five positions from G side to obtain results as shown in the following Table 1-4.

TABLE 1-4

| Position from G | D | | E (Invention) | | F (Invention) | |
|---|---|---|---|---|---|---|
| | $B_{10}$ (T) | $W_{17/50}$ (W/kg) | $B_{10}$ (T) | $W_{17/50}$ (W/kg) | $B_{10}$ (T) | $W_{17/50}$ (W/kg) |
| 1 | 1.99 | 0.80 | 2.00 | 0.79 | 1.99 | 0.80 |
| 2 | 2.01 | 0.79 | 1.99 | 0.80 | 1.99 | 0.80 |
| 3 | 1.97 | 0.83 | 2.01 | 0.78 | 2.00 | 0.80 |
| 4 | 1.95 | 0.88 | 2.00 | 0.78 | 2.00 | 0.79 |
| 5 | 1.93 | 0.95 | 1.99 | 0.81 | 2.01 | 0.78 |

As seen from the above table, in E, F decarburized before the cold rolling, the magnetic properties are not degraded even when it separates away from the joint portion with the seed material G. This is due to the fact that there is caused no occurrence of nucleus in another secondary recrystallized grains having a shifted orientation during the growing course of the seed material G in the decarburized raw materials E, F as compared with the raw material D. The reason on the occurrence of such a phenomenon is considered to be due to the fact that the formation of so-called deformation band is suppressed by conducting decarburization before the cold rolling to thereby reduce the nucleus of secondary grains.

Then, the method of the invention will be described concretely in the order of the production steps.

As the starting material according to the invention, anyone of raw materials comprising C: not more than 1.0%, Si: 0.1~7.0% and Mn: 0.002~1.5% as a main component and containing at least one of P: 0.010~0.050%, S: 0.005~0.05%, Se: 0.005~0.05%, Te: 0.003~0.03%, Sb: 0.005~0.100%, Sn: 0.03~0.5%. Cu: 0.02~0.3%, Mo: 0.005~0.05%, B: 0.0003~0.0040%, N: 0.001~0.02%, Al: 0.005~0.10%, Ti: 0.001~0.05%, V: 0.001~0.05%, Cr: 0.05~0.5% and Nb: 0.001~0.05% as an inhibitor forming component are advantageously adaptable.

These raw materials are made by the conventionally well-known steel-making methods such as steel-making in convertor or electric furnace and further shaped into a slab or a sheet bar through ingot blooming method, continuous casting method or roll rapid quenching method or the like, or into this steel sheet directly.

In general, the heating is carried out at a temperature of not lower than 1350° C. for completely soluting the inhibitor component into the slab. In the invention, it is not particularly necessary to conduct the slab heating treatment at a high temperature above 1350° C. as mentioned above, and it is enough to conduct low-temperature slab heating treatment below about 1250° C. as in the ordinary steel. Because, the crystalline orientation of the steel sheet is fully dependent upon the seed material in the invention, so that it is sufficient to strictly control only the orientation of the seed material into a desirable orientation and it is not necessary to make the inhibitor strong as far as possible for aligning the orientation of the nucleus. Further, the orientation of the steel sheet as a treating material is not necessary to be strictly controlled, and hence it is not required to completely solute the inhibitor component into steel at the slab heating stage.

In the invention, therefore, not only the energy-saving is attained, but also there is caused no abnormal coarsening of crystal structure, which has been apprehended in the high-temperature slab heating, so that the uniform and fine crystal structure is obtained through the low-temperature slab heating.

Thereafter, silicon-containing steel sheets are obtained by hot rolling. Then, the sheet is treated without annealing and cold rolling, or subjected to an annealing (normalized annealing or intermediate annealing) and/or cold rolling at least one time. Immediately thereafter or after primary recrystallization annealing, the sheet is subjected to a finish annealing. In this case, the normalized annealing or intermediate annealing aims at the recrystallization treatment and decarburization treatment for homogenizing the crystal structure after the rolling, and is usually carried out at 700°~1200° C. for 30 seconds~10 minutes. In the invention, it is preferable that even in case of conducting the cold rolling, when the C amount in the starting material exceeds 0.01%, such a normalized annealing or intermediate annealing is a decarburization annealing adjusting an oxygen potential in the atmosphere or the annealing time and the C amount in steel before the final cold rolling is reduced to not more than 0.010%. Because, by reducing the C amount in steel before the final cold rolling to not more than 0.010%, the planted secondary recrystallized nucleus is stably grown over the whole of the steel sheet as previously mentioned.

The reason why the C amount in steel before the final cold rolling is limited to not more than 0.010% is due to the fact that when the C amount exceeds the above value, the formation of so-called deformation band becomes active and the occurrence frequency of α, β shifted nuclei in the primary grains forming the secondary grains increases to easily generate and grow largely α, β shifted secondary grains.

Then, a primary recrystallization annealing is carried out, if necessary. As the primary recrystallization annealing, the slow heating at a rate of, for example, about 20° C./h over a long time for completing the primary recrystallization (~700° C.) or a treatment of maintaining a temperature at 550° C. for about 24 hours is advantageous for not only the fine homogenization and stabilization of inhibitor but also the decrease of (110) component and increase of (111) component. Thereafter, the annealing is carried out under atmosphere of oxygen potential, temperature and time in accordance with the C amount, for example, in a wet hydrogen at 700°~900° C. for about 1~15 minutes, whereby C in steel is removed and also primary recrystallization texture suitable for developing secondary recrystallized grains of Goss orientation in the subsequent annealing is formed.

Thereafter, the sheet is subjected to secondary recrystallization annealing at 800°–1100° C. for about 1~50 hours and further to purification annealing at 1100°–1250° C. for about 5~25 hours. According to the invention, at a step after the hot rolling and before the finish annealing in both cases, a seed material having an orientation is joined to an edge portion of the steel sheet so as to control the orientation of the seed material into $|\alpha| \leq 5°$ $1 \leq |\beta| \leq 5°$ where α: angle defined by a projection line of <001> axis of seed material with respect to rolling face of steel sheet and the rolling direction of steel sheet;

β: inclination angle of <001> axis of seed material with respect to rolling face of steel sheet.

The reason why the orientations of the seed material and the steel sheet are limited to $|\alpha| \leq 5°$ and $|\beta|=1°~5°$ is as follows.

At first, as regards α, when $|\alpha|$ exceeds 5°, the degradation of $B_{10}$ value becomes excessive and the expected improvement of magnetic properties can not be obtained.

Secondly, as regards β, when $|\beta|<1°$, the width of magnetic domain becomes excessively large to bring about the degradation of the iron loss, while when |β|>5°, the $B_{10}$ value is degraded and hence the iron loss is also degraded.

In the above joining, it is important to contact the joint faces at an activated state or to interpose an insert member having a low melting point between the joint faces.

The reason on the above is same as described in the above Experiment 1.

After the seed material and the treating material are contacted with each other at the activated state or joined through interposition of the insert member, they are heated to a temperature causing grain boundary movement.

The term "temperature causing grain boundary movement" used herein means a temperature required for rearranging the crystal structure to change into a new crystal structure and generally is not lower than the recrystallization temperature.

In such a heat treatment, it is important that the steel sheet as the treating material is at an energy state higher than that of the seed material. Because, the seed material can not grow when the energy state of the seed material is equal to or higher than that of the steel sheet.

The term "energy state" used herein is concerned with inner strain and surface conditions as previously mentioned, and is mainly dependent upon the quantities and masses of crystal grain boundaries, dislocations, point defects and the surface energy of the crystal. As these quantities increase, the higher the energy state. Moreover, the seed materials used in the second, third, eighth and ninth embodiments of the invention are mainly single crystals having an aligned orientation, while the steel sheets as the treating material are not only polycrystalline bodies but also contain a relatively large amount of dislocation or the like. Therefore, the energy state in the steel sheet is generally higher than that of the seed material, so that it is not usually required to take a special treatment for adjustment of energy state. According to circumstances, for example, when the primary grain size is excessively large, it is advantageous to conduct a treatment for the introduction of strain or the like. Furthermore, in order to hold the high energy state constant in the annealing, it is necessary to control the primary grain size constant. For this purpose, it is effective to add at least one of N, S, Se, Te and compounds thereof to the separator in addition to the inhibitor originally contained in the steel sheet.

The adequate temperature is different in accordance with the matrix and the production step, i.e., the energy state of the treating material or the like, but it is usually 650°~1200° C., preferably 800°~1150° C.

Furthermore, the heating system and the treating atmosphere are the same as described in Experiment 1.

Moreover, in the invention, when the joining treatment of the seed material is particularly just before the finish annealing, the subsequent heating treatment may be the finish annealing.

And also, when the raw material containing a relatively large amount of C is used and the decarburization treatment is not carried out up to the finish annealing, it is favorable that the annealing atmosphere is adjusted to a decarburizing property by using MgO containing saturated crystal water or the like as a main component of an annealing separator in the subsequent secondary recrystallization annealing, whereby the decarburization is carried out before the growth of secondary grains.

In addition, according to the invention, the magnetic properties can be more improved by applying a tension-type thin coating to the surface of the steel sheet after the purification annealing in the well-known manner, or by introducing strain into the steel sheet to refine magnetic domains.

Fourth, fifth, tenth and eleventh embodiments of the invention Experiment 3-1

A slab of steel comprising C: 0.042%, Si: 3.40%, Mn: 0.035%, Se: 0.012%, Sb: 0.020%, Al: 0.025%, N: 0.0085% and the balance being substantially Fe was heated at 1300° C. for 1 hour, hot rolled to a thickness of 2.3 mm, and then subjected to a cold rolling two times, wherein a first cold rolling was made in parallel to the hot rolling direction at a reduction of 70% and a second cold rolling was made in a direction perpendicular thereto at a reduction of 57%, to obtain a cold rolled sheet having a final thickness of 0.30 mm. From the thus obtained cold rolled sheet were cut out four plates having a length: 300 mm and a width: 35 mm as raw materials A1, A2, whose longitudinal direction being the same as in the first rolling direction, and raw materials A3, A4, whose longitudinal direction being the same as in the second rolling direction.

On the other hand, four single crystal plates having the same chemical composition as in the above cold rolled sheet and a thickness: 0.30 mm, a length: 280 mm, a width: 5 mm and a plate face of (100) were provided as raw materials B1, B2, B3, B4.

Then, a section parallel with the longitudinal direction and perpendicular to the rolling face in each of A1~A4 as well as (110) face perpendicular to plate face in each of B1, B2, B3, B4 were subjected to Emery polishing, buff polishing and float polishing to render into a mirror state having a center-line average roughness Ra of not more than 10 nm, and thereafter four sets of a pair of A and B were prepared to obtain A1-B1, A2-B2, A3-B3, A4-B4. After each polished surface of A, B was subjected to an ion sputtering of Ar under high vacuum ($10^{-6}$ Torr), the mirrored faces of each of A1-B1 and A3-B3 were contacted with each other so that [001] axis of B was coincident with the rolling direction of A, which was heated at a surface activated state under a superhigh vacuum ($10^{-10}$ Torr), while the mirrored surfaces of each of A2-B2 and A4-B4 after the ion sputtering were contacted with each other at a surface inactive state in a practicable $N_2$ and then heated in the practicable $N_2$, and in both cases, the heating was carried out from 200° C. at a temperature rising rate of 20° C./h and subjected to an annealing at 970° C. for 50 hours. Thereafter, they were subjected to a purification annealing at 1180° C. in $H_2$ for 5 hours.

As a result, crystal grain boundary was formed at the joint face in A2-B2 and A4-B4 to obtain crystal bodies in which the orientations between A2 and B2 and between A4 and B4 was different from each other. On the contrary, no grain boundary was observed at the joint face in A1-B1 and A3-B3, so that the resulting joined body was a single crystal body in which the orientation of A1, A3 was same as in B1 and B3 when measuring the crystalline orientation around the joint face. That is, the single crystal (nucleus of Goss grain) grew into a matrix without changing the orientation by contacting and heating while controlling the atmosphere so as not to form the impurity film at the joint face.

Moreover, Table 2-1 shows results measured on magnetic properties of each joined body in the longitudinal direction.

TABLE 2-1

|  | $B_{10}$ (T) | $W_{17/50}$ (W/kg) | Remarks |
| --- | --- | --- | --- |
| A1-B1 | 2.018 | 1.43 | invention |
| A2-B2 | 1.38 | — | — |

TABLE 2-1-continued

|  | $B_{10}$ (T) | $W_{17/50}$ (W/kg) | Remarks |
|---|---|---|---|
| A3-B3 | 2.019 | 1.45 | invention |
| A4-B4 | 1.41 | — | — |

Experiment 3-2

Four square plates cut out in the same manner as in Experiment 3-1 were heated from 200° C. to 700° C. at a temperature rising rate of 20° C./h and then subjected to decarburization and primary recrystallization annealing at 820° C. in a wet hydrogen for 3 minutes in which raw materials having a longitudinal direction same as in the first rolling direction were A1' and A2' and raw materials having a longitudinal direction same as in the second rolling direction were A3', A4'.

On the other hand, four single crystal plates having the same chemical composition as in the above cold rolled sheet and a thickness: 0.30 mm, a length: 280 mm, a width: 5 mm and a plate face of (100) were provided as raw materials B1', B2', B3', B4'.

Then, a section parallel with the longitudinal direction and perpendicular to the rolling face in each of A1'–A4' as well as (100) face perpendicular to plate face in each of B1', B2', B3', B4' were subjected to Emery polishing, buff polishing and float polishing to render into a mirror state having a center-line average roughness Ra of not more than 10 nm, and thereafter four sets of a pair of A' and B' were prepared to obtain A1'-B1', A2'-B2', A3'-B3', A4'-B4'. After each polished surface of A', B' was subjected to an ion sputtering of Ar under high vacuum ($10^{-6}$ Torr), the mirrored faces of each of A1'-B1' and A3'-B3' were contacted with each other so that [001] axis of B' was coincident with the rolling direction of A', which was annealed at a surface activated state under a superhigh vacuum ($10^{-10}$ Torr), while the mirrored surfaces of each of A2'-B2' and A4'-B4' after the ion sputtering were contacted with each other at a surface inactive state in a practicable $N_2$ and annealed in the practicable $N_2$, and in this case the annealing was carried out at 970° C. for 50 hours. Thereafter, they were subjected to a purification annealing at 1180° C. in $H_2$ for 5 hours.

As a result, crystal grain boundary was formed at the joint face in A2'-B2' and A4'-B4' likewise Experiment 3-1 to obtain crystal bodies in which the orientations between A2' and B2' and between A4' and B4' was different from each other. On the contrary, no grain boundary was observed at the joint face in A1'-B1' and A3'-B3', so that the resulting joined body was a single crystal body in which the orientation of A1', A3' was same in B1' and B3' when measuring the crystalline orientation around the joint face.

Moreover, Table 2-2 shows results measured on magnetic properties of each joined body in the longitudinal direction.

TABLE 2-2

|  | $B_{10}$ (T) | $W_{17/50}$ (W/kg) | Remarks |
|---|---|---|---|
| A1'-B1' | 2.015 | 1.42 | invention |
| A2'-B2' | 1.35 | — | — |
| A3'-B3' | 2.020 | 1.41 | invention |
| A4'-B4' | 1.30 | — | — |

Experiment 3-3

A steel slab having the same chemical composition as in Experiment 3-1 was hot rolled to a thickness of 2.3 mm in the same manner, subjected to a normalized annealing at 1020° C. for 3 minutes and cold rolled in the same manner as in Experiment 3-1, from which four square plates having a length: 300 mm and a width: 35 mm were cut out as raw materials A1", A2" having a longitudinal direction same as in the first rolling direction and raw materials A3", A4" having a longitudinal direction same as in the second rolling direction. Thereafter, they were subjected to decarburization and primary recrystallization annealing at 820° C. for 3 minutes.

On the other hand, four single crystal plates having the same chemical composition as in the above cold rolled sheet and a thickness: 0.30 mm, a length: 280 mm, a width; 5 mm and a plate face of (100) were provided as raw materials B1", B2", B3", B4".

Then, a section parallel with the longitudinal direction and perpendicular to the rolling face in each of A1"–A4" as well as (100) face perpendicular to plate face in each of B1", B2", B3", B4" were subjected to Emery polishing, buff polishing and float polishing to render in to a mirror state having a center-line average roughness Ra of not more than 10 nm, and thereafter four sets of a pair of A" and B" were prepared to obtain A1"-B1", A2"-B2", A3"-B3", A4"-B4". After each polished surface of A", B" was subjected to an ion sputtering of Ar under high vacuum ($10^{-6}$ torr), the mirrored faces of each of A1"-B1" and A3"-B3" were contacted with each other so that [001] axis of B" was coincident with the rolling direction of A", which was annealed at a surface activated state under a superhigh vacuum ($10^{-10}$ Torr), while the mirrored surfaces of each of A2"-B2" and A4"-B4" after the ion sputtering were contacted with each other at a surface inactive state in a practicable $N_2$ and annealed in the practicable $N_2$, and in both cases the annealing was carried out at 970° C. for 50 hours. Thereafter, they were subjected to a purification annealing at 1180° C. in $H_2$ for 5 hours.

As a result, crystal grain boundary was formed at the joint face in A2"-B2" and A4"-B4" likewise Experiment 3-1 to obtain crystal bodies in which the orientations between A2" and B2" and between A4" and B4" was different from each other. On the contrary, no grain boundary was observed at the joint face in A1"-B1" and A3"-B3", so that the resulting joined body was a single crystal body in which the orientation of A1", A3" was same as in B1" and B3" when measuring the crystalline orientation around the joint face.

Moreover, Table 2-3 shows results measured on magnetic properties of each joined body in the longitudinal direction.

TABLE 2-3

|  | $B_{10}$ (T) | $W_{17/50}$ (W/kg) | Remarks |
|---|---|---|---|
| A1"-B1" | 2.005 | 1.40 | Invention |
| A2"-B2" | 1.83 | — | — |
| A3"-B3" | 2.010 | 1.38 | Invention |
| A4"-B4" | 1.57 | — | — |

Thus, according to the fourth and fifth inventions, very good magnetic properties were obtained in any directions crossing on the rolling face. Particularly, when the primary recrystallization after the cold rolling is the gradual heating and annealing, the strong effect of suppressing the grain growth is obtained through the reduction of (110) component of the treating material and the uniform fine division and stabilization of inhibitor to facilitate the growth of the seed material and hence provide excellent magnetic properties.

Moreover, in order to advantageously proceed the industrial production by more reducing the cost, the atmosphere in the heating is favorable to be practicable inert gas ($N_2$ or Ar) atmosphere rather vacuum as described on the above production method of grain oriented silicon steel sheets. This point was solved by joining through the interposition of low melting point substance between joint faces as mentioned above.

Experiment 3-4

That is, each of the above raw materials A1, A3 and B1, B3 was subjected to a plate surface treatment of each of i) pickling with hydrochloric acid;

ii) grinding;

iii) Emery polishing;

iv) chemical polishing;

v) chemical polishing+ion etching and then the treated surface was subjected to Sn plating at a thickness of 0.5 μm. Then, Sn plated surfaces were contacted with each other as a set of A1 and B1 or A3 and B3 and heated in $N_2$ atmosphere from 200° C. at a temperature rising rate of 20° C./h by varying strain vertically applied to the contacted surface every the plate surface treating condition and further annealed at 970° C. for 50 hours and at 1180° C. in $H_2$ for 5 hours, and thereafter the presence (x) and absence (O) of crystal grain boundary at the joint interface was observed.

As a result, likewise the case shown in FIG. 2, in the pickling treatment with hydrochloric acid making the roughness large and retaining many impurities on the surface, the strong applied load was required for disappearing the crystal grain boundary, while in case of chemical polishing+ion etching making the surface smooth and reducing impurities, the crystal grain boundary could be disappeared without the application of load.

Furthermore, results measured on the magnetic properties at an applied load of 10 g/mm² are shown in Table 2-4.

TABLE 2-4

| | Treatment for joint face | Applied load 10 g/mm' | | |
|---|---|---|---|---|
| | | $B_{10}$ (T) | $W_{17/50}$ (W/kg) | Remarks |
| A1-B1 | pickling with hydrochloric acid | 1.350 | — | |
| | grinding | 1.790 | — | |
| | Emery polishing | 2.017 | 1.46 | |
| | chemical polishing | 2.021 | 1.47 | Invention |
| | chemical polishing + ion etching | 2.042 | 1.49 | |
| A3-B3 | pickling with hydrochloric acid | 1.450 | — | |
| | grinding | 1.750 | — | |
| | Emery polishing | 2.015 | 1.42 | |
| | chemical polishing | 2.022 | 1.45 | Invention |
| | chemical polishing + ion etching | 2.031 | 1.48 | |

Experiment 3-5

Furthermore, each of the raw materials A1', A3' and B1', B3' as well as A1", A3" and B1", B3" subjected to the decarburization and primary recrystallization annealing before the finish annealing was subjected to the plate surface treatment and the plating treatment in the same manner as in Experiment 2-1 and then the plated surfaces were contacted with each other as a set of A1' and B1', A3' and B3', A1" and B1" or A3" and B3" and annealed in $N_2$ atmosphere at 970° C. for 50 hours and further at 1180° C. in $H_2$ for 5 hours, and thereafter the presence (x) and absence (O) of crystal grain boundary at the joint interface was observed. As a result, there were obtained results approximately similar to the case shown in FIG. 2. Furthermore, results measured on the magnetic properties at an applied load of 10 g/mm² are shown in Table 2-5.

TABLE 2-5

| | Treatment for joint face | Applied load 10 g/mm² | | |
|---|---|---|---|---|
| | | $B_{10}$ (T) | $W_{17/50}$ (W/kg) | Remarks |
| A1'-B1' | pickling with hydrochloric acid | 1.530 | — | |
| | grinding | 1.820 | — | |
| | Emery polishing | 2.015 | 1.47 | |
| | chemical polishing | 2.010 | 1.43 | Invention |
| | chemical polishing + ion etching | 2.035 | 1.45 | |
| A3'-B3' | pickling with hydrochloric acid | 1.620 | — | |
| | grinding | 1.801 | — | |
| | Emery polishing | 2.010 | 1.45 | |
| | chemical polishing | 2.020 | 1.39 | Invention |
| | chemical polishing + ion etching | 2.045 | 1.47 | |
| A1"-B1" | pickling with hydrochloric acid | 1.780 | — | |
| | grinding | 1.815 | — | |
| | Emery polishing | 2.010 | 1.45 | |
| | chemical polishing | 2.005 | 1.42 | Invention |
| | chemical polishing + ion etching | 2.010 | 1.43 | |
| A3"-B3" | pickling with hydrochloric acid | 1.790 | — | |
| | grinding | 1.795 | — | |
| | Emery polishing | 2.005 | 1.43 | |
| | chemical polishing | 2.015 | 1.37 | Invention |
| | chemical polishing + ion etching | 2.010 | 1.39 | |

Thus, according to the tenth and eleventh embodiments of the invention, very good magnetic properties were obtained in any directions crossing on the rolling face even in the practicable atmosphere.

The reason why the crystal grain boundary is disappeared by interposing the Sn film having a melting point as low as 232° C. is considered to be the same as described in Experiment 1.

From the above experimental results, it has been found out that the bidirectional oriented silicon steel sheets can easily be produced by heating with the holding of the activated state or under the interposition of the low melting point metal.

Then, these invention methods will concretely be described in the order of production steps.

At first, the starting material according to the invention is substantially the same as in the grain oriented silicon steel sheet, and anyone of raw materials comprising C: 0.005~1.0%, Si: 0.1~7.0% and Mn: 0.002~1.5% as a main component and containing at least one of S: 0.005~0.05%, Se: 0.005~0.05%, Te: 0.003~0.03%, Sb: 0.005~0.100%, Sn: 0.03~0.5%, Cu: 0.02~0.3%, Mo: 0.005~0.05%, B: 0.0003~0.0040%, N: 0.001~0.02%, Al: 0.005~0.10%, Ti: 0.001~0.05%, V: 0.001~0.05% and Nb: 0.001~0.05% as an inhibitor forming component are advantageously adaptable.

These raw materials are made by the conventionally well-known steel-making methods such as steel-making in convertor or electric furnace and further shaped into a slab or a sheet bar through ingot blooming method, continuous casting method or roll rapid quenching method or the like, or into thin steel sheet directly and thereafter hot rolling, warm or cold rolling is carried out to form a silicon-containing steel sheet, if necessary. Then, the desired thickness is provided by a normalized annealing or further one or more cold rolling including an intermediate annealing, if necessary. As to the cold rolling, it is effective to conduct the cold rolling by crossing the rolling direction as disclosed in Japanese Patent Application Publication No. 35-2657.

That is, it is easy and economical in industry that the first cold rolling is carried out in the same direction as in the hot rolling direction and then cut into a constant length and subjected to the second cold rolling in a direction perpendicular thereto at a sheet state, or after the cutting into a constant length, the sheets are welded to form a strip, which is continuously subjected to the cold rolling. Moreover, the normalized annealing or intermediate annealing aims at the recrystallization treatment and decarburization treatment for homogenizing the crystal structure after the rolling, and is usually carried out at 700°~1200° C. for 30 seconds~10 minutes. In the inventions, it is preferable that even in case of conducting the cold rolling, when the C amount in the starting material exceeds 0.01%, such a normalized annealing or intermediate annealing is a decarburization annealing adjusting an oxygen potential in the atmosphere or the annealing time and the C amount in steel before the final cold rolling is reduced to not more than 0.010%. The reason is the same as described in the production of the grain oriented silicon steel sheet.

Then, a primary recrystallization annealing is carried out, if necessary. As the primary recrystallization annealing, the slow heating at a rate of, for example, about 20° C./h over a long time for completing the primary recrystallization (~700° C.) or a treatment of maintaining a temperature at 550° C. for about 24 hours is advantageous for not only the fine homogenization and stabilization of inhibitor but also the decrease of (110) component and increase of (111) component. Such an annealing is carried out under atmosphere of oxygen potential, temperature and time in accordance with the C amount, for example, in a wet hydrogen at 700°~900° C. for about 1~15 minutes, whereby C in steel is removed and also primary recrystallization texture suitable for developing secondary recrystallized grains of Goss orientation in the subsequent annealing is formed.

Thereafter, the sheet is subjected to secondary recrystallization annealing at 800°~1100° C. for about 1~50 hours and further to purification annealing at 1100°~1250° C. for about 5~25 hours. According to the invention, a seed material having an orientation is joined to an edge portion of the steel sheet so as to control the orientation of the seed material into $|\alpha| \leq 10°$ $|\beta| \leq 10°$ where α: angle defined by a projection line of <001> axis of seed material with respect to rolling face of steel sheet and the rolling direction of steel sheet;

β: inclination angle of {100} face of seed material with respect to rolling face of steel sheet at a stage after the hot rolling and before the purification annealing.

The reason why α and β are limited to $|\alpha|, |\beta| \leq 10°$ is due to the fact that when $|\alpha|, |\beta|$ exceed 10°, the degradation of $B_{10}$ value becomes excessive and the given magnetic properties are not obtained.

In the above joining, it is important to contact the joint faces at an activated state or to interpose an insert member having a low melting point between the joint faces.

The reason on the above is the same as described in the above Experiment 1.

After the seed material and the treating material are contacted with each other at the activated state or joined through interposition of the insert member, they are heated to a temperature causing grain boundary movement likewise the aforementioned case of producing the grain oriented silicon steel sheet.

Moreover, the heating conditions and the heating atmosphere may be the same as in the production of the grain oriented silicon steel sheet.

In addition, according to these inventions, the magnetic properties can be more improved by applying a tension-type thin coating to the surface of the steel sheet after the purification annealing in the well-known manner, or by introducing strain into the steel sheet to refine magnetic domains.

Sixth and twelfth embodiments of the invention

Experiment 4

As mentioned in Experiments 1~3, it has been elucidated that substances having a given orientation can easily be produced by heating with holding the activated state or under the interposition of the low melting point metal. In order to promote the mass production in industrial scale, however, it is advantageous to realize the heating at a coiled state of the steel sheet.

The sixth and twelfth inventions described herein advantageously realize the heating treatment at such a coiled state.

As the method of planting a seed material onto the coiled steel sheet, a most ideal method is the coincidence of curvature of the steel sheet with curvature of the seed material in the joining. That is, a plate-like seed material of a given shape is joined to the rolling face of the steel sheet and coiled, or a coiled steel sheet and a coiled seed material having the same curvature as in the sheet are piled one upon the other and then joined. However, the joining of the seed material to the elongated steel sheet over the full length thereof prior to the coiling is necessary to take a complicated and long time treating step, and also the joining between the edges of the coils has a problem that the control of orientation is difficult.

However, this problem can be solved by radially arranging an orientation controlled strip-like seed material onto an edge portion of the coil and joining them as shown in FIG. 3a. In FIG. 3a, a distance between the seed materials to be planted in the circumferential direction is l, and an angle corresponding to l when the seed material grows to l is β. Here, β shows a shifting of the seed material from the rolling face of the steel sheet having an orientation in a tangential direction of the coil when the seed material or crystal grain grown from the seed material displaces by l in the circumferential direction. That is, the orientation of the seed material shifts by β from the rolling face of the steel sheet when the seed material grows by l.

Since the curvature is existent in the steel sheet at such a coiled state, even if the orientation of the strip-like seed material is strictly controlled, the shifting of the orientation from the rolling face of the steel sheet is unavoidable at the stage of the crystal growth. In this point, the shifting can be mitigated to an extent that there is actually caused no problem by shortening the planting distance of the seed material in the circumferential direction.

In FIG. 4 is shown a relationship between 1 and β in outermost coil and innermost coil when an outer diameter is 1000 mm and an inner diameter is 550 mm. The shorter the planting distance of the seed material or the larger the coil diameter or the smaller the curvature, the smaller the shifting (β) of orientation of the coiled body from the seed material. However, the enlargement of the coil diameter is critical, so that it is favorable to shorten the planting distance of the seed material for suppressing the shifting of the orientation.

In case of a coil having an inner diameter of 550 mm, assuming that one crystal grows from one seed material, in order to control an average shifting angle $β_{av}$ of β in the longitudinal direction of the steel sheet to not more than 10°, it is necessary that the crystal length of the inner coil portion in the circumferential direction is restrained to not more than 100 mm being about 2 times of the crystal length at β=10° judging from FIG. 4. Similarly, it should be restrained to not more than 180 mm in the outer coil portion having a diameter of 1000 mm. Therefore, the planting distance of the seed material is necessary to be 100 mm in order to obtain $β_{av}≦10°$ over the full length of the coil.

As the planting method for the seed material, it is not necessary to continuously extend the seed material in the radial direction, and the discontinuous state may be taken as shown in FIG. 3b. Furthermore, as shown in FIG. 3c, it is not necessarily required to radially arrange the seed material, and in this case it is necessary to change the orientation of the seed material in accordance with the arranging position of the seed material for holding the given orientation relation to the coil.

Then, the invention method will be described concretely in the order of the production steps.

Firstly, all substances described in the first~fifth embodiments of the invention and seventh~eleventh embodiments of the invention are adaptable as the treating material and the seed material.

Moreover, the shape of the seed material may be coil-like as previously mentioned, but is preferable to radially arrange on a helical edge face of the coil as a strip.

And also, the helical edge face of the coil is favorable to be subjected to a smoothening treatment for removing surface unevenness or strain introduced portion. Moreover, in order to prevent the shifting between the coil-like steel sheets after the smoothening treatment, it is advantageous that edge faces of the steel sheets opposite to the given smoothening faces are joined through welding to mutually fix these steel sheets to each other prior to the smoothening treatment.

After the seed material and the treating material are contacted with each other at the activated state or joined through interposition of the insert member, they are heated to a temperature causing grain boundary movement.

Moreover, the heating conditions and the heating atmosphere may be the same as previously mentioned in accordance with the properties of the seed material and the treating material.

BEST MODE OF CARRYING OUT THE INVENTION

Example 1

Figure 1A:
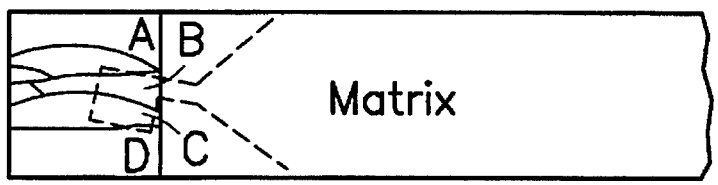
FIGS. 1a, b, c and d are flow sheets showing the production of crystal body having a particular orientation according to the conventional method, respectively.
Figure 1B:
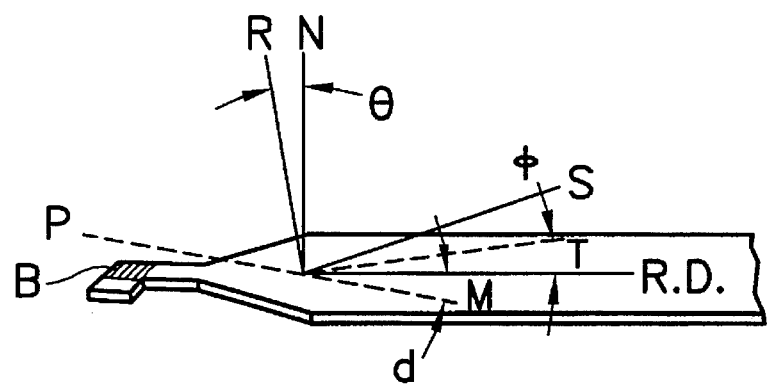
Figure 1C:
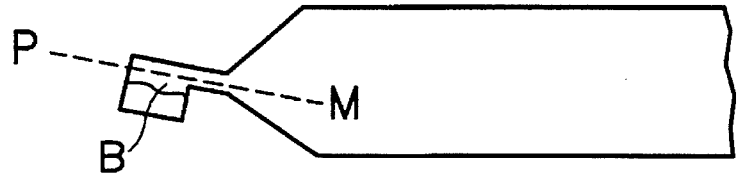
Figure 1D:
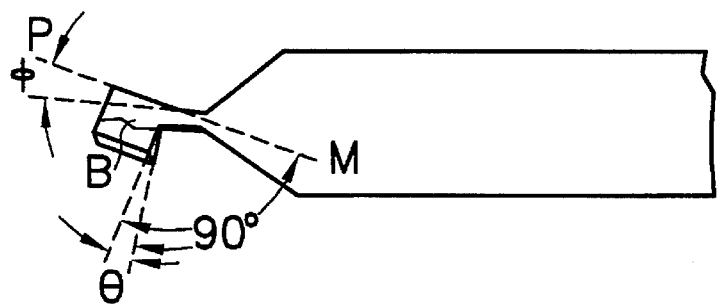
Figure 2:
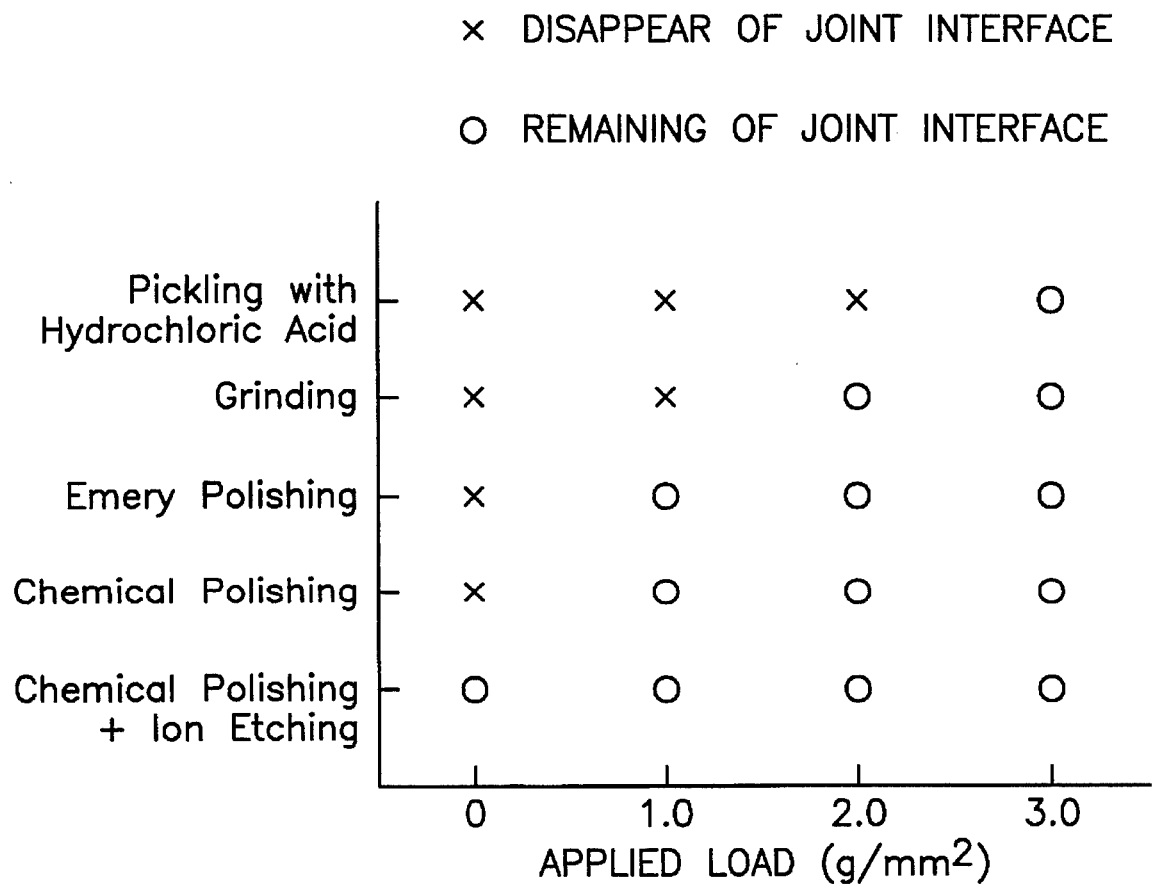
FIG. 2 is a graph showing influences of surface polished state of a joined body and an applied load upon disappearance of crystal grain boundary at joint face.
Figure 3A:
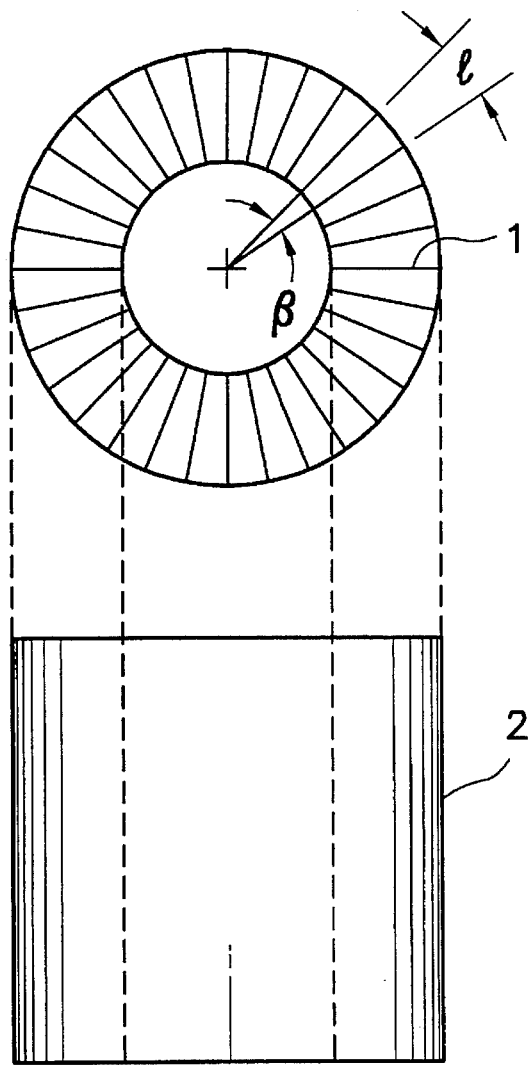
FIGS. 3a, b and c are schematic views showing a placing state of a seed material onto a helical edge face of a coil according to the invention, respectively.
Figure 3B:
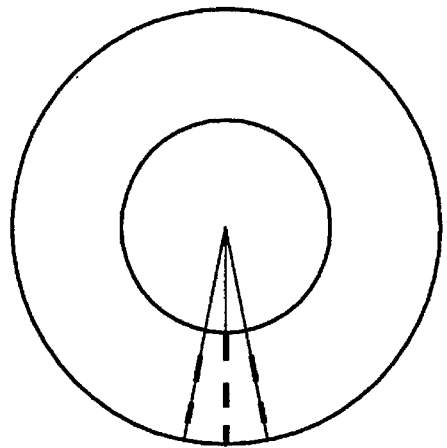
Figure 3C:
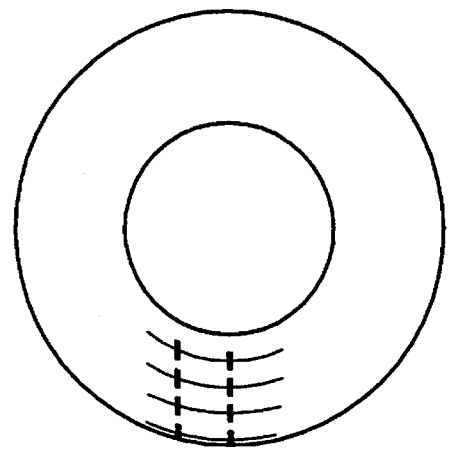
Figure 4:
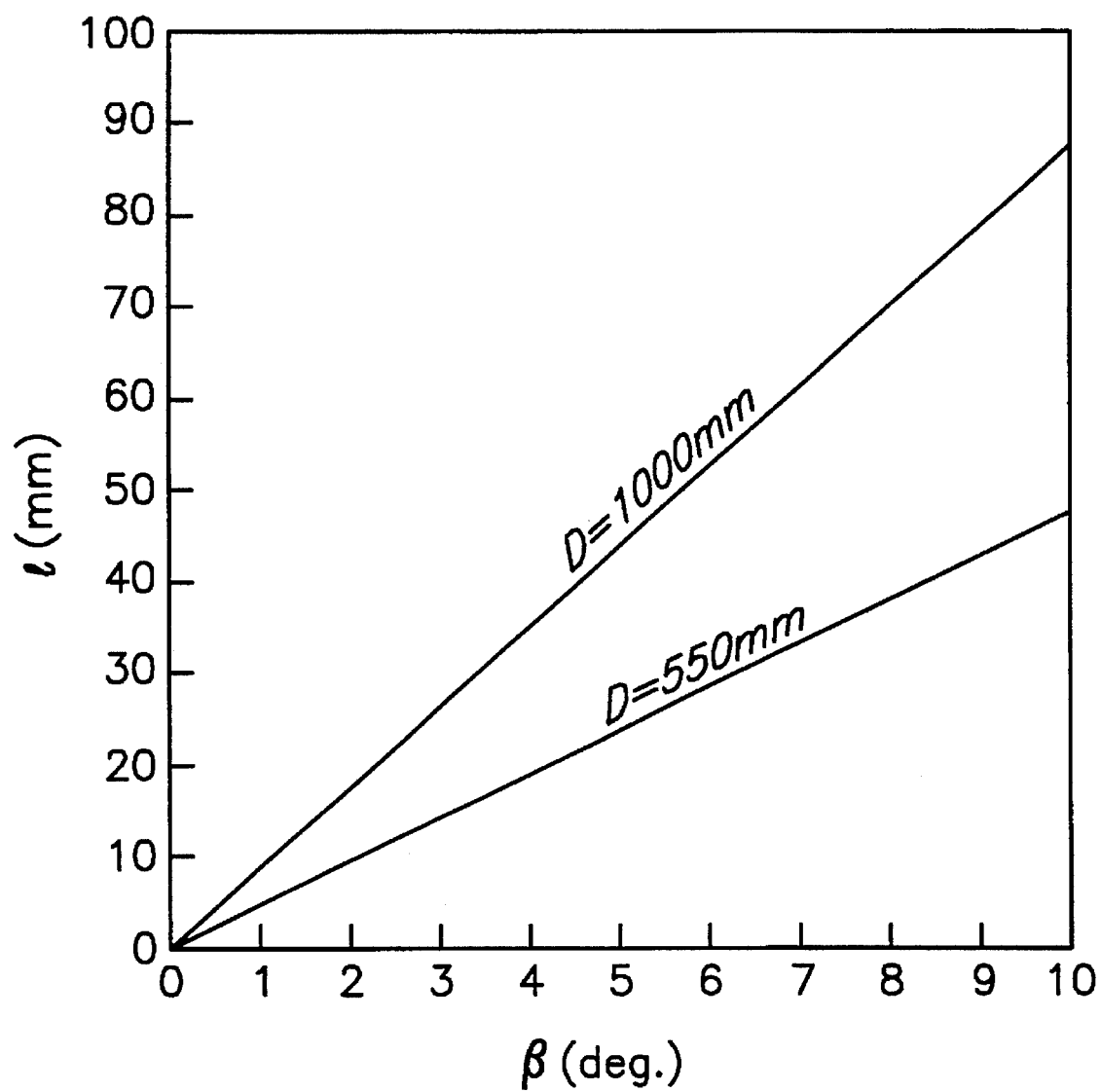
FIG. 4 is a graph showing a relationship between planting distance of seed material and shifting of orientation from rolling face using a coil diameter as a parameter.

A block of Ag having a purity of 99.99% was divided into two parts A, B. The part A was annealed at 800° C. under vacuum ($10^{-6}$ Torr) for 24 hours to make recrystallized grains coarse. From these coarse grains were cut out single crystal plates of 1 mm thickness and 10 mm☐ by electric arc method so as to render the orientation of plate face into (100), (110), (111) as seed plates C, D, E.

On the other hand, the part B was rolled to obtain a sheet of 1 mm in thickness, which was annealed at 300° C. under vacuum ($10^{-6}$ Torr) for 30 minutes and 3% strain was introduced thereinto under tension to render into a high energy state as compared with the seed plates, and then three sheets 10 mm☐ were cut out therefrom as treating sheets $B_1$, $B_2$, $B_3$.

Then, the plate faces of $B_1$, $B_2$, $B_3$, C, D, E were finished into a mirror state of Ra≦0.01 μm by Emery polishing, buff polishing or float polishing. After the polished face was activated by argon ion bombardment under vacuum ($10^{-10}$ Torr), the polished face of each of C, D, E was contacted edgewise with and joined to the polished face of each of $B_1$, $B_2$, $B_3$ under vacuum, which was heated at 350° C. for 100 hours.

In each of the thus obtained joined bodies, no border or grain boundary was observed at the joint face as measured from the sectional structure at the joint interface, and also each of the joined $B_1$, $B_2$, $B_3$ was confirmed to be a crystal body having the same orientation as in each of C, D, E from the measured results of crystalline orientation.

Example 2

From a block-like coarse grain comprising 3% of Si and the balance being Fe and inevitable impurities were cut out three single crystal plates of 0.5 mm thickness and 10 mm☐ by electric arc method so as to render the plate face into (100), (110), (111) as seed plates B, C, D.

On the other hand, a steel ingot comprising C: 0.002%, Mn: 0.001%, S: 0.002%, P: 0.001%, O: 0.001% and the balance being Fe and inevitable impurities was hot rolled to obtain a hot rolled sheet of 2 mm in thickness, which was cold rolled in a direction perpendicular to the hot rolling direction to obtain a cold rolled sheet of 0.5 mm in thickness. This sheet was annealed at 820° C. in dry Ar for 10 minutes and 3% strain was introduced thereinto under tension to render into a high energy state as compared with the seed plates, from which three sheets of 10 mm☐ were cut out as treating sheets $A_1$, $A_2$, $A_3$.

Then, each plate face of $A_1$, $A_2$, $A_3$, B, C, D was finished into a mirror surface of Ra≦0.2 μm by Emery polishing. After Sn film of 1 μm in thickness was plated onto the polished face, the plated face of each of B, C, D was closely joined to the plated face of each of $A_1$, $A_2$, $A_3$, which was heated at 850° C. in dry Ar atmosphere for 24 hours while applying a compressive stress of 10 g/mm² to the joint face.

In each of the thus obtained joined bodies, no border or grain boundary was observed at the joint face as measured from the sectional structure at the joint interface, and also each of the joined $A_1$, $A_2$, $A_3$ was confirmed to be a crystal body having the same orientation as in each of B, C, D from the measured results of crystalline orientation.

Example 3

From a block-like coarse grain comprising 3% of Si and the balance being Fe and inevitable impurities were cut out three single crystal plates of 1 mm thickness and 10 mm□ by electric arc method so as to render the plate face into (100), (110), (111) as seed plates B, C, D.

On the other hand, a steel ingot comprising Al: 2.5% and the balance being Fe and inevitable impurities was hot rolled to obtain a hot rolled sheet of 1 mm in thickness, which was annealed at 900° C. in dry Ar for 30 minutes and 2.5% tensile strain was introduced thereinto to render into a high energy state as compared with the seed material, from which three sheets of 10 mm□ were cut out as treating sheets $A_1$, $A_2$, $A_3$.

Then, each thickness face at section perpendicular to plate face of $A_1$, $A_2$, $A_3$ in the rolling direction, B, C in [001] orientation, D in [112] orientation was finished into a mirror surface of Ra≦0.2 μm by Emery polishing. After Sn film of 1.5 μm in thickness was plated onto the polished face, the plated face of each of B, C, D was closely joined to the plated face of each of $A_1$, $A_2$, $A_3$, which was heated by feeding into a temperature tilting furnace having a temperature gradient of 125° C./cm from 1150° C. to 850° C. at feeding rate of 10 mm/h while holding the joined $A_1$, $A_2$, $A_3$ at a low temperature side and the joined B, C, D at a high temperature side.

In each of the thus obtained joined bodies, no border or grain boundary was observed at the joint face as measured from the plate face structure at the joint interface, and also each of the joined $A_1$, $A_2$, $A_3$ was confirmed to be a crystal body having the same orientation as in each of B, C, D from the measured results of crystalline orientation.

Example 4

An ingot of silicon steel containing C: 0.037%, S: 3.00%, sol Al: 0.028%, N: 0.0085%, S: 0.031% was hot rolled to obtain a hot rolled sheet of 3 mm in thickness, which was first cold rolled at a reduction of 30% and then annealed at 1100° C. in $H_2$ for 5 minutes. Next, the sheet was cold rolled at a reduction of 85.7% to a final thickness of 0.3 mm, heated from 200° C. to 700° C. at a temperature rising rate of 20° C./h and subjected to decarburization annealing at 800° C. in a wet hydrogen for 5 minutes, from which a piece of 150 w×300 l mm containing a large amount of primary recrystallized grain boundary was cut out as a treating sheet at high energy state A.

On the other hand, a plate-like single crystal comprising 3.5% of Si and the balance being Fe and inevitable impurities in which (110) face was coincident with plate face was used as a seed plate B.

Then, section of A perpendicular to both rolling direction and rolling face as well as (001) face of B perpendicular to plate face were finished into a mirror surface of Ra≦0.2 μm by Emery polishing. After Sn film of 1.0 μm in thickness was plated onto the polished surface, a solution of $SnCl_2$+ethanol was applied to the plated surface and heated to 350° C. at both surfaces and then the plated surfaces of A, B were contacted with each other and the plated surface of B was closely joined to the plated surface of A while applying a supersonic wave to the joint face and a compressive stress of 5 g/mm² thereto, which was heated by feeding into a temperature tilting furnace having a temperature gradient of 10° C./cm from 1200° C. to 950° C. in $N_2$ atmosphere at a feeding rate of 10 mm/h while holding A at low temperature side and B at high temperature side.

In each of the thus obtained joined bodies, no grain boundary was observed at A, B and the joint face as measured from the crystal structure of plate face at the joint interface, and also the joined A and B were confirmed to form the same crystal body from the measured results of crystalline orientation.

Moreover, when the same three steel sheets as in A before the treatment were subjected to the same tilting annealing without joining according to the invention, $B_{10}$ values of the resulting steel sheets were as low as 1.70, 1.85, 1.95(T), respectively, and also the scattering was large, while $B_{10}$ value of the joined body obtained according to the invention was as high as 2.00(T).

Example 5

An ingot of silicon steel containing C: 0.035%, Si: 3.00%, Se: 0.020% was hot rolled to obtain a hot rolled sheet of 2.5 mm in thickness. After a sheet of 0.4 mm in thickness was finished by cold rolling, it was annealed at 950° C. in dry $N_2$ for 10 minutes. Thereafter, a sheet of 0.3 mm in thickness was finished by cold rolling and decarburized at 820° C. in a wet hydrogen for 5 minutes and 2.75% strain was introduced thereinto under tension, from which a piece of 300 l×1000 W mm was cut out as a treating sheet at high energy state A.

On the other hand, a plate-like single crystal comprising 3.5% of Si and the balance being Fe and inevitable impurities in which (110) face was coincident with plate face was used as a seed plate B.

Then, section of A parallel to the rolling direction and perpendicular to the rolling face as well as (110) face of B perpendicular to plate face were finished into a mirror surface of Ra≦0.2 μm by Emery polishing. After Sn film of 1.0 μm in thickness was plated onto the polished surface, a solution of $SnCl_2$+ ethanol was applied to the plated surface and the plated faces of A, B were closely joined by rubbing while heating to 350° C. and applying a supersonic wave. While the steel sheet was curved by giving a curvature of D=750 mm in 1 direction, the joined body was heated by feeding into a temperature tilting furnace having a temperature gradient of 20° C./cm from 1150° C. to 850° C. in $N_2$ atmosphere at a feeding rate of 10 mm/h while applying a compressive stress of 15 g/mm² to the joint face and holding A at low temperature side and B at high temperature side.

In each of the thus obtained joined bodies, no grain boundary was observed at A, B and the joint face as measured from the crystal structure of plate face at the joint interface, and also the joined A and B were confirmed to form the same crystal body from the measured results of crystalline orientation.

In five samples obtained by applying MgO as a separator to the crystal body and annealing at 1200° C. in $H_2$ for 5 hours, the $B_{10}$ value was 1.99~2.02 (T) and the $W_{17/50}$ value was 0.85~0.95 (W/kg), and their average magnetic properties were $B_{10}$: 2.01 (T), $W_{17/50}$: 0.90 (W/kg).

Example 6

From a block-like coarse grain comprising 2% of Si and the balance being Fe and inevitable impurities were cut out three single crystal plates of 0.5 mm thickness and 10 mm×30 mm by electric arc method so as to render the plate face into (100), (110), (111) as seed plates B, C, D.

On the other hand, a steel ingot comprising C: 0.022%, Si: 0.37%, Mn: 0.43%, P: 0.019%, S: 0.011%, Cu: 0.11%, Ni: 0.20%, Cr: 17.50%, Al: 0.005%, N: 0.025% and the balance being Fe and inevitable impurities was hot rolled to obtain a hot rolled sheet of 2 mm in thickness, which was subjected to a combination of cold rollings in the hot rolling direction and a direction perpendicular thereto to obtain a cold rolled sheet of 0.5 mm in thickness. Then, the sheet was annealed at 1000° C. in $N_2$ for 3 hours and 2.5% strain was introduced thereinto under tension to render into a high energy state as compared with the seed plates, from which three sheets of 20 mm×30 mm were cut out as treating sheets $A_1, A_2, A_3$.

Then, each plate face of $A_1, A_2, A_3$, B, C, D was finished into a mirror surface of Ra≦0.2 μm by Emery polishing and chemical polishing. After an alloy film of Sn and Pb of 1.5 μm in thickness was coated onto the polished face by vacuum deposition, the coated face of each of B, C, D was closely joined to the coated face of each of $A_1, A_2, A_3$, which was heated at 1200° C. in Ar atmosphere for 100 hours while applying a compressive stress of 5 g/mm² to the joint face.

In each of the thus obtained joined bodies, no border or grain boundary was observed at the joint face as measured from the sectional structure at the joint interface, and also each of the joined $A_1, A_2, A_3$ was confirmed to be a crystal body having the same orientation as in each of B, C, D from the measured results of crystalline orientation.

Example 7

From a coarse single crystal grain obtained by introducing strain into Mo block having a purity of 99.9% and annealing were cut out three single crystal plates of 0.5 mm thickness and 10 mm×30 mm by electric arc method so as to render the plate face into (100), (110), (111) as seed plates B, C, D.

On the other hand, an ingot comprising Ca: 0.0025% and the balance being Mo and inevitable impurities was hot rolled to obtain a hot rolled sheet of 2 mm in thickness, which was subjected to a combination of cold rollings in the hot rolling direction and the direction perpendicular thereto to obtain a cold rolled sheet of 0.5 mm in thickness, from which three square sheets of 20 mm×30 mm were cut out as treating sheets $A_1, A_2, A_3$.

Then, each plate face of $A_1, A_2, A_3$, B, C, D was finished into a mirror surface of Ra≦0.2 μm by Emery polishing. After Fe film of 2 μm in thickness was plated onto the polished face, the plated face of each of B, C, D was closely joined to the plated face of each of $A_1, A_2, A_3$, which was heated at 1200° C. in Ar atmosphere for 1 hour while applying a compressire stress of 5 g/mm² to the joint face and annealed at 1250° C. in Ar atmosphere for 50 hours after the releasing of compressive stress.

In each of the thus obtained joined bodies, no border or grain boundary was observed at the joint face as measured from the plate face structure at the joint interface, and also each of the joined $A_1, A_2, A_3$ was confirmed to be a crystal body having the same orientation as in each of B, C, D from the measured results of crystalline orientation.

Example 8

From a block-like coarse single crystal grain comprising 23% of Fe and the balance being Ni and inevitable impurities were cut out three single crystal plates of 0.5 mm thickness and 10 mm×30 mm by electric arc method so as to render the plate face into (100), (110), (111) as seed plates B, C, D.

On the other hand, a steel ingot comprising Fe: 22.9% and the balance being Ni and inevitable impurities was hot rolled to obtain a flat sheet of 13 mm in thickness. After the thickness was reduced to 9 mm by cold rolling, the sheet was annealed at 800° C. for 10 minutes and subjected to a combination of cold rollings in the hot rolling direction and the direction perpendicular thereto to obtain a cold rolled sheet of 0.5 mm in thickness, from which three square sheets of 20 mm×30 mm were cut out as treating sheets $A_1, A_2, A_3$.

Then, each plate face of $A_1, A_2, A_3$, B, C, D was finished into a mirror surface of Ra≦0.2 μm by Emery polishing. After Sn film of 1 μm in thickness was coated onto the polished face by vacuum deposition, the coated face of each of B, C, D was closely joined to the coated face of each of $A_1, A_2, A_3$, which was annealed at 1050° C. in Ar atmosphere for 24 hours while applying a compressive stress of 10 g/mm² to the joint face.

In each of the thus obtained joined bodies, no border or grain boundary was observed at the joint face as measured from the plate face structure at the joint interface, and also each of the joined $A_1, A_2, A_3$ was confirmed to be a crystal body having the same orientation as in each of B, C, D from the measured results of crystalline orientation.

Example 9

From a coarse single crystal grain obtained by introducing strain into Cu block having a purity of 99.9% and annealing were cut out three single crystal plates of 0.3 mm thickness and 10 mm×30 mm by electric arc method so as to render the plate face into (100), (110), (111) as seed plates B, C, D.

On the other hand, a square sheet of 30 mm thickness and 40 mm×50 mm was cut out from a commercially available pure copper (containing O: 0.0009%, P: 0.0003%, S: 0.001% as an impurity), which was finished to a cold rolled sheet of 0.3 mm in thickness while rotating the cold rolling direction by 90° every pass, from which three square sheets of 20 mm ×30 mm were cut out as treating sheets $A_1, A_2, A_3$.

Then, each plate face of $A_1, A_2, A_3$, B, C, D was finished into a mirror surface of Ra≦0.2 μm by Emery polishing. After an alloy film of Sn-Bi of 1 μm in thickness was coated onto the polished face by vacuum deposition, the coated face of each of B, C, D was closely joined to the coated face of each of $A_1, A_2, A_3$, which was annealed at 1000° C. under vacuum of $10^{-2}$ Torr for 24 hour while applying a compressive stress of 2 g/mm² to the joint face.

In each of the thus obtained joined bodies, no border or grain boundary was observed at the joint face as measured from the plate face structure at the joint interface, and also each of the joined $A_1, A_2, A_3$ was confirmed to be a crystal body having the same orientation as in each of B, C, D from the measured results of crystalline orientation.

Example 10

From a coarse single crystal grain obtained by introducing strain into Al block having a purity of 99.9% and annealing were cut out three single crystal plates of 0.3 mm thickness and 10 mm×30 mm by electric arc method so as to render the plate face into (100), (110), (111) as seed plates B, C, D.

On the other hand, a square sheet of 30 mm thickness and 40 mm×50 mm was cut out from a commercially available pure Al (containing Fe: 0.003%, Si: 0.004% as an impurity), which was finished to a cold rolled sheet of 0.3 mm in thickness while rotating the cold rolling direction by 90° every pass, from which three square sheets of 20 mm×30 mm were cut out as treating sheets $A_1$, $A_2$, $A_3$.

Then, each plate face of $A_1$, $A_2$, $A_3$, B, C, D was finished into a mirror surface of Ra≦0.2 μm by Emery polishing. After an alloy film of Al-Si of 2 μm in thickness was coated onto the polished face by vacuum deposition, the coated face of each of B, C, D was closely joined to the coated face of each of $A_1$, $A_2$, $A_3$, which was heated at 600° C. in $N_2$ while applying a compressive stress of 10 g/mm² to the joint face and applying a supersonic wave and annealed at 625° C. under vacuum of $10^{-2}$ Torr for 24 hours while applying a compressive stress of 2 g/mm² to the joint face.

In each of the thus obtained joined bodies, no border or grain boundary was observed at the joint face as measured from the plate face structure at the joint interface, and also each of the joined $A_1$, $A_2$, $A_3$ was confirmed to be a crystal body having the same orientation as in each of B, C, D from the measured results of crystalline orientation.

As a result of the examination on the crystal structure of each of the thus obtained joined bodies, all of A3, A4, B3, B4 were coarse polycrystal bodies, while each of A1, A2, B1, B2 was single crystal body and had no grain boundary even at the joint face, and also it has been confirmed from the measured results of crystalline orientation that each of the specimens A1, A2, B1, B2 forms a crystal body having the same orientation as in the seed plate C.

Furthermore, $B_{10}$ values of A1, A2, A3, A4 were 1.99, 1.97, 1.68, 1.55 (T), respectively, and $B_{10}$ values of B1, B2, B3, B4 were 2.00, 1.98, 1.70, 1.62 (T), respectively. Thus, even if the oxygen amount in the raw material is large or small, the $B_{10}$ value is largely improved by joining a secondary recrystallized seed material.

After the application of MgO as a separator, A1, A2, B1, B2, were subjected to a purification annealing at 1200° C. in $H_2$ for 5 hours and a tension coating was applied thereto, and then the magnetic properties were measured to obtain results as shown in the following Table 3.

TABLE 3

|    | $B_{10}$ (T) | $W_{17/50}$ (W/kg) |
|----|--------------|---------------------|
| A1 | 2.00         | 0.83                |
| A2 | 1.98         | 0.88                |
| B1 | 2.01         | 0.80                |
| B2 | 1.99         | 0.83                |

Example 11

An ingot of silicon steel comprising C: 0.042%, Si: 3.25%, Mn: 0.060%, S: 0.002%, Se: 0.019%, O: 0.005% and the balance being Fe and inevitable impurities was heated to 1350° C. and hot rolled to obtain a hot rolled sheet of 2.5 mm in thickness. Then, the sheet was subjected to a first cold rolling to an intermediate thickness of 0.4 mm and a second cold rolling to a thickness of 0.3 mm through an intermediate annealing at 950° C. in dry $N_2$ for 10 minutes. Thereafter, the sheet was subjected to decarburization and primary recrystallization annealing at 820° C. in a wet hydrogen for 5 minutes and 2.75% strain was introduced into the steel sheet under tension, from which four specimens of l=300 mm, W=160 mm were cut out as A1, A2, A3, A4.

On the other hand, an ingot of silicon steel having the same composition except O: 0.0015% was treated in the same manner as in A to obtain specimens B1, B2, B3, B4.

Furthermore, a plate-like single crystal comprising 3.5% of Si, and the balance being Fe and inevitable impurities and having α=0° and β=2° was used as a seed plate C.

Each plate face of A1~A4, B1~B4 and C was finished into a mirror surface by chemical polishing and subjected to an argon sputtering under a superhigh vacuum ($10^{-10}$ Torr). Thereafter, each of A1, A2, B1, B2 was closely joined with C so that the sputtered faces were piled only at a width of 5 mm in a direction perpendicular to the rolling direction so as to coincide the rolling direction with <001> axis of C, which was fed into a temperature tilting furnace having a temperature gradient of 10° C./cm between 1150°~850° C. at a feeding rate of 10 mm/h while holding A1, A2, B1, B2 at low temperature side and C at high temperature side and applying a compressive load of 10 g/mm² to the joint face, and also each of A3, A4, B3, B4 was fed into the same furnace without joining to C while holding the end face perpendicular to the rolling direction at high temperature side, during which the heating was conducted under a superhigh vacuum.

Example 12

An ingot of silicon steel comprising C: 0.042%, Si: 3.25%, Mn: 0.060%, S: 0.002%, Se: 0.019%, O: 0.005% and the balance being Fe and inevitable impurities was heated to 1350° C. and hot rolled to obtain a hot rolled sheet of 2.5 mm in thickness. Then, the sheet was subjected to a first cold rolling to an intermediate thickness of 0.4 mm and a second cold rolling to a thickness of 0.3 mm through an intermediate annealing at 950° C. in dry $N_2$ for 10 minutes. Thereafter, the sheet was subjected to decarburization and primary recrystallization annealing at 820° C. in a wet hydrogen for 5 minutes and 2.75% strain was introduced into the steel sheet under tension, from which four specimens of l=300 mm, W=160 mm were cut out as A1, A2, A3, A4.

On the other hand, an ingot of silicon steel having the same composition except O: 0.0015% was treated in the same manner as in A to obtain specimens B1, B2, B3, B4.

Furthermore, a plate-like single crystal comprising 3.5% of Si and the balance being Fe and inevitable impurities and having α=0° and β=2° was used as a seed plate C.

Each sectional face of A1~A4, B1~B4 parallel to the rolling direction and perpendicular to the rolling face and (110) face of C perpendicular to plate face were finished into a mirror surface of Ra<0.2 μm by Emery polishing. After Sn film of 1.0 μm was plated on each of the polished surfaces, each plated surface of A1, A2, B1, B2 was closely joined with the plated surface of C. Then, these joined bodies as well as non-joined bodies were heated by feeding into a temperature tilting furnace having a temperature gradient of 10° C./cm between 1150°~850° C. at a feeding rate of 10 mm/h while applying a compressive load of 15 g/mm² to the joint face and holding A1, A2, B1, B2 at low temperature side and C at high temperature side and holding the plated surfaces of A3, A4, B3, B4 not joining with C at high temperature side.

As a result of the examination on the crystal structure of each of the thus obtained joined bodies, all of A3, A4, B3, B4 were coarse polycrystal bodies, while each of A1, A2, B1, B2 was a single crystal body and had no grain boundary even at the joint face, and also it has been confirmed from the measured results of crystalline orientation that each of the joining materials A1, A2, B1, B2 forms a crystal body having the same orientation as in the seed plate C.

Furthermore, $B_{10}$ values of A1, A2, A3, A4 were 1.95, 1.99, 1.70, 1.62 (T), respectively, and $B_{10}$ values of B1, B2, B3, B4 were 1.99, 1.97, 1.75, 1.85 (T), respectively. Thus, even if the oxygen amount in the raw material is large or small, the $B_{10}$ value is largely improved by joining a secondary recrystallized seed material.

After the application of MgO as a separator, A1, A2, B1, B2, were subjected to a purification annealing at 1200° C. in $H_2$ for 5 hours, and then the magnetic properties were measured to obtain results as shown in the following Table 4.

TABLE 4

|    | $B_{10}$ (T) | $W_{17/50}$ (W/kg) |
|----|--------------|--------------------|
| A1 | 1.97         | 0.90               |
| A2 | 2.00         | 0.85               |
| B1 | 2.00         | 0.82               |
| B2 | 1.98         | 0.85               |

Example 13

An ingot of silicon steel comprising C: 0.060%, Si: 3.25%, Mn: 0.060%, S: 0.022%, sol Al: 0.015%, N: 0.0085% and the balance being Fe and inevitable impurities was heated to 1250° C. and hot rolled to obtain a hot rolled sheet of 1.9 mm in thickness. Then, the sheet was annealed at 1120° C. for 2 minutes, finished to a thickness of 0.20 mm by cold rolling and subjected to decarburization and primary recrystallization annealing at 820° C. in a wet hydrogen for 5 minutes, from which four specimens of l=300 mm, W=160 mm were cut out as A1, A2, A3, A4.

On the other hand, an ingot of silicon steel having the same composition except Al: 0.050% was treated in the same manner as in A to obtain specimens B1, B2, B3, B4.

Furthermore, a plate-like single crystal comprising 3.0% of Si and the balance being Fe and inevitable impurities and having α=0° and β=2.5° was used as a seed plate C.

Each plate face of A1~A4, B1~B4 and C was finished into a mirror surface by chemical polishing and subjected at the mirror surface to an argon sputtering under superhigh vacuum ($10^{-10}$ Torr). Thereafter, each of A1~A4, B1~B4 was closely joined with C so that the sputtered faces were piled only at a width of 5 mm in a direction perpendicular to the rolling direction so as to coincide the rolling direction with <001> axis of C, which was heated under the following conditions while applying a compressire load of 10 g/mm² to the joint face. Each of A1, A2, B1, B2 was annealed in a uniform furnace of $N_2$ atmosphere at 990° C. for 24 hours. On the other hand, each of A3, A4, B3, B4 was heated by feeding into a temperature tilting furnace having a temperature gradient of 5° C./cm between 1150°~850° C. at a feeding rate of 10 mm/h while holding A3, A4, B3, B4 at low temperature side and C at high temperature side.

As a result of the examination on the crystal structure of each of the thus obtained joined bodies, each of A1, A2, B1, B2 partly contained a coarse polycrystal body, while each of A3, A4, B3, B4 was a single crystal body. Furthermore, no grain boundary was observed at the joint face in all of A1~A4, B1~B4, and also it has been confirmed from the measured results of crystalline orientation that they form a crystal body having the same orientation as in the seed plate C around the joint face.

After the application of MgO as a separator, A1~A4, B1~B4 were subjected to a purification annealing at 1200° C. in $H_2$ for 20 hours, and then the magnetic properties were measured to obtain results as shown in the following Table 5.

TABLE 5

|    | $B_{10}$ (T) | $W_{17/50}$ (W/kg) |    | $B_{10}$ (T) | $W_{17/50}$ (W/kg) |
|----|--------------|--------------------|----|--------------|--------------------|
| A1 | 2.00         | 0.80               | B1 | 1.98         | 0.86               |
| A2 | 1.98         | 0.85               | B2 | 1.99         | 0.85               |
| A3 | 1.99         | 0.83               | B3 | 1.97         | 0.87               |
| A4 | 1.97         | 0.88               | B4 | 1.95         | 0.89               |

Thus, even if the Al amount in the raw material is small or large, or even if the secondary recrystallization annealing is carried out in the temperature tilting furnace or the temperature uniform furnace, the very high $B_{10}$ value and the low iron loss value are obtained.

Example 14

An ingot of silicon steel comprising C: 0.060%, Si: 3.25%, Mn: 0.060%, S: 0.022%, sol Al: 0.015%, N: 0.0085% and the balance being Fe and inevitable impurities was heated to 1250° C. and hot rolled to obtain a hot rolled sheet of 1.9 mm in thickness. Then, the sheet was annealed at 1120° C. for 2 minutes, finished to a thickness of 0.20 mm by cold rolling and subjected to decarburization and primary recrystallization annealing at 820° C. in a wet hydrogen for 5 minutes, from which four specimens of l=300 mm, W=160 mm were cut out as A1, A2, A3, A4.

On the other hand, an ingot of silicon steel having the same composition except Al: 0.050% was treated in the same manner as in A to obtain specimens B1, B2, B3, B4.

Furthermore, a plate-like single crystal comprising 3.0% of Si and the balance being Fe and inevitable impurities and having α=0° and β=2.5° was used as a seed plate C.

Each sectional face of A1~A4, B1~B4 parallel to the rolling direction and perpendicular to the rolling face as well as (110) face of C perpendicular to plate face were finished into a mirror surface of Ra<0.2 μm by Emery polishing. After Sn film of 1.0 μm was plated onto each polished surface, each plated surface of A1~A4, B1~B4 was closely joined with the plated surface of C, which was heated under the following conditions while applying a compressive load of 10 g/mm² to the joint face. Each of A1, A2, B1, B2 was annealed in a uniform furnace of $N_2$ atmosphere at 990° C. for 24 hours. On the other hand, each of A3, A4, B3, B4 was heated by feeding into a temperature tilting furnace having a temperature gradient of 5° C./cm between 1150°~850° C. at a feeding rate of 10 mm/h while holding A3, A4, B3, B4 at low temperature side and C at high temperature side.

As a result of the examination on the crystal structure of each of the thus obtained joined bodies, each of A1, A2, B1, B2 partly contained a coarse polycrystal body, while each of A3, A4, B3, B4 was a single crystal body. Furthermore, no grain boundary was observed at the joint face in all of A1~A4, B1~B4, and also it has been confirmed from the measured results of crystalline orientation that they form a crystal body having the same orientation as in the seed plate C around the joint face.

After the application of MgO as a separator, A1~A4, B1~B4 were subjected to a purification annealing at 1200° C. in $H_2$ for 20 hours, and then the magnetic properties were measured to obtain results as shown in the following Table 6.

TABLE 6

| | $B_{10}$ (T) | $W_{17/50}$ (W/kg) | | $B_{10}$ (T) | $W_{17/50}$ (W/kg) |
|---|---|---|---|---|---|
| A1 | 1.99 | 0.82 | B1 | 1.98 | 0.85 |
| A2 | 1.97 | 0.88 | B2 | 1.96 | 0.89 |
| A3 | 1.98 | 0.83 | B3 | 2.00 | 0.82 |
| A4 | 2.02 | 0.80 | B4 | 2.01 | 0.80 |

Thus, even if the Al amount in the raw material is small or large, or even if the secondary recrystallization annealing is carried out in the temperature tilting furnace or the temperature uniform furnace, the very high $B_{10}$ value is obtained.

Example 15

An ingot of silicon steel comprising C: 0.085%, Si: 3.00%, Mn: 0.080%, S: 0.015%, sol Al: 0.030%, N: 0.0085% and the balance being Fe and inevitable impurities was heated to 1350° C. and immediately hot rolled to a thickness of 0.35 mm. Then, two sheets having a length: 150 mm and a width: 50 mm were cut out and decarburized at 750° C. in a wet hydrogen for 3 hours as A1, A2.

On the other hand, two single crystal plates comprising 3.0% of Si and the balance being Fe and inevitable impurities and having a thickness: 0.35 mm, a length: 150 mm, a width: 5 µm, α=0° and β=2° were provided as B1, B2.

Then, one-side end portion of the rolling face of A at a width of 5 mm in longitudinal direction and one-side full rolling face of B were finished into a mirror surface of Ra<0.1 µm by Emery polishing and chemical polishing, ion sputtering. Thereafter, the mirrored surfaces of A1 and B1 were closed with each other, which were heated from 1000° C. to 1200° C. at a temperature rising rate of 5° C./h under vacuum of $10^{-6}$ Torr. On the other hand, Sn of 1 µm in thickness as an insert member was deposited onto the mirrored surfaces of A2 and B2, which was heated at a surface closed state in $N_2$ having a dew point of −50° C. in the same manner as in A1, B1. After MgO was applied as a separator, it was subjected to a purification annealing at 1200° C. in $H_2$ for 20 hours and further a tension coating was applied, and thereafter the magnetic properties of A were measured to obtain results as shown in Table 7.

TABLE 7

| | $B_{10}$ (T) | | $W_{17/50}$ (W/kg) | |
|---|---|---|---|---|
| Presence or absence of insert member | presence | absence | presence | absence |
| Magnetization in the same direction as in hot rolling | 2.01 | 1.99 | 0.95 | 0.97 |

Example 16

An ingot of silicon steel having the same composition as in Example 1 was heated to 1350° C. and hot rolled to a thickness of 0.35 mm. Then, two square specimens having a length: 200 mm and a width: 50 mm were cut out therefrom, which were annealed at 1050° C. in dry $H_2$ for 3 minutes and decarburized at 750° C. in a wet hydrogen for 1 hour to obtain A3, A4.

On the other hand, two single crystal plates comprising 3.0% of Si and the balance being Fe and inevitable impurities and having a thickness: 0.35 mm, a length: 200 mm, a width: 5 µm, α=0° and β=2° were provided as B3, B4.

Then, one-side end portion of the rolling face of A at a width of 5 mm in longitudinal direction and one-side full rolling face of B were finished into a mirror surface of Ra<0.1 µm by Emery polishing and chemical polishing, ion sputtering. After Sn of 0.5 µm in thickness was formed onto the mirrored surfaces of A4, B4 by ion coating the mirrored surfaces of A3 and B3 as well as the coated surfaces of A4 and B4 were closed with each other and a compressive load: 7 g/mm² was applied to the joint face, which were heated under vacuum of $10^{-6}$ Torr in case of A3, B3 not coated with Sn or in $N_2$ having a dew point of −10° C. in case of A4, B4 coated with Sn by feeding into a temperature tilting furnace having a temperature gradient of 5° C./cm between 1150° C.~900° C. at a feeding rate of 10 mm/h while holding A at low temperature side and B at high temperature side.

After MgO was applied as a separator, it was subjected to a purification annealing at 1200° C. in $H_2$ for 20 hours and further a tension coating was applied, and thereafter the magnetic properties were measured to obtain results as shown in Table 8.

TABLE 8

| | $B_{10}$ (T) | | $W_{17/50}$ (W/kg) | |
|---|---|---|---|---|
| Presence or absence of insert member | presence | absence | presence | absence |
| Magnetization in the same direction as in hot rolling | 2.03 | 1.99 | 0.91 | 0.94 |

Example 17

An ingot of silicon steel comprising C: 0.175%, Si: 3.01%, Mn: 0.075%, Al: 0.035%, N: 0.0111%, S: 0.011%, Se: 0.007%, Te: 0.005%, Sb: 0.007% and the balance being Fe and inevitable impurities was heated at 1350° C. for 1 hour and hot rolled to a thickness of 1.9 mm. Then, the sheet was cold rolled to a thickness of 0.23 mm, from which two square specimens having a length: 150 mm and a width: 50 mm were cut out and heated at a temperature rising rate of 20° C./h between 200° C.~700° C. and subjected to decarburization annealing at 750° C. in a wet hydrogen for 3 hours to obtain a raw material A.

Thereafter, the same procedure as in Example 15 was repeated to obtain results as shown in Table 9.

TABLE 9

| Insert member | $B_{10}$ (T) | $W_{17/50}$ (W/kg) |
|---|---|---|
| presence | 2.02 | 0.67 |
| absence | 2.01 | 0.68 |

Example 18

An ingot of silicon steel comprising C: 0.049%, Si: 3.35%, Mn: 0.075%, S: 0.018%, Al: 0.032%, N: 0.0085% and the balance being Fe and inevitable impurities was heated to 1350° C. and hot rolled to a thickness of 1.15 mm.

Then, the sheet was subjected to decarburization annealing at 725° C. in wet $H_2$ for 3 hours and then cold rolled to a thickness of 0.20 mm, from which four square specimens having a length: 150 mm and a width: 50 mm were cut out. Among these specimens, two specimens were subjected to primary recrystallization annealing at 850° C. for 5 minutes as A1, A2 and the remaining specimens were not subjected thereto as A3, A4.

On the other hand, four single crystal plates comprising 3.0% of Si and the balance being Fe and inevitable impurities and having a thickness: 0.23 mm, a length: 150 mm, a width: 5 mm, $\alpha=0°$ and $\beta=2°$ were provided as B1, B2, B3, B4.

The same procedure as in Example 16 was repeated to obtain results as shown in Table 10.

TABLE 10

| Primary recrystalliza-tion annealing | Insert member | $B_{10}$ (T) | $W_{17/50}$ (W/kg) |
|---|---|---|---|
| presence | presence | 2.015 | 0.72 |
|  | absence | 2.010 | 0.74 |
| absence | presence | 2.010 | 0.73 |
|  | absence | 2.007 | 0.75 |

Example 19

An ingot of silicon steel comprising C: 0.023%, Si: 3.0%, Mn: 0.040%, Se: 0.011%, Al: 0.051%, N: 0.0105% and the balance being Fe and inevitable impurities was heated to 1225° C. and immediately hot rolled to a thickness of 0.23 mm. Then, two square sheets having a length: 200 mm and a width: 50 mm were cut out therefrom and subjected to decarburization annealing at 850° C. in a wet hydrogen for 5 minutes as A3, A4.

On the other hand, two single crystal plates having the same composition as in the above hot rolled sheet, a thickness: 0.23 mm, a length: 2.00 mm, a width: 5 mm, $\alpha=0°$ and $\beta=2°$ were provided as B3, B4.

The same procedure as in Example 16 was repeated to obtain results as shown in Table 11.

TABLE 11

| Insert member | $B_{10}$ (T) | $W_{17/50}$ (W/kg) |
|---|---|---|
| presence | 2.02 | 0.67 |
| absence | 2.01 | 0.68 |

Example 20

An ingot of silicon steel comprising C: 0.205%, Si: 3.42%, Mn: 0.035%, Al: 0.032%, N: 0.0095%, Se: 0.008% and the balance being Fe and inevitable impurities was heated at 1225° C. for 1 hour and hot rolled to a thickness of 0.30 mm. Then, two square sheets having a length: 200 mm and a width: 50 mm were cut out therefrom and annealed at 1100° C. in a dry $N_2$ for 1 minute and thereafter annealed at 725° C. in a wet hydrogen for 5 hours to obtain a raw material A.

Thereafter, the same procedure as in Example 16 was repeated to obtain results as shown in Table 12.

TABLE 12

| Insert member | $B_{10}$ (T) | $W_{17/50}$ (W/kg) |
|---|---|---|
| presence | 2.02 | 0.78 |
| absence | 2.00 | 0.79 |

Example 21

An ingot of silicon steel comprising C: 0.083%, Si: 3.05%, Mn: 0.045%, Se: 0.012%, Al: 0.040%, N: 0.0090% and the balance being Fe and inevitable impurities was heated at 1200° C. for 1 hour and hot rolled to a thickness of 1.9 mm. Then, the sheet was cold rolled to a thickness of 0.30 mm, from which two square sheets having a length: 150 mm and a width; 50 mm were cut out and subjected to decarburization annealing at 725° C. in a wet hydrogen for 1 hour to obtain a raw material A.

Thereafter, the same procedure as in Example 15 was repeated to obtain results as shown in Table 13.

TABLE 13

| Insert member | $B_{10}$ (T) | $W_{17/50}$ (W/kg) |
|---|---|---|
| presence | 2.03 | 0.82 |
| absence | 2.01 | 0.83 |

Example 22

An ingot of silicon steel comprising C: 0.085%, Si: 4.0%, Mn: 0.050%, S: 0.013%, Al: 0.035%, N: 0.0080% and the balance being Fe and inevitable impurities was heated to 1200° C. and hot rolled to a thickness of 1.15 mm. Then, the sheet was subjected to decarburization annealing at 725° C. in wet $H_2$ for 3 hours and then cold rolled to a thickness of 0.20 mm, from which four square specimens having a length: 150 mm and a width: 50 mm were cut out. Among these specimens, two specimens were subjected to decarburization and primary recrystallization annealing at 850° C. for 5 minutes as A1, A2 and the remaining specimens were not subjected thereto as A3, A4.

On the other hand, four single crystal plates comprising 3.0% of Si and the balance being Fe and inevitable impurities and having a thickness: 0.23 mm, a length: 150 mm, a width: 5 mm, $\alpha=0°$ and $\beta=2°$ were provided as B1, B2, B3, B4.

The same procedure as in Example 16 was repeated to obtain results as shown in Table 14.

TABLE 14

| Primary Recrystalliza-tion annealing | Insert member | $B_{10}$ (T) | $W_{17/50}$ (W/kg) |
|---|---|---|---|
| presence | presence | 1.970 | 0.83 |
|  | absence | 1.965 | 0.85 |
| absence | presence | 1.967 | 0.84 |
|  | absence | 1.972 | 0.82 |

Example 23

A sheet bar (thickness: 30 mm) of silicon steel comprising C: 0.125%, Si: 3.0%, Mn: 0.080%, Al: 0.030%, N: 0.0085%, Sb: 0.030% and the balance being Fe and inevitable impurities and casted through a belt caster was heated at 950° C.

for 1 hour and hot rolled to a thickness of 1.15 mm. Then, the sheet was subjected to decarburization annealing at 725° C. in a wet hydrogen for 5 hours and cold rolled to a thickness of 0.20 mm, from which six square sheets having a length: 150 mm and a width: 50 mm were cut out. Among these sheets, three sheets were subjected to primary recrystallization annealing at 850° C. for 5 minutes as A1, A2, A3, and the remaining sheets were not subjected thereto as A4, A5, A6.

On the other hand, six single crystal plates comprising 3.0% of Si and the balance being Fe and inevitable impurities and having a thickness: 0.23 mm, a length: 150 mm, a width: 5 mm, $\alpha=0°$ and $\beta=2°$ were provided as B1, B2, B3, B4, B5, B6.

Then, three sets of A and B polished into mirror surface in the same manner as in Example 16 were provided in the presence or absence of primary recrystallization annealing. After S, Sb, Zn of 0.5 μm in thickness were formed on the mirrored surfaces of each set by ion coating, the coated surfaces of each set were closed with each other.

The same procedure as in Example 16 was repeated to obtain results as shown in Table 15.

TABLE 15

| Primary recrystallization annealing | Insert member | $B_{10}$ (T) | $W_{17/50}$ (W/kg) |
|---|---|---|---|
| presence | S | 2.01 | 0.71 |
|  | Sb | 2.00 | 0.73 |
|  | Zn | 2.02 | 0.70 |
| absence | S | 2.01 | 0.72 |
|  | Sb | 2.00 | 0.74 |
|  | Zn | 2.01 | 0.73 |

Example 24

An ingot of silicon steel comprising C: 0.040%, Si: 3.10%, Mn: 0.055%, S: 0.012%, sol Al: 0.020%, N: 0.0095% and the balance being Fe and inevitable impurities was heated at 1200° C. and hot rolled to a thickness of 1.15 mm.

Then, the sheet was subjected to decarburization annealing at 725° C. in a wet hydrogen for 5 hours and cold rolled to a thickness of 0.20 mm, from which four square sheets having l=150 mm and W=50 mm were cut out as A1, A2, A3, A4. Then, only A2, A4 were subjected to primary recrystallization annealing at 800° C. in dry $H_2$ for 2 minutes.

On the other hand, four single crystal plates comprising 3.0% of Si and the balance being Fe and inevitable impurities and having a thickness: 0.23 mm, a length: 150 mm, a width: 5 mm, $\alpha=0°$ and $\beta=2°$ were provided as B1, B2, B3, B4.

Then, one-side end portion of the rolling face of A at a width of 5 mm in longitudinal direction and one-side full rolling face of B were finished into a mirror surface of Ra<0.1 μm by Emery polishing and chemical polishing, ion sputtering. After Sn of 1 μm in thickness was formed onto the mirrored surfaces of B1, B2 by ion coating, the mirrored surface and the coated surface of A1 and B1 as well as A2 and B2 were closed with each other so as to coincide the lengthwise directions and joined by heating at 900° C. in a dry $N_2$. Furthermore, the lengthwise directions of A3 and B3 as well as A4 and B4 were coincided with each other so as to overlap the ion sputtered mirror surfaces only at a width of 5 mm in the rolling direction and direction perpendicular thereto and joined by heating at 900° C. under vacuum of $10^{-8}$ Torr. While a compressive load: 7 g/mm² was applied to the joint face, the joined sheets were heated by feeding into a temperature tilting furnace having a temperature gradient of 5° C./cm between 1150° C.~900° C. at a feeding rate of 10 mm/h in $N_2$ having a dew point of –50° C. while holding A at low temperature side and B at high temperature side.

After MgO was applied as a separator, it was subjected to a purification annealing at 1200° C. in $H_2$ for 20 hours and further a tension coating was applied, and thereafter the magnetic properties were measured to obtain the following results.

|  | $B_{10}$ (T) | $W_{17/50}$ (W/kg) |
|---|---|---|
| A1-B1 | 2.013 | 0.74 |
| A2-B2 | 2.022 | 0.76 |
| A3-B3 | 2.017 | 0.75 |
| A4-B4 | 2.015 | 0.77 |

Thus, when the decarburization was carried out prior to the rolling, even if the primary recrystallization annealing before the finish annealing was omitted, or even if the atmosphere for the primary recrystallization annealing was dry $H_2$, good magnetic properties were obtained.

Example 25

An ingot of silicon steel comprising C: 0.003%, Si: 3.2%, Mn: 0.10%, S: 0.005%, N: 0.0085%, sol Al: 0.035% and the balance being Fe and inevitable impurities was heated at 1180° C. and hot rolled to a thickness of 0.30 mm. Then, four square sheets having l=150 mm and W=50 mm were cut out therefrom as A1, A2, A3, A4. Next, only A2, A4 were subjected to primary recrystallization annealing at 850° C. in dry $H_2$ for 1 minute.

The same procedure as in Example 24 was repeated to obtain the following results.

|  | $B_{10}$ (T) | $W_{17/50}$ (W/kg) |
|---|---|---|
| A1-B1 | 2.015 | 0.95 |
| A2-B2 | 2.020 | 0.97 |
| A3-B3 | 2.019 | 0.96 |
| A4-B4 | 2.018 | 0.98 |

Example 26

An ingot of silicon steel comprising C=0.003%, Si: 3.25%, Mn: 0.05%, S: 0.010%, N: 0.080%, Al: 0.050% and the balance being Fe and inevitable impurities was heated at 1200° C. and hot rolled to a thickness of 2.3 mm. Then, the sheet was annealed at 950° C. in a dry $N_2$ for 2 minutes and cold rolled to a thickness of 0.3 mm, from which four square sheets having l=150 mm W=50 mm were cut out as A1, A2, A3, A4. Next, only A2, A4 were subjected to primary recrystallization annealing at 850° C. in dry $H_2$ for 1 minute.

The same procedure as in Example 24 was repeated to obtain the following results.

|  | $B_{10}$ (T) | $W_{17/50}$ (W/kg) |
|---|---|---|
| A1–B1 | 2.013 | 0.98 |
| A2–B2 | 2.011 | 0.99 |
| A3–B3 | 2.012 | 0.97 |

| | $B_{10}$ (T) | $W_{17/50}$ (W/kg) |
|---|---|---|
| A4–B4 | 2.010 | 0.98 |

Example 27

An ingot of silicon steel comprising C: 0.035%, Si: 3.35%, Mn: 0.045%, S: 0.008%, N: 0.0085%, Al: 0.045% and the balance being Fe and inevitable impurities was heated at 1225° C. and hot rolled to a thickness of 2.3 mm. Then, the sheet was annealed at 850° C. in a wet hydrogen for 15 minutes and cold rolled to a thickness of 1.15 mm. Furthermore, it was annealed at 850° C. in a wet hydrogen for 15 minutes and cold rolled to a thickness of 0.20 mm, from which four square sheets having l=150 mm and W=50 mm were cut out as A1, A2, A3, A4. Next, only A2, A4 were subjected to primary recrystallization annealing at 850° C. in a wet hydrogen for 3 minutes.

The same procedure as in example 24 was repeated to obtain the following results.

| | $B_{10}$ (T) | $W_{17/50}$ (W/kg) |
|---|---|---|
| A1–B1 | 2.013 | 0.75 |
| A2–B2 | 2.016 | 0.77 |
| A3–B3 | 2.015 | 0.76 |
| A4–B4 | 2.014 | 0.74 |

Example 28

An ingot of silicon steel comprising C: 0.005%, Si: 3.30%, Mn: 0.055%, Se: 0.019%, Sb: 0.025%, Mo: 0.015% and the balance being Fe and inevitable impurities was heated at 1350° C. and hot rolled to a thickness of 2.3 mm. Then, the sheet was cold rolled two times to a thickness of 0.30 mm through an intermediate annealing at 950° C. in a dry $N_2$ for 2 minutes, from which four square sheets having l=150 mm and W=50 mm were cut out as A1, A2, A3, A4. Next, only A2, A4 were subjected to primary recrystallization annealing at 850° C. in a dry $H_2$ for 1 minute.

The same procedure as in Example 24 was repeated to obtain the following results.

| | $B_{10}$ (T) | $W_{17/50}$ (W/kg) |
|---|---|---|
| A1–B1 | 2.010 | 0.97 |
| A2–B2 | 2.008 | 0.96 |
| A3–B3 | 2.007 | 0.98 |
| A4–B4 | 2.009 | 0.95 |

Example 29

An ingot of silicon steel comprising C: 0.075%, Si: 3.25%, Mn: 0.070%, S: 0.015%, Mo: 0.015%, Al: 0.025%, N: 0.0099% and the balance being Fe and inevitable impurities was heated at 1300° C. and hot rolled to a thickness of 2.3 mm. Then, the sheet was cold rolled to a thickness of 0.30 mm, subjected to decarburization annealing at 840° C. in a wet hydrogen for 10 minutes and then cold rolled to a thickness of 0.20 mm, from which four square sheets having l=150 mm and W=50 mm were cut out as A1, A2, A3, A4. Next, only A2, A4 were subjected to primary recrystallization annealing at 800° C. in a dry $H_2$ for 1 minute.

On the other hand, four single crystal plates each comprising 3.0% of Si and the balance being Fe and inevitable impurities and having a thickness: 0.20 mm, a length: 150 mm, a width: 5 mm, α=0° and β=2° were provided as B1, B2, B3, B4.

Then, one-side end portion of the rolling face of A at a width of 5 mm in longitudinal direction and one-side full rolling face of B were finished into a mirror surface by Emery polishing, chemical polishing and ion sputtering.

After Sn of 2 μm was plated onto each of A1, A2, B1, B2, a solution of $SnCl_2$+ethanol was applied to these plated surfaces, and the plated surfaces of A1 and B1 as well as A2 and B2 were closed with each other so as to coincide the longitudinal directions thereof and heated to 350° C. while a compressive stress of 5 g/mm² and supersonic wave were applied to the joint face and rubbed at the plated surfaces with each other to closely join the plated surface of B onto the plated surface of A. On the other hand, the ion sputtered mirror surfaces of A3 and B3 as well as A4 and B4 were overlapped only at a width of 5 mm in the rolling direction and the direction perpendicular thereto so as to coincide the longitudinal directions and joined by heating at 950° C. under vacuum of $10^{-8}$ Torr. After MgO containing 15% of $SrSO_4$ was applied as a separator, the joined body was heated in $N_2$ having a dew point of −30° C. at a temperature rising rate of 20° C./h and subjected to purification annealing at 1200° C. for 24 hours and then a tension coating was applied, and thereafter the magnetic properties were measured to obtain the following results.

| | $B_{10}$ (T) | $W_{17/50}$ (W/kg) |
|---|---|---|
| A1–B1 | 2.015 | 0.75 |
| A2–B2 | 2.020 | 0.77 |
| A3–B3 | 2.017 | 0.76 |
| A4–B4 | 2.019 | 0.78 |

Example 30

An ingot of silicon steel comprising C: 0.003%, Si: 3.1%, Mn: 0.09%, S: 0.010%, N: 0.0080%, sol Al: 0.030% and the balance being Fe and inevitable impurities was heated at 1180° C. and hot rolled to a thickness of 0.30 mm. Then, the sheet was annealed at 550° C. in $N_2$ for 24 hours, from which four square sheets having l=150 mm and W=50 mm were cut out as A1, A2, A3, A4. Next, only A3, A4 were subjected to primary recrystallization annealing at 850° C. in a dry $H_2$ for minute.

The same procedure as in Example 29 was repeated to obtain the following results.

| | $B_{10}$ (T) | $W_{17/50}$ (W/kg) |
|---|---|---|
| A1–B1 | 2.017 | 0.96 |
| A2–B2 | 2.021 | 0.98 |
| A3–B3 | 2.018 | 0.97 |
| A4–B4 | 2.019 | 0.99 |

Example 31

An ingot of silicon steel comprising C: 0.003%, Si: 3.2%, mn: 0.10%, S: 0.005%, N: 0.0085%, sol Al: 0.025% and the balance being Fe and inevitable impurities was heated at 1180° C. and hot rolled to a thickness of 0.50 mm. Then, the sheet was cold rolled to a thickness of 0.23 mm, from which four square sheets having l=150 mm and W=50 mm were cut out as A1, A2, A3, A4. Next, only A3, A4 were subjected to primary recrystallization annealing at 850° C. in a dry H₂ for 1 minute.

The same procedure as in Example 29 was repeated to obtain the following results.

|       | $B_{10}$ (T) | $W_{17/50}$ (W/kg) |
|-------|--------------|--------------------|
| A1–B1 | 2.015        | 0.81               |
| A2–B2 | 2.020        | 0.80               |
| A3–B3 | 2.019        | 0.83               |
| A4–B4 | 2.016        | 0.82               |

Example 32

An ingot of silicon steel comprising C: 0.025%, Si: 3.45%, Mn: 0.20%, S: 0.007%, sol Al: 0.033%, N: 0.0080% and the balance being Fe and inevitable impurities was heated at 1350° C. and hot rolled to a thickness of 0.30 mm, from which four square sheets having l=150 mm and W=50 mm were cut out as A1, A2, A3, A4. Next, only A3, A4 were subjected to primary recrystallization annealing at 850° C. in a wet H₂ for 2 minutes.

The same procedure as in Example 29 was repeated by adopting decarburization using saturated water of MgO as a separator to obtain the following results.

|       | $B_{10}$ (T) | $W_{17/50}$ (W/kg) |
|-------|--------------|--------------------|
| A1–B1 | 2.005        | 0.95               |
| A2–B2 | 2.002        | 0.93               |
| A3–B3 | 2.003        | 0.94               |
| A4–B4 | 2.006        | 0.92               |

Example 33

An ingot of silicon steel comprising C: 0.057%, Si: 3.45%, Mn: 0.29%, S: 0.003%, sol Al: 0.032%, N: 0.0090% and the balance being Fe and inevitable impurities was heated at 1350° C. and hot rolled to a thickness of 0.30 mm. Then, the sheet was annealed at 850° C. in a wet hydrogen for 5 minutes, from which four square sheets having l=150 mm and W=50 mm were cut out as A1, A2, A3, A4. Next, only A3, A4 were subjected to an annealing at 970° C. in a dry N₂ for 1 minute.

The same procedure as in Example 29 was repeated to obtain the following results.

|       | $B_{10}$ (T) | $W_{17/50}$ (W/kg) |
|-------|--------------|--------------------|
| A1–B1 | 2.007        | 0.95               |
| A2–B2 | 2.005        | 0.97               |
| A3–B3 | 2.003        | 0.94               |
| A4–B4 | 2.004        | 0.93               |

Example 34

An ingot of silicon steel comprising C: 0.030%, Si: 3.42%, Mn: 0.25%, S: 0.010%, sol Al: 0.027%, N: 0.0091% and the balance being Fe and inevitable impurities was heated at 1350° C. and hot rolled to a thickness of 0.50 mm. Then, the sheet was cold rolled to a thickness of 0.23 mm, from which four square sheets having l=150 mm and W=50 mm were cut out as A1, A2, A3, A4. Next, only A3, A4 were subjected to primary recrystallization annealing at 850° C. in a wet H₂ for 2 minutes.

The same procedure as in Example 29 was repeated by using saturated water of MgO as a separator to obtain the following results.

|       | $B_{10}$ (T) | $W_{17/50}$ (W/kg) |
|-------|--------------|--------------------|
| A1–B1 | 2.007        | 0.81               |
| A2–B2 | 2.008        | 0.80               |
| A3–B3 | 2.006        | 0.79               |
| A4–B4 | 2.009        | 0.81               |

Example 35

Molten steel comprising C: 0.079%, Si: 3.25%, Mn: 0.073%, S: 0.012%, sol Al: 0.025%, N: 0.0089% and the balance being Fe and inevitable impurities was slantly cast to a thickness of 150 mm from 1600° C. in a water-cooled copper mold, quenched to 1150° C., held at the same time for 5 minutes and immediately hot rolled to a thickness of 2.5 mm.

Then, the sheet was hot rolled to a thickness of 0.22 mm, from which a steel sheet having a length of 150 mm and a width of 100 mm was cut out. Next, the sheet was heated from 200° C. to 700° C. at a temperature rising rate of 20° C./h and subjected to decarburization annealing at 820° C. in a wet hydrogen for 3 minutes to obtain a sheet material.

On the other hand, a single crystal plate comprising Si: 3.0% and the balance being Fe and inevitable impurities and having a thickness of 0.22 mm, a length of 150 mm, a width of 5 mm, α=0° and β=2° was provided as a seed plate.

Then, one-side end portion of the rolling face of the treating sheet at a width of 5 mm in longitudinal direction and one-side full rolling face of the seed plate were finished into a mirror surface of Ra<0.1 μm by grinding and polishing.

Next, In of 1 μm in thickness was plated onto the mirrored surface of the seed plate, while Sn of 1 μm in thickness was plated onto the mirrored surface of the treating sheet. These plated surfaces were closed by rubbing so as to coincide the longitudinal directions and joined by heating in a dry N₂ while a compressive stress: 7 g/mm² was applied to the joint face and a supersonic wave was applied.

After MgO containing 1.7% of SnSO₄ was applied as a separator, the joined body was heated in a dry N₂ by feeding into an annealing furnace having a temperature gradient of 1° C./cm between 1150°~900° C. at a feeding rate of 5 mm/h while holding the treating sheet at low temperature side and the seed plate at high temperature side. Then, the body was subjected to purification annealing at 1200° C. in H₂ for 20 hours and a tension coating was applied thereto. As a result, the magnetic properties of the treating sheet were $B_8$=2.01 (T) and $W_{17/50}$=0.69 (W/kg).

Example 36

Molten steel having the same composition as in Example 35 was cast to a thickness of 25 mm from 1600° C. in a horizontal thin slab casting machine, quenched to 950° C., held at this temperature for 3 minutes and immediately hot rolled to a thickness of 0.35 μm, which was held at 550° C. for 24 hours and cooled. Then, a steel sheet having a length of 150 mm and a width of 100 mm was cut out therefrom and heated from 200° C. to 700° C. at a temperature rising rate of 20° C./h and subjected to decarburization annealing at 820° C. in a wet hydrogen for 5 minutes to obtain a treating sheet.

Then, the same procedure as in Example 35 was repeated to obtain $B_8=2.01$ (T) and $W_{17/50}=0.96$ (W/kg).

Example 37

Molten steel having the same composition as in Example 35 was slantly cast to a thickness of 5 mm from 1600° C. in a water-cooled copper mold, quenched up to 600° C. and immediately warm rolled to a thickness of 0.22 mm. Then, a steel sheet having a length of 150 mm and a width of 100 mm was cut out therefrom, heated from 200° C. to 700° C. at a temperature rising rate of 20° C./h and then subjected to decarburization annealing at 820° C. in a wet hydrogen for 3 minutes to obtain a treating sheet.

Then, the same procedure as in Example 35 was repeated to obtain $B_8=2.00$ (T) and $W_{17/50}=0.68$ (W/kg).

Example 38

A thin sheet of 350 μm in thickness was made by directly cooling from molten steel comprising C: 0.028%, Si: 3.12%, Mn: 0.075%, S: 0.012%, sol Al: 0.019%, N: 0.0095% and the balance being Fe and inevitable impurities. This thin sheet was immediately warm rolled to a thickness of 0.20 mm by heating to 550° C., which was held at this temperature for 24 hours and cooled. Then, a steel sheet having a length of 150 mm and a width of 100 mm was cut out therefrom, heated from 200° C. to 700° C. at a temperature rising rate of 20° C./h and subjected to decarburization annealing at 820° C. in a wet hydrogen for 3 minutes to obtain a treating sheet.

Then, the same procedure as in Example 35 was repeated to obtain $B_8=2.01$ (T) and $W_{17/50}=0.65$ (W/kg).

Example 39

An ingot of silicon steel comprising C: 0.075%, Si: 2.85%, Mn: 0.065%, S: 0.014%, sol Al: 0.025%, N: 0.0087% and the balance being Fe and inevitable impurities was heated to 1350° C. and hot rolled to a thickness of 1.6 mm. Then, the sheet was annealed at 1130° C. for 2 minutes, cold rolled at a reduction of 60% in the same direction as in the hot rolling direction and then rolled in a direction perpendicular thereto to a thickness of 0.23 mm. Next, two square sheets having a length of 200 mm and a width of 150 mm were cut out therefrom and decarburized at 750° C. in a wet hydrogen for 1 hour as A1, A2.

On the other hand, two single crystal plates having the same composition as in the hot rolled sheet, a thickness: 0.23 mm, a length: 200 mm and a width: 5 mm, in which plate face was (100) face and lengthwise direction was [001] orientation, were provided as B1, B2.

Then, one-side end portion of rolling face of A at a width of 5 mm in longitudinal direction and one-side full rolling face of B were finished into a mirror surface of Ra<0.1 μm by Emery polishing, chemical polishing and ion etching. Next, the mirrored surfaces of A1 and B1 as well as A2 and B2 were closed and heated in $N_2$ having a dew point of −25° C. by feeding into a temperature tilting furnace having a temperature gradient of 5° C./cm between 1150° C.–900° C. at a feeding rate of 10 mm/h while a compressire stress: 8 g/mm² was applied to the joint face in case of A1 and B1 but was not applied in case of A2 and B2 and holding A at low temperature side and B at high temperature side.

After MgO was applied as a separator, the joined body was subjected to purification annealing at 1200° C. in $H_2$ for 20 hours.

The magnetic properties of the thus obtained joined bodies are shown in Table 16.

TABLE 16

| Presence or absence of load | $B_{10}$ (T) | | $W_{17/50}$ (W/kg) | |
|---|---|---|---|---|
| | presence | absence | presence | absence |
| Magnetization in the same direction as in hot rolling direction | 2.00 | 1.97 | 1.41 | 1.49 |
| Magnetization in direction perpendicular to hot rolling direction | 2.01 | 1.98 | 1.39 | 1.47 |

As seen from the above table, the magnetic properties in both the hot rolling direction and the direction perpendicular thereto were very good.

Example 40

An ingot of silicon steel comprising C: 0.085%, Si: 3.00%, Mn: 0.080%, S: 0.015%, Sol Al: 0.030%, N: 0.0085% and the balance being Fe and inevitable impurities was heated to 1350° C. and hot rolled to a thickness of 0.35 mm. Then, two square sheets having a length of 150 mm and a width of 150 mm were cut out therefrom and decarburized at 750° C. in a wet hydrogen for 3 hours as A3, A4.

On the other hand, two single crystal plates having the same composition as in the hot rolled sheet, a thickness: 0.35 mm, a length: 150 mm and a width: 5 mm, in which plate face was (100) face and lengthwise direction was [001] orientation, were provided as B3, B4.

Then, one-side end portion of rolling face of A at a width of 5 mm in longitudinal direction and one side full rolling face of B were finished into a mirror surface of Ra<0.1 μm by Emery polishing, chemical polishing and ion etching. Next, the mirrored surfaces of A and B were closed and heated from 900° C. to 1200° C. at a temperature rising rate of 5° C./h under vacuum of $10^{-8}$ Torr. After MgO was applied as a separator, the joined body was purification annealing at 1200° C. in $H_2$ for 20 hours and then the magnetic properties of A were measured to obtain results shown in the Table 17.

TABLE 17

| Presence of absence of load | $B_{10}$ (T) | | $W_{17/50}$ (W/kg) | |
|---|---|---|---|---|
| | presence | absence | presence | absence |
| Magnetization in the same direction as in hot rolling direction | 2.01 | 1.99 | 1.63 | 1.69 |
| Magnetization in direction perpendicular to hot rolling direction | 2.02 | 1.98 | 1.57 | 1.72 |

Example 41

There were provided three sets of A and B polished into mirror surface in the same manner as in Example 39. After S, Sb or Cu of 0.5 μm was formed onto the mirrored surface of each set by ion coating, the coated surfaces of each set were closed with each other and heated from 1000° C. to 1200° C. at a temperature rising rate of 5° C./h in $N_2$. After MgO was applied as a separator, the joined body was subjected to purification annealing at 1200° C. in $H_2$ for 20 hours.

The magnetic properties of each A portion of the thus obtained joined bodies are shown in Table 18.

TABLE 18

|  | Magnetization in the same direction as in hot rolling direction | | Magnetization in direction perpendicular to hot rolling direction | |
| --- | --- | --- | --- | --- |
|  | $B_{10}$ (T) | $W_{17/50}$ (W/kg) | $B_{10}$ (T) | $W_{17/50}$ (W/kg) |
| S coating | 2.01 | 1.62 | 2.00 | 1.60 |
| Sb coating | 2.00 | 1.65 | 2.01 | 1.59 |
| Cu coating | 2.02 | 1.60 | 2.00 | 1.63 |

As seen from the above table, the magnetic properties in both the hot rolling direction and the direction perpendicular thereto were very good.

Example 42

An ingot of silicon steel having the same composition as in Example 39 was heated to 1350° C. and hot rolled to a thickness of 0.35 mm. Then, two square sheets having a length of 200 mm and a width of 150 mm were cut out therefrom and decarburized at 750° C. in a wet hydrogen for 1 hour as A5, A6.

On the other hand, two single crystal plates having the same composition as in the above hot rolled sheet, a thickness: 0.35 mm, a length: 200 mm and a width: 5 mm, in which plate face was (100) face and lengthwise direction was [001] orientation, were provided as B5, B6.

Then, one-side end portion of rolling face of A at a width of 5 mm in longitudinal direction and one-side full rolling face of B were finished into a mirror surface of Ra<0.1 μm by Emery polishing and chemical polishing. Next, after Sn of 0.5 μm was formed onto each mirrored surface by ion coating, the coated surfaces of A5 and B5 as well as A6 and B6 were closed with each other, which were heated in $N_2$ having a dew point of −10° C. by feeding into a temperature tilting furnace having a temperature gradient of 5° C./cm between 1150° C.~900° C. at a feeding rate of 10 mm/h while applying a compressive stress of 7 g/mm² to the joint face in case of A5 and B5 but not applying thereto in case of A6 and B6 and holding A at low temperature side and B at high temperature side.

After MgO was applied as a separator, the joined body was subjected to purification annealing at 1200° C. in $H_2$ for 20 hours and the magnetic properties were measured to obtain results as shown in Table 19.

TABLE 19

| Presence of absence of load | $B_{10}$ (T) | | $W_{17/50}$ (W/kg) | |
| --- | --- | --- | --- | --- |
|  | presence | absence | presence | absence |
| Magnetization in the same direction as in hot rolling direction | 2.03 | 1.99 | 1.55 | 1.63 |

TABLE 19-continued

| Presence of absence of load | $B_{10}$ (T) | | $W_{17/50}$ (W/kg) | |
| --- | --- | --- | --- | --- |
|  | presence | absence | presence | absence |
| Magnetization in direction perpendicular to hot rolling direction | 2.02 | 2.00 | 1.60 | 1.61 |

Thus, the magnetic properties in both the hot rolling direction and the direction perpendicular thereto were very good.

Example 43

An ingot of silicon steel comprising C: 0.025%, Si: 3.30%, Mn: 0.075%, S: 0.020%, sol Al: 0.020%, N: 0.0095% and the balance being Fe and inevitable impurities was heated to 1350° C. and hot rolled to a thickness of 0.5 mm. Then, the sheet was subjected to decarburization annealing at 700° C. in a wet hydrogen for 3 hours. From the annealed sheet were cut out two square specimens having a length of 300 mm and a width of 35 mm as A having a lengthwise direction same as in the hot rolling direction and B having a lengthwise direction perpendicular thereto.

On the other hand, two single crystal plates having the same composition as in the above hot rolled sheet, a thickness: 0.50 mm, a length: 280 mm and a width: 5 mm, in which plate face was (100), were provided as seed plates C.

Then, sectional faces of A and B parallel to the lengthwise direction and perpendicular to the rolling face as well as (100) face of C perpendicular to plate face were finished into a mirror surface of Ra<0.2 μm by Emery polishing. After Sn of 0.5 μm in thickness was deposited onto the treated surfaces, the Sn deposited surfaces as a set of A and C, B and C were closed with each other and joined by rubbing while supersonic wave was applied, which was heated in a dry $N_2$ atmosphere by feeding into a temperature tilting furnace having a temperature gradient of 5° C./cm between 1150° C.~850° C. at a feeding rate of 10 mm/h while applying a compressive stress of 10 g/mm² to the joint face and holding A, B at low temperature side and C at high temperature side.

After MgO was applied as a separator, the joined body was subjected to purification annealing at 1200° C. in $H_2$ for 20 hours to obtain the magnetic properties as shown in the Table 20.

TABLE 20

|  | $B_{10}$ (T) | $W_{17/50}$ (W/kg) |
| --- | --- | --- |
| A–C | 2.02 | 1.95 |
| B–C | 2.00 | 1.88 |

Thus, the magnetic properties in both the hot rolling direction and the direction perpendicular thereto were very good.

Example 44

An ingot of silicon steel having the same composition as in Example 43 was heated to 1350° C. and hot rolled to a thickness of 1.15 mm. Then, the sheet was cold rolled at a reduction of 60% in the same direction as in the hot rolling direction and further at a reduction of 50% in a direction perpendicular thereto to obtain a thickness of 0.23 mm.

Then, the sheet was subjected to decarburization annealing at 820° C. in a wet hydrogen for 10 minutes. From the annealed sheet were cut out two square specimens having a length of 300 mm and a width of 35 mm as D having a lengthwise direction same as in the hot rolling direction and E having a lengthwise direction perpendicular thereto.

On the other hand, two single crystal plates having the same composition as in the above hot rolled sheet, a thickness: 0.23 mm, a length: 280 mm and a width: 5 mm, in which plate face was (100), were provided as a seed plates F.

Then, the same procedure as in Example 39 was repeated and the magnetic properties of the thus obtained joined bodies were measured to obtain results as shown in Table 21.

TABLE 21

|   | $B_{10}$ (T) | $W_{17/50}$ (W/kg) |
|---|---|---|
| D–F | 2.01 | 1.42 |
| E–F | 1.99 | 1.35 |

The magnetic properties in both the hot rolling direction and the direction perpendicular thereto were very good as in Example 39.

Example 45

An ingot of silicon steel having the same composition as in Example 43 was heated to 1250° C. and hot rolled to a thickness of 0.30 mm.

Then, the magnetic properties of the joined body obtained by repeating the same procedure as in Example 43 are shown in Table 22.

TABLE 22

|   | $B_{10}$ (T) | $W_{17/50}$ (W/kg) |
|---|---|---|
| A–C | 2.020 | 1.047 |
| B–C | 2.015 | 1.045 |

Example 46

An ingot of silicon steel comprising C: 0.175%, Si: 3.0%, Mn: 0.040%, Se: 0.010%, sol Al: 0.055%, N: 0.0105% and the balance being Fe and inevitable impurities was heated to 1225° C. and hot rolled to a thickness of 0.30 mm, from which were then cut out two square specimens having a length of 300 mm and a width of 35 mm as A having a lengthwise direction same as in the hot rolling direction and B having a lengthwise direction perpendicular thereto. These specimens were subjected to decarburization annealing at 750° C.

Then, the magnetic properties of the joined body obtained by repeating the same procedure as in Example 43 are shown in Table 23.

TABLE 23

|   | $B_{10}$ (T) | $W_{17/50}$ (W/kg) |
|---|---|---|
| A–C | 2.010 | 1.30 |
| B–C | 2.017 | 1.35 |

Example 47

An ingot of silicon steel comprising C: 0.205%, Si: 4.2%, Mn: 0.050%, S: 0.012%, sol Al: 0.060%, N: 0.0110% and the balance being Fe and inevitable impurities was heated to 1225° C. and hot rolled to a thickness of 0.35 mm.

Then, the magnetic properties of the joined body obtained by repeating the same procedure as in Example 43 are shown in Table 24.

TABLE 24

|   | $B_{10}$ (T) | $W_{17/50}$ (W/kg) |
|---|---|---|
| A–C | 1.967 | 1.42 |
| B–C | 1.970 | 1.47 |

Example 48

An ingot of silicon steel having the same composition as in Example 43 was heated to 1325° C. and hot rolled to a thickness of 1.15 mm. Then, the sheet was subjected to decarburization annealing at 725° C. in a wet hydrogen for 10 hours. Then, the sheet was cold rolled at a reduction of 60% in the same direction as in the hot rolling direction and further at a reduction of 50% in a direction perpendicular thereto to obtain a thickness of 0.23 mm, from which were provided four square specimens of l=150 mm and w=50 mm having a lengthwise direction (l) same as in the hot rolling direction as A1, A2, and having a lengthwise direction perpendicular thereto as B1, B2. Only A2 and B2 were annealed at 800° C. in a dry $H_2$ for 2 minutes.

On the other hand, four single crystal plates each comprising Si: 3.0% and the balance being Fe and inevitable impurities and having a thickness: 0.23 mm, a length: 150 mm and a width: 5 mm, in which plate face and lengthwise direction were shifted by 2° from (100) face and [001] axis, respectively, were provided as C1, C2, C3, C4.

Then, one-side end portions of rolling faces of A1, A2, B1, B2 at a width of 5 mm in longitudinal direction and one-side full rolling faces of C1, C2, C3, C4 were finished into a mirror surface of Ra<0.1 μm by Emery polishing, chemical polishing and ion sputtering. After Sn of 1 μm was formed onto the mirrored surfaces of C1, C2, C3, C4 by ion coating, the mirrored surface and the coated surface of A1 and C1, A2 and C2, B1 and C3, B2 and C4 were closed with each other so as to coincide the lengthwise directions and heated in $N_2$ having a dew point of −10° C. by feeding into a temperature tilting furnace having a temperature gradient of 5° C./cm between 1150° C.–900° C. while applying a compressive stress: 7 g/mm² to the joint face and also applying a supersonic wave thereto and holding A and B at low temperature side and C at high temperature side.

After MgO was applied as a separator, the joined body was subjected to purification annealing at 1200° C. in $H_2$ for 20 hours and a tension coating was applied thereto, and then the magnetic properties were measured to obtain results as shown in Table 25.

TABLE 25

|   | $B_{10}$ (T) | $W_{17/50}$ (W/kg) |
|---|---|---|
| A1–C1 | 2.015 | 0.84 |
| A2–C2 | 2.010 | 0.88 |
| B1–C3 | 2.013 | 0.85 |
| B2–C4 | 2.018 | 0.87 |

Thus, when decarburization was carried out before the rolling, even if decarburization annealing was omitted before the finish annealing or the annealing atmosphere was dry $H_2$, good magnetic properties were obtained. Furthermore, the considerable improvement of magnetic properties had been achieved by slightly shifting (110) face from the rolling face.

Example 49

An ingot of silicon steel comprising C: 0.005%, Si: 3.2%, Mn: 0.10%. S: 0.005%, N: 0.0080%, sol Al: 0.032% and the balance being Fe and inevitable impurities was heated to 1180° C. and hot rolled to a thickness of 0.30 mm, from which were provided four square specimens of l=150 mm and w=50 mm having a lengthwise direction (l) same as in the hot rolling direction as A1, A2, and having a lengthwise direction perpendicular thereto as B1, B2. Only A2 and B2 were annealed at 850° C. in a dry $H_2$ for 1 minute.

Then, the same procedure as in Example 48 was repeated to obtain the results shown in Table 26.

TABLE 26

|  | $B_{10}$ (T) | $W_{17/50}$ (W/kg) |
| --- | --- | --- |
| A1–C1 | 2.017 | 0.98 |
| A2–C2 | 2.015 | 1.02 |
| B1–C3 | 2.021 | 0.97 |
| B2–C4 | 2.018 | 1.01 |

Example 50

An ingot of silicon steel comprising C: 0.004%, Si: 3.10%, Mn: 0.052%, S: 0.011%, N: 0.0085%, sol Al: 0.045% and the balance being Fe and inevitable impurities was heated to 1250° C. and hot rolled to a thickness of 2.3 mm. Then, the sheet was annealed at 900° C. in a dry $N_2$ for 3 hours and subjected to a combination of cold rollings in the same direction as in the hot rolling direction and in a direction perpendicular thereto to obtain a thickness of 0.30 mm, from which were provided four square specimens of l=150 mm and w=50 mm having a lengthwise direction (l) same as in the hot rolling direction as A1, A2, and having a lengthwise direction perpendicular thereto as B1, B2. Only A2 and B2 were annealed at 975° C. in a dry $H_2$ for 1 minute.

Then, the same procedure as in Example 48 was repeated to obtain the results shown in Table 27.

TABLE 27

|  | $B_{10}$ (T) | $W_{17/50}$ (W/kg) |
| --- | --- | --- |
| A1–C1 | 2.015 | 0.98 |
| A2–C2 | 2.025 | 0.97 |
| B1–C3 | 2.012 | 1.01 |
| B2–C4 | 2.027 | 0.96 |

Example 51

An ingot of silicon steel comprising C: 0.040%, Si: 3.15%, Mn: 0.050%, S: 0.008%, N: 0.0095%, sol Al: 0.042% and the balance being Fe and inevitable impurities was heated to 1200° C. and hot rolled to a thickness of 2.3 mm. Then, the sheet was subjected to decarburization annealing at 850° C. in a wet hydrogen for 10 minutes, and cold rolled to a thickness of 1.15 mm. Further, the sheet was annealed at 850° C. in a wet hydrogen for 10 minutes and subjected to a combination of cold rollings in the same direction as in the hot rolling direction and in a direction perpendicular thereto to obtain a thickness of 0.2 mm, from which were provided four square specimens of l=150 mm and w=50 mm having a lengthwise direction (l) same as in the hot rolling direction as A1, A2, and having a lengthwise direction perpendicular thereto as B1, B2. Only A2 and B2 were annealed at 950° C. in a dry $H_2$ for 1 minute.

Then, the same procedure as in Example 48 was repeated to obtain the results shown in Table 28.

TABLE 28

|  | $B_{10}$ (T) | $W_{17/50}$ (W/kg) |
| --- | --- | --- |
| A1–C1 | 2.011 | 0.79 |
| A2–C2 | 2.022 | 0.77 |
| B1–C3 | 2.013 | 0.76 |
| B2–C4 | 2.025 | 0.75 |

Example 52

An ingot of silicon steel comprising C: 0.018%, Si: 3.25%, Mn: 0.065%, S: 0.013%, sol Al: 0.018%, N: 0.0085% and the balance being Fe and inevitable impurities was heated to 1350° C. and hot rolled to a thickness of 0.35 mm. Then, a square sheet having a length of 150 mm and a width of 150 mm was cut out therefrom as a treating sheet.

On the other hand, a single crystal plate having the same composition as in the above hot rolled sheet, a thickness: 0.30 mm, a length: 150 mm and a width: 5 mm, in which plate face was (100) face and lengthwise direction was [001] axis, was provided as a seed plate.

Then, one-side end portion of rolling face of the treating sheet at a width of 5 mm and one-side full rolling face of the seed plate were finished into a mirror surface of Ra<0.1 μm by Emery polishing, chemical polishing and ion etching. Next, the mirrored surfaces of the treating material and the seed material were closed with each other and heated from 900° C. to 1200° C. at a temperature rising rate of 5° C./h under vacuum of $10^{-8}$ Torr while applying a supersonic wave. After MgO was applied as a separator, the joined body was subjected to purification annealing at 1200° C. in $H_2$ for 20 hours and the magnetic properties of the treating material were measured to obtain results as shown in Table 29.

TABLE 29

| Magnetization direction | $B_{10}$ (T) | $W_{17/50}$ (W/kg) |
| --- | --- | --- |
| Hot rolling direction | 2.01 | 1.62 |
| Direction perpendicular to hot rolling | 2.01 | 1.58 |

Example 53

An ingot of silicon steel having the same composition as in Example 52 was heated to 1350° C. and hot rolled to a thickness of 2.2 mm. Then, the sheet was cold rolled at a reduction of 60% in the same direction as in the hot rolling direction and further rolled in a direction perpendicular thereto to obtain a thickness of 0.23 mm. Next, a square sheet having a length of 150 mm and a width of 150 mm was cut out therefrom as a treating sheet.

Then, the magnetic properties of the treating sheet obtained by repeating the same procedure as in Example 52 are shown in Table 30.

TABLE 30

| Magnetization direction | $B_{10}$ (T) | $W_{17/50}$ (W/kg) |
|---|---|---|
| Hot rolling direction | 2.01 | 1.40 |
| Hot rolling direction | 2.01 | 1.40 |
| Direction perpendicular to hot rolling | 2.00 | 1.38 |

Example 54

An ingot of silicon steel having the same composition as in Example 52 was heated to 1200° C. and hot rolled to a thickness of 0.35 mm. Then, a square sheet having a length of 150 mm and a width of 150 mm was cut out therefrom as a treating sheet.

Then, the magnetic properties of the treating sheet obtained by repeating the same procedure as in Example 52 are shown in the following table.

TABLE 31

| Magnetization direction | $B_{10}$ (T) | $W_{17/50}$ (W/kg) |
|---|---|---|
| Hot rolling direction | 2.00 | 1.61 |
| Direction perpendicular to hot rolling | 2.01 | 1.59 |

Example 55

An ingot of silicon steel comprising C: 0.005%, Si: 3.00%, Mn: 0.045%, S: 0.011%, sol Al: 0.015%, N: 0.0080% and the balance being Fe and inevitable impurities was heated to 1220° C. and hot rolled to a thickness of 2.2 mm. Then, the sheet was cold rolled at a reduction of 60% in the same direction as in the hot rolling direction and further rolled in a direction perpendicular thereto to obtain a thickness of 0.23 mm. Next, a square sheet having a length of 150 mm and a width of 150 mm was cut out therefrom as a treating sheet.

Then, the magnetic properties of the treating material obtained by repeating the same procedure as in Example 52 are shown in the following table.

TABLE 32

| Magnetization direction | $B_{10}$ (T) | $W_{17/50}$ (W/kg) |
|---|---|---|
| Hot rolling direction | 2.00 | 1.41 |
| Direction perpendicular to hot rolling | 2.01 | 1.37 |

Example 56

An ingot of silicon steel comprising C: 0.075%, Si: 3.25%, Mn: 0.042%, S: 0.013%, sol Al: 0.017%, N: 0.0088% and the balance being Fe and inevitable impurities was heated to 1225° C. and hot rolled to a thickness of 0.35 mm. Then, a square sheet having a length of 150 mm and a width of 150 mm was cut out therefrom and decarburized at 750° C. in a wet hydrogen for 3 hours as a treating material.

Then, the magnetic properties of the treating material obtained by repeating the same procedure as in Example 52 are shown in Table 33.

TABLE 33

| Magnetization direction | $B_{10}$ (T) | $W_{17/50}$ (W/kg) |
|---|---|---|
| Hot rolling direction | 2.01 | 1.60 |
| Direction perpendicular to hot rolling | 2.01 | 1.62 |

Example 57

An ingot of silicon steel having the same composition as in Example 56 was heated to 1225° C. and hot rolled to a thickness of 2.2 mm. Then, the sheet was cold rolled at a reduction of 60% in the same direction as in the hot rolling direction and further rolled in a direction perpendicular thereto to obtain a thickness of 0.23 mm. Next, a square sheet having a length of 150 mm and a width of 150 mm was cut out therefrom, heated from 200° C. to 700° C. at a rate of 50° C./h and decarburized at 750° C. in a wet hydrogen for 1 hour as a treating sheet.

Then, the magnetic properties of the treating sheet obtained by repeating the same procedure as in Example 52 are shown in Table 34.

TABLE 34

| Magnetization direction | $B_{10}$ (T) | $W_{17/50}$ (W/kg) |
|---|---|---|
| Hot rolling direction | 2.00 | 1.39 |
| Direction perpendicular to hot rolling | 1.99 | 1.41 |

Example 58

An ingot of silicon steel having the same composition as in Example 56 was heated to 1225° C. and hot rolled to a thickness of 1.15 mm. Then, the sheet was subjected to decarburization annealing at 750° C. in a wet hydrogen for 5 hours. Further, it was cold rolled at a reduction of 60% in the same direction as in the hot rolling direction and further rolled in a direction perpendicular thereto to obtain a thickness of 0.23 mm. Next, a square sheet having a length of 150 mm and a width of 150 mm was cut out therefrom as a treating sheet.

Then, the magnetic properties of the treating sheet obtained by repeating the same procedure as in Example 52 are shown in Table 35.

TABLE 35

| Magnetization direction | $B_{10}$ (T) | $W_{17/50}$ (W/kg) |
|---|---|---|
| Hot rolling direction | 2.01 | 1.40 |

TABLE 35-continued

| Magnetization direction | $B_{10}$ (T) | $W_{17/50}$ (W/kg) |
| --- | --- | --- |
| Direction perpendicular to hot rolling | 2.00 | 1.41 |

Example 59

An ingot of silicon steel comprising C: 0.024%, Si: 3.10%, Mn: 0.072%, S: 0.015%, sol Al: 0.022%, N: 0.0079% and the balance being Fe and inevitable impurities was heated to 1350° C. and hot rolled to a thickness of 0.34 mm. Then, a square sheet having a length of 150 mm and a width of 150 mm was cut out therefrom as a treating sheet.

On the other hand, a single crystal plate comprising Si: 3.0% and the balance being Fe and inevitable impurities and having a thickness: 0.23 mm, a length: 150 mm and a width: 5 mm, in which plate face was (100) face and lengthwise direction was [001] axis, was provided as a seed plate.

Then, one-side end portion of rolling face of the treating sheet at a width of 5 mm in lengthwise direction and one-side full rolling face of the seed plate were finished into a mirror surface of Ra<0.1 μm by grinding and polishing. After In of 2 μm in thickness was plated onto the mirror surface of the seed material, the plated surface was closed with the mirror surface of the treating sheet so as to coincide the lengthwise directions and joined by heating in a dry $N_2$ through the application of supersonic wave while a compressive load: 7 g/mm$^2$ was applied to the joint face.

After $Al_2O_3$ containing 15% of $SrSO_4$ was applied as a separator, the joined body was heated in a dry $N_2$ by feeding into a temperature tilting furnace having temperature gradient of 5° C./cm between 1150°–900° C. at a feeding rate of 10 mm/h while holding the treating sheet at low temperature side and the seed plate at high temperature side.

Then, it was subjected to purification annealing at 1200° C. in $H_2$ for 20 hours and a tension coating was applied thereto, and then the magnetic properties were measured to obtain results as shown in Table 36.

TABLE 36

| Magnetization direction | $B_{10}$ (T) | $W_{17/50}$ (W/kg) |
| --- | --- | --- |
| Hot rolling direction | 2.01 | 1.10 |
| Direction perpendicular to hot rolling | 2.00 | 1.15 |

Example 60

An ingot of silicon steel having the same composition as in Example 59 was heated at 1350° C. and hot rolled to a thickness of 2.2 mm. Then, the sheet was cold rolled at a reduction of 60% in the same direction as in the hot rolling direction and further rolled in a direction perpendicular thereto to a thickness of 0.22 mm. Next, a square sheet having a length of 150 mm and a width of 150 mm was cut out therefrom as a treating sheet.

Then, the same procedure as in Example 59 was repeated to obtain results as shown in Table 37.

TABLE 37

| Magnetization direction | $B_{10}$ (T) | $W_{17/50}$ (W/kg) |
| --- | --- | --- |
| Hot rolling direction | 2.00 | 0.90 |
| Direction perpendicular to hot rolling | 1.99 | 0.95 |

Example 61

An ingot of silicon steel comprising C: 0.005%, Si: 3.25%, Mn: 0.075%, S: 0.013%, sol Al: 0.015%, N: 0.0085% and the balance being Fe and inevitable impurities was heated to 1225° C. and hot rolled to a thickness of 2.2 mm. Then, the sheet was cold rolled at a reduction of 60% in the same direction as in the hot rolling direction and further rolled in a direction perpendicular thereto to a thickness of 0.22 mm. Then, a square sheet having a length of 150 mm and a width of 150 mm was cut out therefrom as a treating sheet.

On the other hand, a single crystal plate comprising Si: 3.0% and the balance being Fe and inevitable impurities and having a thickness: 0.22 mm, a length: 150 mm and a width: 5 mm, in which plate face was (100) face and lengthwise direction was [001] axis, was provided as a seed plate.

Then, one-side end portion of rolling face of the treating sheet at a width of 5 mm in lengthwise direction was thoroughly degreased and cleaned in a strong alkali solution through the application of supersonic wave. On the other hand, one-side full surface of the seed plate was finished into a mirror surface of Ra<0.1 μm by grinding and polishing. Then, In of 1 μm was plated onto the mirror surface of the seed plate, while Sn of 1 μm in thickness was plated onto the cleaned surface of the treating sheet. These plated surfaces were closed with each other by rubbing so as to coincide the lengthwise directions and joined by heating in a dry $N_2$ through the application of supersonic wave while applying a compressive stress: 100 g/mm$^2$ to the joint face.

Then, the joined body was coated with an annealing separator and heated in a dry $N_2$ by feeding into a temperature tilting furnace having a temperature gradient of 5° C./cm between 1150°–900° C. at a feeding rate of 10 mm/h while holding the treating sheet at low temperature side and the seed plate at high temperature side.

Next, it was subjected to purification annealing at 1200° C. in $H_2$ for 20 hours and a tension coating was applied thereto, and then the magnetic properties were measured to obtain the results shown in Table 38.

TABLE 38

| Magnetization direction | $B_{10}$ (T) | $W_{17/50}$ (W/kg) |
| --- | --- | --- |
| Hot rolling direction | 2.01 | 1.15 |
| Direction perpendicular to hot rolling | 2.00 | 1.13 |

Example 62

An ingot of silicon steel comprising C: 0.045%, Si: 3.17%, Mn: 0.074%, S: 0.014%, sol Al: 0.020%, N: 0.0081% and the balance being Fe and inevitable impurities was heated to 1225° C. and hot rolled to a thickness of 2.2 mm. Then, the sheet was subjected to decarburization annealing at 750° C. in a wet hydrogen for 3 hours, cold rolled at a reduction of 60% in the same direction as in the hot rolling direction and further rolled in a direction perpendicular thereto to obtain a thickness of 0.22 mm. Then, a square sheet having a length of 150 mm and a width of 150 mm was cut out therefrom, heated from 200° C. to 700° C. at a temperature rising rate of 20° C./h and then subjected to decarburization annealing at 820° C. in a wet hydrogen for 3 minutes as a treating sheet.

On the other hand, a single crystal plate comprising Si: 3.0% and the balance being Fe and inevitable impurities and having a thickness: 0.22 mm, a length: 150 mm and a width: 5 mm, in which plate face was (100) face and lengthwise direction was [001] axis, was provided as a seed plate.

Then, one-side end portion of rolling face of the treating sheet at a width of 5 mm in lengthwise direction and one-side full surface of the seed plate were finished into a mirror surface of Ra<0.1 μm by grinding and polishing. Next, In of 1 μm in thickness and Sn of 1 μm in thickness were plated onto the mirror surface of the seed plate and the cleaned surface of the treating plate, respectively. These plated surfaces were closed by rubbing so as to coincide the lengthwise directions and joined by heating in a dry $N_2$ through the application of supersonic wave while applying a compressire stress: 7 g/mm² to the joint face.

After MgO containing 1.7% of $SrSO_4$ was applied as a separator, the joined body was heated in a dry $N_2$ by feeding into a temperature tilting furnace having a temperature gradient of 1° C./cm between 1150°–900° C. at a feeding rate of 5 mm/h while holding the treating sheet at low temperature side and the seed plate at high temperature side.

Then, it was subjected to purification annealing at 1200° C. in $H_2$ for 20 hours and a tension coating was applied thereto, and then the magnetic properties were measured to obtain the results shown in Table 39.

TABLE 39

| Magnetization direction | $B_{10}$ (T) | $W_{17/50}$ (W/kg) |
|---|---|---|
| Hot rolling direction | 2.00 | 1.08 |
| Direction perpendicular to hot rolling | 1.99 | 1.11 |

Example 63

Molten steel comprising C: 0.0085%, Si: 3.17%, Mn: 0.070%, S: 0.008%, sol Al: 0.017%, N: 0.0082% and the balance being Fe and inevitable impurities was slantly cast to a thickness of 150 mm from 1600° C. in a water-cooled copper mold, quenched to 1150° C., held at this temperature for 5 minutes and immediately hot rolled to a thickness of 2.5 mm.

Then, the sheet was cold rolled at a reduction of 60% in the same direction as in the hot rolling direction and further rolled in a direction perpendicular thereto to obtain a thickness of 0.22 mm. Next, a square sheet having a length of 150 mm and a width of 150 mm was cut out therefrom, heated from 200° C. to 700° C. at a temperature rising rate of 20° C./h and then subjected to decarburization annealing at 820° C. in a wet hydrogen for 5 minutes as a treating sheet.

Then, the same procedure as in Example 61 was repeated to obtain the results shown in Table 40.

TABLE 40

| Magnetization direction | $B_{10}$ (T) | $W_{17/50}$ (W/kg) |
|---|---|---|
| Hot rolling direction | 2.01 | 1.12 |
| Direction perpendicular to hot rolling | 2.01 | 1.15 |

Example 64

Molten steel having the same composition as in Example 63 was cast to a thickness of 25 mm from 1600° C. in a horizontal thin slab casting machine, quenched to 950° C., held at this temperature for 3 minutes and immediately hot rolled to a thickness of 0.35 mm, which was held at 550° C. for 24 hours and cooled. Then, a square sheet having a length of 150 mm and a width of 150 mm was cut out therefrom and subjected to decarburization annealing at 750° C. for 1 hour as a treating sheet.

Then, the same procedure as in Example 61 was repeated to obtain the results shown in Table 41.

TABLE 41

| Magnetization direction | $B_{10}$ (T) | $W_{17/50}$ (W/kg) |
|---|---|---|
| Hot rolling direction | 2.00 | 1.61 |
| Direction perpendicular to hot rolling | 2.01 | 1.55 |

Example 65

Molten steel having the same composition as in Example 63 was slantly cast to a thickness of 5 mm from 1600° C. in a water-cooled copper mold, quenched to 600° C. and immediately warm rolled to a thickness of 0.22 mm. Then, a square sheet having a length of 150 μm and a width of 150 mm was cut out therefrom, heated from 200° C. to 700° C. at a temperature rising rate of 20° C./h and then subjected to decarburization annealing at 820° C. in a wet hydrogen for 5 minutes as a treating sheet.

Then, the same procedure as in Example 61 was repeated to obtain the results shown in Table 42.

TABLE 42

| Magnetization direction | $B_{10}$ (T) | $W_{17/50}$ (W/kg) |
|---|---|---|
| Hot rolling direction | 2.00 | 1.13 |
| Direction perpendicular to hot rolling | 2.01 | 1.14 |

Example 66

A thin ribbon of 3500 μm in thickness was made by direct quenching from molten steel comprising C: 0.025%, Si: 3.5%, Mn: 0.072%, S: 0.009%, sol Al: 0.017%, N: 0.0085% and the balance being Fe and inevitable impurities. This thin ribbon was warm rolled to a thickness of 0.20 mm while heating to 550° C., which was held for 24 hours and cooled. Then, a square sheet having a length of 150 mm and a width of 150 mm was cut out therefrom, heated from 200° C. to 700° C. at a temperature rising rate of 20° C./h and then subjected to decarburization annealing at 820° C. in a wet hydrogen for 3 minutes as a treating sheet.

Then, the same procedure as in Example 61 was repeated to obtain the results shown in Table 43.

TABLE 43

| Magnetization direction | $B_{10}$ (T) | $W_{17/50}$ (W/kg) |
| --- | --- | --- |
| Hot rolling direction | 2.00 | 1.10 |
| Direction perpendicular to hot rolling | 2.01 | 1.11 |

Example 67

An ingot of silicon steel comprising C: 0.065%, Si: 3.25%, Mn: 0.070%, S: 0.018%, P: 0.0080%, sol Al: 01035%, N: 0.0080% and the balance being Fe and inevitable impurities was heated to 1350° C., hot rolled to a thickness of 1.9 mm, cold rolled to a thickness of 0.20 mm, heated from 200° C. to 700° C. at a temperature rising rate of 20° C./h and then subjected to decarburization annealing at 820° C. in a wet hydrogen for 5 minutes. After an annealing separator of MgO containing 15% of $SrSO_4$ was applied to the thus obtained steel sheet, three coils having a thickness of 10 mm, a diameter of 550 mm, 700 mm, 1000 mm and a width of 100 mm were prepared as treating coils A, B, C.

In these treating coils, the edge portion of the coil was removed by 0.5 mm in width wise direction of the steel sheet by grinding in a direction perpendicular to the rolling face, and finished into a clean mirror surface of Ra<0.2 μm by polishing and sputtering.

On the other hand, a surface of a single crystal plate comprising Si: 3.0% and the balance being Fe and inevitable impurities and having a length: 10 mm, a width of 5 mm and a thickness of 0.2 mm, in which (110) face was parallel to plate face and lengthwise direction was [110] orientation, was finished into a clean mirror surface of Ra<0.2 μm by polishing and argon sputtering as a seed plate D.

Then, the seed plate D was closely joined to the polished surfaces of A, B, C, respectively, at an interval of 20 mm so that the lengthwise direction of the seed plate was directed toward the center of the coil in the treating materials A, B, C, and then annealed in a vacuum furnace of $10^{-4}$ Torr at 980° C. for 24 hours while applying a compresslye stress of 10 g/mm² to the joint face. After the flattening annealing at 800° C. for 3 hours, the crystal structures of the treating coils A, B, C were examined, from which the seed plate D was confirmed to grow into all of the treating coils.

In this case, the magnetic flux density $B_{10}$ at a magnetization force of 1000 A/m are shown in Table 44.

TABLE 44

| | $B_{10}$ (T) |
| --- | --- |
| A | 1.95 |
| B | 1.98 |

TABLE 44-continued

| | $B_{10}$ (T) |
| --- | --- |
| C | 2.01 |

As seen from the above Table 44, the larger the coil diameter, the easier the magnetization and the shifting of orientation from the rolling face is less.

Example 68

When the treating coil C and the seed plate D in Example 67 were closely joined with each other in the same manner as in Example 67, D was arranged at an interval of 10 mm, 40 mm, 80 mm to obtain treating coils C-1, C-2, C-3. Then, these materials were treated in the same manner as in Example 67 as X and in the same manner as in Example 67 except that the annealing atmosphere was $N_2$ having a dew point of −30° C. as Y.

As the crystal structure of each of the thus obtained coils was examined, it was observed in the case X that the seed plate D grew in the treating coil, but the growth was partly observed in the case Y. The $B_{10}$ value of each coil are shown in Table 45.

TABLE 45

| | $B_{10}$ (T) | |
| --- | --- | --- |
| | X | Y |
| C-1 | 2.03 | 1.92 |
| C-2 | 1.98 | 1.91 |
| C-3 | 1.93 | 1.90 |

The $B_{10}$ value is high in the case X that the atmosphere is vacuum and the joint face is an activated state as compared with the case Y that the atmosphere is oxidizable and the joint face is an inactivated state. Further, as the planting interval of the seed plate becomes shorter, the $B_{10}$ value becomes higher, which shows that the magnetization is easy and the shifting of orientation from the rolling face is less.

Example 69

B1, B2 were before and after the annealing in the treating coil B used in Example 67, respectively, edge portions of whose coils were finished into a clean mirror surface in the same manner as in Example 67. Then, the coils B1 and B2 were piled one upon the other so as to close the mirrored surfaces with each other, which was heated by feeding into a temperature tilting furnace having a temperature gradient of 5° C./cm between 1150° C.~900° C. at a feeding rate of 10 mm/h while holding B1 at low temperature side and B2 at high temperature side. Moreover, the inside of the furnace was maintained under vacuum of $10^{-4}$ Torr.

After the flattening annealing at 800° C. for 3 hours, the $B_{10}$ value of B1 was measured to be $B_{10}$=1.99~1.98 (T). By continuously planting the seed plate in the circumferential direction of the coil, the high $B_{10}$ value equal to that of the seed plate B2 was obtained at about self-weight of the seed plate B2 without particularly applying stress.

Example 70

Three sets of the treating coils B1, B2 used in Example 69 were provided. After Sn, Sb, Cu were deposited onto the cleaned mirror surfaces of each set at a thickness of 1 μm by sputtering every the set, the coils were piled one upon the other so as to close the deposited surfaces with each other every the set and joined by heating through the application of supersonic wave, which was heated in $N_2$ having a dew point of −30° C. by feeding into a temperature tilting furnace having a temperature gradient of 5° C./cm between 1150° C.–900° C. while holding B2 at high temperature side.

After the flattening annealing at 800° C. for 3 hours, the $B_{10}$ value of B2 of each set was measured to obtain the results shown in Table 46.

TABLE 46

|  | $B_{10}$ (T) |
| --- | --- |
| Sn coating | 1.98–1.99 |
| Sb coating | 1.97–1.99 |
| Cu coating | 1.96–1.98 |

By joining through the interposition of the insert member, good results equal to that of the seed plate B1 were obtained even when the annealing was carried out in an oxidizing atmosphere.

Example 71

An ingot of iron alloy comprising C: 0.035%, Al: 3.00%, Mn: 0.065%, Se: 0.020%, P: 0.008% and the balance being Fe and inevitable impurities was heated to 1350° C., hot rolled to a thickness of 2.3 mm and then subjected to two-times cold rolling through an intermediate annealing to a thickness of 0.20 mm. Then, the sheet was subjected to decarburization and primary recrystallization annealing at 820° C. in a wet hydrogen for 5 minutes, coated with an annealing separator and wound into a coil having a thickness of 10 mm, a diameter of 700 mm and a width of 100 mm as a treating coil E. After the coil edge portion was finished into a clean mirror surface in the same manner as in Example 67, Sn was deposited at a thickness of 1 µm by sputtering, which was closed with the deposited surface of the seed plate B2 in Example 70 having Sn of 1 µm in thickness and piled one upon the other and treated in the same manner as in Example 70.

After the flattening annealing at 800° C. for 3 hours, the orientations of crystal grains in the treating coil E and the seed plate B2 were measured, and as a result, the shifting of orientation from (100)[001] in both was 3° on average and the orientation of the seed plate was well transferred to the treating coil.

Example 72

An ingot of silicon steel comprising C: 0.059%, Si: 3.35%, Mn: 0.065%, S: 0.015%, sol Al: 0.025%, N: 0.0095% and the balance being Fe and inevitable impurities was heated to 1350° C., hot rolled to a thickness of 2.2 mm, cold rolled to a thickness of 0.20 mm, heated from 200° C. to 700° C. at a temperature rising rate of 20° C./h and subjected to decarburization annealing at 820° C. in a wet hydrogen for 3 minutes. After MgO containing 15% of $SrSO_4$ was applied to the thus obtained steel sheet as an annealing separator, a coil having a thickness of 10 mm, a diameter of 550 mm and a width of 1000 mm was prepared as a treating coil.

After the coil edge portion of the treating material was removed by 0.5 mm in the widthwise direction of the steel sheet through the polishing in a direction perpendicular to the rolling face, it was finished into a mirror surface of Ra<0.2 µm by polishing.

On the other hand, a surface of plate-like single crystal comprising Si: 3.0% and the balance being Fe and inevitable impurities and having a length: 10 mm, a width: 5 mm and a thickness: 0.2 mm, in which (110) face was parallel to plate face and lengthwise direction was [110] orientation, was finished into a clean mirror surface of Ra<0.2 µm by grinding and polishing and then coated with Sn of 1 µm in thickness by plating to obtain a seed plate.

Then, the plated surface of the seed plate was closed with the polished surface of the treating coil at an interval of 20 mm so that the seed plate was directed toward the center of the coil of the treating material and joined by heating through the application of supersonic wave of 60 kHz while applying a compressire stress of 10 g/mm² to the joint face.

Next, the joined body was placed in a usual box furnace and heated to 1200° C. at a temperature rising rate of 20° C./h in $N_2$ while applying a compressire stress of 3 g/mm² to the joint face. After the flattening annealing at 800° C. for 3 hours, the crystal structure of the treating coil was measured, from which it was confirmed that the seed plate grew into the treating coil.

In this case, the magnetic flux density $B_{10}$ value at a magnetization force of 1000 A/m was $B_{10}$=1.97 (T).

Example 73

When the treating coil and seed plate in Example 72 were joined in the same manner as in Example 72, the joining was carried out under vacuum of $10^{-3}$ Torr. After the annealing to 1100° C. in $N_2$ under atmospheric pressure, the heating was again carried out to 1200° C. under vacuum of $10^{-3}$ Torr.

After the flattening annealing at 800° C. for 3 hours, the crystal structure of the treating coil was measured, from which it was confirmed that the seed plate grew into the treating coil.

In this case, the magnetic flux density value at a magnetization force of 1000 A/m was $B_{10}$ $B_{10}$=1.98 (T).

Example 74

An ingot of silicon steel comprising C: 0.020%, Mn: 0.075%, S: 0.016%, sol Al: 0.021%, N: 0.0090% and the balance being Fe and inevitable impurities was heated to 1250° C., hot rolled to a thickness of 2.2 mm, cold rolled to a thickness of 0.22 mm, heated from 200° C. to 700° C. at a temperature rising rate of 20° C./h and subjected to decarburization annealing at 850° C. in a wet hydrogen for 5 minutes. The thus obtained steel sheet was subjected to skin-pass rolling to introduce 2% plastic strain thereinto. After MgO containing 15% of $SrSO_4$ was applied to the steel sheet as an annealing separator, a coil having a thickness of 10 mm, a diameter of 550 mm and a width of 1000 mm was prepared as a treating coil.

After the coil edge portion of the treating coil was removed by 0.5 mm in the widthwise direction of the steel sheet by grinding in a direction perpendicular to the rolling face, it was finished into a clean mirror surface of Ra<0.2 µm by polishing.

On the other hand, a surface of plate-like single crystal comprising Si: 2.0% and the balance being Fe and inevitable impurities and having a length: 10 mm, a width: 5 mm and a thickness: 0.2 mm, in which (110) face was parallel to plate face and lengthwise direction was [110] orientation, was finished into a clean mirror surface of Ra<0.2 μm by grinding and polishing and then coated with Sn of 1 μm in thickness by plating to obtain a seed plate.

Then, the plated surface of the seed plate was closed with the polished surface of the treating coil at an interval of 20 mm so that the seed plate was directed toward the center of the treating coil and joined by heating through the application of supersonic wave of 60 kHz while applying a compressive stress of 10 g/mm² to the joint face.

Next, the joined body was placed in a usual box furnace and heated in N₂ at a maximum temperature not exceeding 910° C. while applying a compressive stress of 3 g/mm² to the joint face. After the flattening annealing at 800° C. for 3 hours, the crystal structure of the treating coil was measured, from which it was confirmed that the seed plate grew into the treating coil.

In this case, the magnetic flux density value at a magnetization force of 1000 A/m was $B_{10}$=2.13 (T).

Example 75

Molten steel comprising C: 0.058%, Si: 3.15%, Mn: 0.075%, S: 0.015%, sol Al: 0.025%, N: 0.0075% and the balance being Fe and inevitable impurities was slantly cast to a thickness of 150 mm from 1600° C. in a water-cooled copper mold, quenched to 1150° C., held at this temperature for 5 minutes and immediately hot rolled to a thickness of 2.5 mm. Then, the sheet was cold rolled to a thickness of 0.22 mm and heated in Ar from 200° C. to 700° C. at a temperature rising rate of 20° C./h. Next, the sheet was subjected to decarburization annealing at 820° C. in a wet hydrogen for 3 minutes and coated with MgO annealing separator containing MgSO₄: 1.7%, from which a coil having a thickness of 10 mm, an inner diameter of 550 mm and a width of 1000 mm was prepared as a treating coil.

After the coil edge portion of the treating plate was removed by 0.5 mm in the widthwise direction of the steel sheet by grinding in a direction perpendicular to the rolling face, it was finished into a clean mirror surface of Ra<0.2 μm by polishing.

On the other hand, a surface of plate-like single crystal comprising Si: 3.0% and the balance being Fe and inevitable impurities and having a length: 10 mm, a width: 5 mm and a thickness: 0.2 mm, in which (110) face was parallel to plate face and lengthwise direction was [110] orientation, was finished into a clean mirror surface of Ra<0.2 μm by grinding and polishing and then coated with Sn of 2 μm in thickness by plating to obtain a seed plate.

Then, the plated surface of the seed plate was closely joined with the polished surface of the treating coil at an interval of 20 mm so that the seed plate was directed toward the center of the treating coil and heated through the application of supersonic wave while applying a compressive stress of 10 g/mm² to the joint face. The heating was carried out by supplying heat to the side end portion of the seed plates and raising temperature at a rate of 20° C./h, whereby the temperature at an end portion opposite to the seed plate was raised to 1100° C.

Next, both the end portions were subjected to purification annealing at 1200° C. in hydrogen for 20 hours. The average magnetic property in widthwise direction of the obtained coil was $B_8$=2.00 (T).

Example 76

Molten steel having the same composition as in Example 75 was cast to a thickness of 25 mm from 1600° C. in a horizontal thin slab casting machine, quenched to 950° C., held for 3 minutes and immediately hot rolled to a thickness of 0.35 mm, which was held at 550° C. for 24 hours and cooled. Then, the steel sheet was subjected to decarburization annealing at 820° C. in a wet hydrogen for 5 minutes and coated with MgO annealing separator containing SrSO₄: 1.7%, from which a coil having a thickness of 10 mm, an inner diameter of 550 mm and a width of 100 mm was prepared as a treating coil.

After the coil edge portion of the treating coil was removed by 0.5 mm in the widthwise direction of the steel sheet by grinding in a direction perpendicular to the rolling face, it was finished into a clean mirror surface of Ra<0.2 μm by polishing.

On the other hand, a surface of plate-like single crystal comprising Si: 3.0% and the balance being Fe and inevitable impurities and having a length: 10 mm, a width: 5 mm and a thickness: 0.2 mm, in which (100) face was parallel to plate face and lengthwise direction was [001] orientation, was finished into a clean mirror surface of Ra<0.2 μm by grinding and polishing and then coated with In of 2 μm in thickness by plating to obtain a seed plate.

The average magnetic properties in widthwise direction of the coil obtained by the same procedure as in Example 75 were magnetization property in the hot rolling direction $B_8$=2.00 (T) and magnetization property in a direction perpendicular to the hot rolling direction $B_8$=2.01 (T).

Example 77

Molten steel having the same composition as in Example 75 was slantly cast to a thickness of 5 mm from 1600° C. in a water-cooled copper mold, quenched to 600° C. and immediately warm rolled to a thickness of 0.22 mm. Then, the sheet was heated in Ar from 200° C. to 700° C. at a temperature rising rate of 20° C./h and subjected to decarburization annealing at 820° C. in a wet hydrogen for 3 minutes and coated with MgO annealing separator containing 4% of ferromanganese nitride, from which a coil having a thickness of 10 mm, an inner diameter of 550 mm and a width of 100 mm was prepared as a treating coil.

The average magnetic property in widthwise direction of the coil obtained by the same procedure as in Example 75 was $B_8$=2.00 (T).

Example 78

A thin ribbon of 350 μm in thickness was made by direct quenching from molten steel comprising C: 0.005%, Si: 4.5%, Mn: 0.080%, S: 0.012%, sol Al: 0.015%,. N: 0.0080% and the balance being Fe and inevitable impurities. The thin ribbon was warm rolled to a thickness of 0.20 mm while heating to 550° C., which was held at 550° C. for 24 hours and cooled. Then, the steel sheet was subjected to decarburization annealing at 820° C. in a wet hydrogen for 3 minutes and coated with MgO annealing separator, from which a coil having a thickness of 10 mm, an inner diameter of 550 mm and a width of 100 mm was prepared as a treating coil.

The average magnetic properties in widthwise direction of the coil obtained by the same procedure as in Example 68 were magnetization property in the hot rolling direction $B_8$=2.01 (T) and magnetization property in a direction perpendicular to the hot rolling direction $B_8$=1.90 (T).

INDUSTRIAL APPLICABILITY

According to the invention, not only the strict control to particular orientation but also the mass production of crystal bodies having such an orientation are possible, so that the invention largely contributes to the improvement of properties in the product and the yield. For example, in grain oriented electromagnetic steel sheets and bidirectional oriented electromagnetic steel sheets, the magnetic flux density can largely be, improved, and particularly <111> axis as a hardly magnetization axis is not included in the rolling face of the bidirectional oriented electromagnetic steel sheet, so that they are useful as an iron core for rotating bodies and the magnetization at corner portion of transformers is easy, which contributes to energy-saving.

Furthermore, according to the invention, the crystalline orientation at coil unit can be controlled, so that not only the strict control of crystalline orientation but also the practical mass production in industry, which have never been established in the conventional technique, are possible and the invention largely contributes to the stable improvement of properties depending upon the crystalline orientation and the stable supplement of good products.

Moreover, the invention contributes to basic studies on the orientation dependency of properties because crystal bodies of particular orientation are easily obtained, so that it is considered that the invention largely contributes to the development of the studies.

We claim:

1. In a method of producing grain-oriented electromagnetic steel sheets, having improved magnetic properties, wherein said steel sheets are prepared by hot rolling a slab of silicon-containing steel sheet treating material, rendering said hot rolled sheet into a final thickness, and then subjecting said rendered sheet to finish annealing, a magnetic property improvement step consisting essentially of:

selecting a coil-like steel sheet as said treating material;

selecting a seed material having a crystal structure a) the same as said treating material or b) which differs from said crystal structure of said treating material by having interstitial or substitutional elements present in amounts such that the crystal lattices of said seed material and said treating material differ by 30% or less, wherein said seed material has said crystalline orientation at a state of energy lower than that of said treating material;

abutting and joining a surface of said seed material having a desired crystalline orientation against a coiled end face of said coil-like steel sheet, said abutting being performed between the steps of hot rolling and finish annealing, according to the following orientation relationships:

$$|\alpha| \leq 5°$$

$$1 \leq |\beta| \leq 5°$$

where $\alpha$ is the angle defined by the projection line of the <001> axis of said seed material with respect to the rolling face of said steel sheet and the rolling direction of said steel sheet; and $\beta$ is the inclination angle of the <001> axis of said seed material with respect to said rolling face of said steel sheet;

heating to a temperature not lower than the recrystallization temperature of the seed material to cause grain boundary movement and causing said desired crystalline orientation of said seed material to grow and project said desired crystalline orientation of said seed material over the whole of said steel sheet.

2. In a method of producing bi-directionally oriented electromagnetic steel sheets, having improved magnetic properties, wherein said steel sheets are prepared by hot rolling a slab of silicon-containing steel sheet treating material, rendering said hot rolled sheet into a final thickness, and then subjecting said rendered sheet to primary recrystallization annealing and finish annealing, a magnetic property improvement step consisting essentially of:

selecting a coil-like steel sheet as said treating material;

selecting a seed material having a crystal structure a) the same as said treating material or b) which differs from said crystal structure of said treating material by having interstitial or substitutional elements present in amounts such that the crystal lattices of said seed material and said treating material differ by 30% or less, wherein said seed material has said crystalline orientation at a state of energy lower than that of said treating material;

abutting and adjoining a surface of said seed material having a desired crystalline orientation against a coiled end face of said coil-like steel sheet, said abutting being performed between the steps of hot rolling and finish annealing, according to the following orientation relationships:

$$|\alpha| \leq 5°$$

$$1 \leq |\beta| \leq 5°$$

where $\alpha$ is the angle defined by the projection line of the <001> axis of said seed material with respect to the rolling face of said steel sheet and the rolling direction of said steel sheet; and $\beta$ is the inclination angle of the <001> axis of said seed material with respect to said rolling face of said steel sheet;

heating to a temperature not lower than the recrystallization temperature of said seed material to cause grain boundary movement and causing said desired crystalline orientation of said seed material to grow and project said desired crystalline orientation of said seed material over the whole of said steel sheet.

3. In a method of producing bi-directionally oriented electromagnetic steel sheets, having improved magnetic properties, wherein said steel sheets are prepared by hot rolling a slab of silicon-containing steel sheet treating material, rendering said hot rolled sheet into a final thickness, and then subjecting said rendered sheet to finish annealing, a magnetic property improvement step consisting essentially of:

selecting a coil-like steel sheet as said treating material;

selecting a seed material having a crystal structure a) the same as said treating material or b) which differs from said crystal structure of said treating material by having interstitial or substitutional elements present in amounts such that the crystal lattices of said seed material and said treating material differ by 30% or less, wherein said seed material has said crystalline orientation at a state of energy lower than that of said treating material;

abutting and joining a surface of said seed material having a desired crystalline orientation against a coiled end face of said coil-like steel sheet, said abutting being performed between the steps of hot rolling and finish annealing, according to the following orientation relationships:

$|\alpha| \leqq 10°$ $|\beta| \leqq 10°$ where
- $\alpha$ is the angle defined by the projection line of the <001> axis of said seed material with respect to the rolling face of said steel sheet and the rolling direction of said steel sheet; and
- $\beta$ is the inclination angle of the {100} face of said seed material with respect to said rolling face of said steel sheet.

heating to a temperature not lower than the recrystallization temperature of said seed material to cause grain boundary movement and causing said desired crystalline orientation of said seed material to grow and project said desired crystalline orientation of said seed material over the whole of said steel sheet.

4. In a method of producing bi-directionally oriented electromagnetic steel sheets, having improved magnetic properties, wherein said steel sheets are prepared by hot rolling a slab of silicon-containing steel sheet treating material, rendering said hot rolled sheet into a final thickness, and then subjecting said rendered sheet to primary recrystallization annealing and finish annealing, a magnetic property improvement step consisting essentially of:

selecting a coil-like steel sheet as said treating material;

selecting a seed material having a crystal structure a) the same as said treating material or b) which differs from said crystal structure of said treating material by having interstitial or substitutional elements present in amounts such that the crystal lattices of said seed material and said treating material differ by 30% or less, wherein said seed material has said crystalline orientation at a state of energy lower than that of said treating material;

abutting and joining a surface of said seed material having a desired crystalline orientation against a coiled end face of said coil-like steel sheet, said abutting being performed between the steps of hot rolling and finish annealing, according to the following orientation relationships:

$|\alpha| \leqq 10°$ $|\beta| \leqq 10°$ where
- $\alpha$ is the angle defined by the projection line of the <001> axis of said seed material with respect to the rolling face of said steel sheet and the rolling direction of said steel sheet; and
- $\beta$ is the inclination angle of the {100} face of said seed material with respect to said rolling face of said steel sheet.

heating to a temperature not lower than the recrystallization temperature of said seed material to cause grain boundary movement and causing said desired crystalline orientation of said seed material to grow and project said desired crystalline orientation of said seed material over the whole of said steel sheet.

* * * * *

UNITED STATES PATENT AND TRADEMARK OFFICE
CERTIFICATE OF CORRECTION

PATENT NO. : 5,487,794
DATED : January 30, 1996
INVENTOR(S) : Hiromi Mitsunori et al It is certified that error appears in the above-indentified patent and that said Letters Patent is hereby corrected as shown below:

In Column 13, line 47, please change "P02" to --$P_{O2}$--.

In Column 46, line 49, after "for", please insert --1 (one)--.

In Column 59, line 34, please change "$Al_2O_3$" to --$Al_2O_3$--.

In Column 66, line 41, please delete the first occurrence of "$B_{10}$".

In column 70, line 1, please change "bi-directionally oriented" to --grain-oriented--.

Signed and Sealed this

Twenty-third Day of April, 1996

Attest:

BRUCE LEHMAN

Attesting Officer

Commissioner of Patents and Trademarks